(12) United States Patent
Tang et al.

(10) Patent No.: US 10,739,384 B2
(45) Date of Patent: Aug. 11, 2020

(54) PCB ROGOWSKI COIL

(71) Applicant: INHAND NETWORKS TECHNOLOGY CO., LTD., Beijing (CN)

(72) Inventors: Xianwu Tang, Beijing (CN); Jianliang Zhang, Beijing (CN)

(73) Assignee: BEIJING INHAND NETWORKS TECHNOLOGY CO., LTD., Beijing (CN)

(*) Notice: Subject to any disclaimer, the term of this patent is extended or adjusted under 35 U.S.C. 154(b) by 587 days.

(21) Appl. No.: 14/890,906

(22) PCT Filed: May 23, 2014

(86) PCT No.: PCT/CN2014/078242
§ 371 (c)(1),
(2) Date: Nov. 12, 2015

(87) PCT Pub. No.: WO2014/201937
PCT Pub. Date: Dec. 24, 2014

(65) Prior Publication Data
US 2016/0116504 A1    Apr. 28, 2016

(30) Foreign Application Priority Data

Jun. 18, 2013  (CN) ............... 2013 1 0239226
Jul. 11, 2013   (CN) ............... 2013 1 0289012
Jul. 26, 2013   (CN) ............... 2013 1 0318277
Jul. 26, 2013   (CN) ............... 2013 1 0318279

(51) Int. Cl.
*G01R 15/18* (2006.01)
*H01F 5/00* (2006.01)

(52) U.S. Cl.
CPC ............ *G01R 15/181* (2013.01); *H01F 5/003* (2013.01)

(58) Field of Classification Search
CPC .. G01R 15/181; G01R 15/142; G01R 15/247; H01F 5/003; H01F 38/30; H01F 17/0013; H01F 27/2804; H01F 27/289
See application file for complete search history.

(56) References Cited

U.S. PATENT DOCUMENTS 5,414,400 A * 5/1995 Gris .................. G01R 15/181
                                                    336/174
6,624,624 B1 * 9/2003 Karrer ............... G01R 15/181
                                                    324/117 R
(Continued)

*Primary Examiner* — Lee E Rodak
(74) *Attorney, Agent, or Firm* — John Ye

(57) ABSTRACT

Disclosed is a PCB Rogowski coil, comprising two groups of first coils and second coils which are connected in series and have opposite winding directions, wherein the first coil and the second coil respectively contain a plurality of wire turns. One wire turn of the first coil comprises an inlet wire, a winding wire and an outlet wire. The winding wires of each wire turn of the first coil are arranged in radially parallel with each other. The winding wires are respectively arranged on both the upper surface and the lower surface of a PCB board, with the inlet wire passes through a via hole on the PCB board and is connected to the winding wire. The interference of an external magnetic field is therefore markedly eliminated, and the anti-external interference capability of a Rogowski coil is improved.

20 Claims, 38 Drawing Sheets

(56) References Cited

U.S. PATENT DOCUMENTS

| | | | | |
|---|---|---|---|---|
| 2003/0160603 A1* | 8/2003 | Kojovic | ............... | G01R 15/181 |
| | | | | 324/127 |
| 2006/0220774 A1* | 10/2006 | Skendzic | ............. | G01R 15/181 |
| | | | | 336/200 |
| 2007/0152651 A1* | 7/2007 | Shiokawa | ............ | G01R 15/181 |
| | | | | 324/76.11 |
| 2008/0079418 A1* | 4/2008 | Rea | ...................... | G01R 15/181 |
| | | | | 324/117 R |
| 2008/0106254 A1* | 5/2008 | Kojovic | ............... | G01R 15/181 |
| | | | | 324/127 |

* cited by examiner

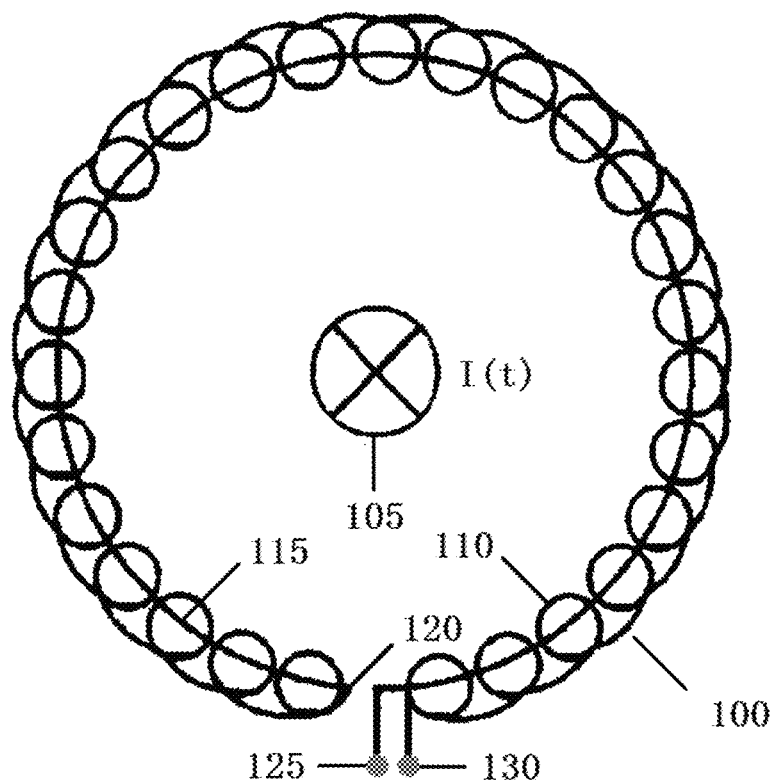
Fig. 1 – Prior Art
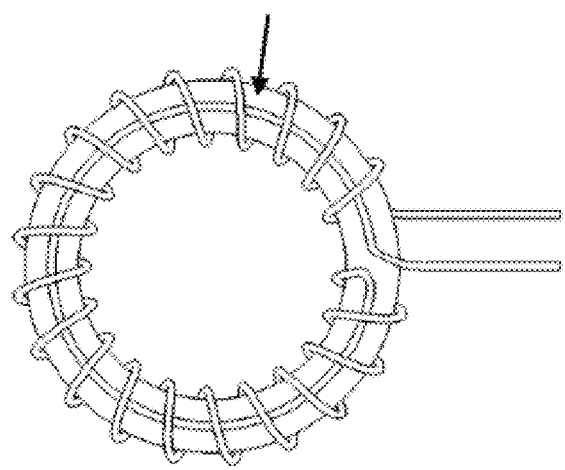
Fig. 2 – Prior Art

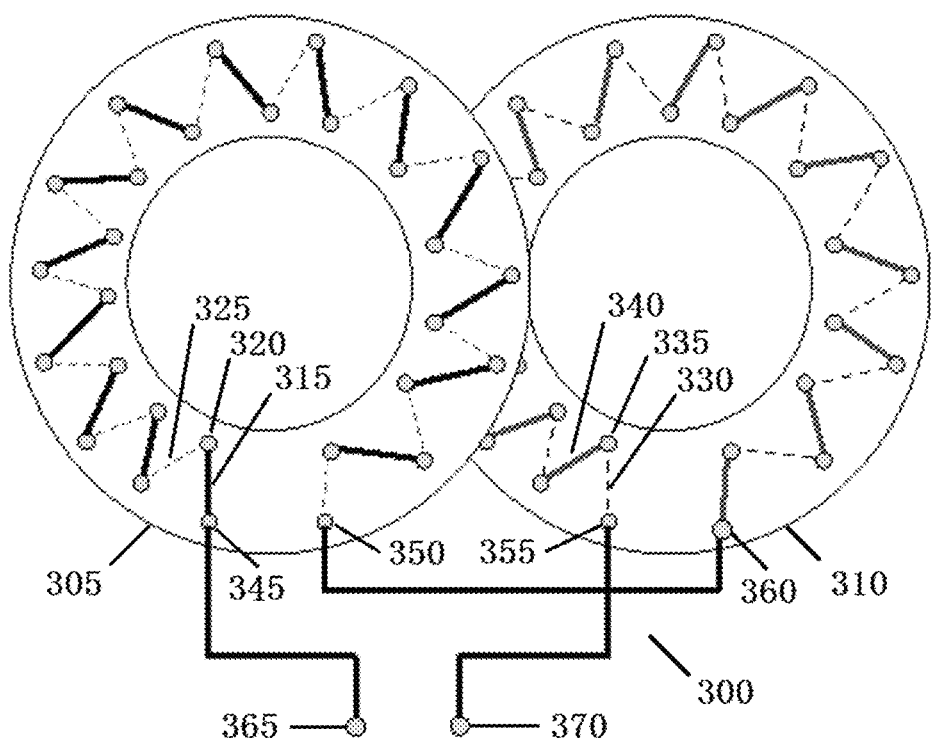
Fig. 3 – Prior Art
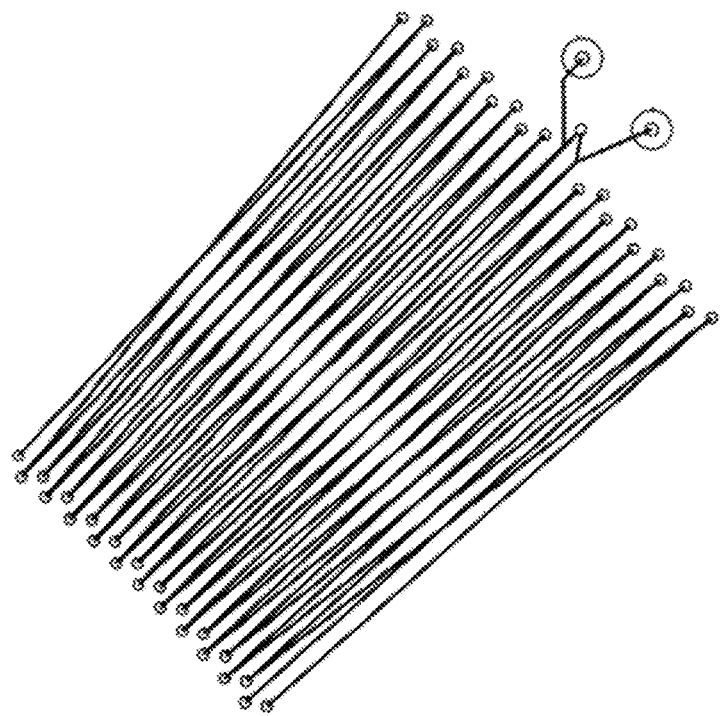
Fig. 4A – Prior Art

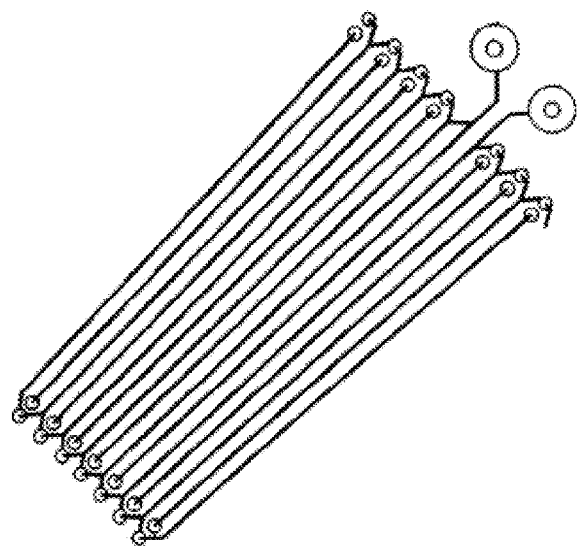
Fig. 4B – Prior Art
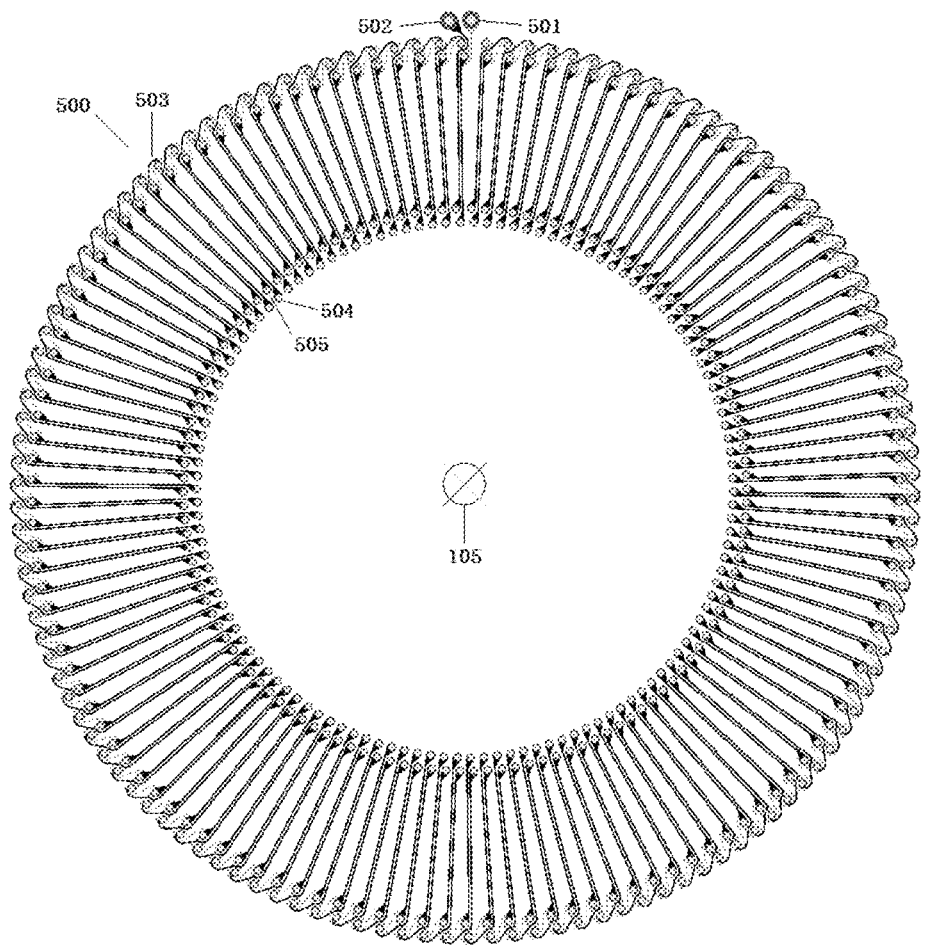
Fig. 5A

PCB ROGOWSKI COIL

CROSS REFERENCES TO RELATED APPLICATIONS

This application is a continuation of International Application No. PCT/CN2014/078242, filed in the Chinese Patent Office on May 23, 2014, which is a continuation of Chinese Application No. 201310239226.2, filed on Jun. 18, 2013, and 201310289012.6, filed on Jul. 11, 2013, the entire contents of which are incorporated herein by reference.

BACKGROUND

The present disclosure refers to the electronic technical field, especially a PCB (printed circuit board) Rogowski coil.

A Rogowski coil is the one formed by uniformly winding a wire on a frame made of a nonmagnetic material with uniform section. The Rogowski coil, featured with light weight, wide frequency band and good linearity and no magnetic saturation, has been universally used in a current measuring device. According to whether the Rogowski coil can be opened during measurement, it can be divided into two types, i.e., a closed Rogowski coil and an opened Rogowski coil. The closed Rogowski coil is shown in FIG. 1.

The closed Rogowski coil 100 includes the following parts:

(1) Signal output end 125 and signal output end 130

(2) Ring winding 110 wound from signal output end 130 to the end of ring winding 120

(3) Return wire turn 155 from the end of ring winding 120 to signal output end 125 along the center of ring winding When the closed Rogowski coil 100 is used for current measurement, a current-carrying conductor 105 is required to pass through the closed Rogowski coil 100 first. The current-carrying conductor 105 is required to pass through the center of the closed Rogowski coil 100 vertically with the centers of the current-carrying conductor 105 and closed Rogowski coil 100 in superposition to ensure measurement accuracy. The current-carrying conductor 105 is surrounded by the closed Rogowski coil 100. When the alternating current I(t) to be measured flows through the current-carrying conductor 105, it generates an AC magnetic field around the current-carrying conductor, and the magnetic lines are approximated as the circle centered in the center of current-carrying conductor 105. Centers of various cycles of wire turns of the ring winding 110 for closed Rogowski coil 100 are in one of the circular magnetic lines. The sectional areas corresponding to various wire turns of the ring winding 110 for closed Rogowski coil 100 are equal. Each wire turn section direction of the ring winding 110 is in line with the normal direction of magnetic lines (i.e., radius direction of the section center is pointing to the center of the current-carrying conductor 105), and is vertical to the tangential direction of the circular magnetic lines. Therefore, the magnetic flux $\varphi_i(t)$ of each ring winding wire turn of the closed Rogowski coil is ensured to be approximately equal with the magnetic flux in direct proportion to the current.

$$\Phi_i(t) = L \cdot I(t) \tag{1}$$

The alternating current I(t) to be measured causes the change on magnetic flux within the volume encircled by the ring winding of the closed Rogowski coil 100, which can be converted into voltage signals in proportion to differential of the total magnetic flux by the closed Rogowski coil 100, i.e. the output voltage signal V(t) between output ends 125 and 130 of the closed Rogowski coil 100.

$$V(t) = -\frac{d}{dt}\sum_i \Phi_i(t) \tag{2}$$

After simplification, the output voltage signal V(t) of the closed Rogowski coil is approximately in proportion to the differential of alternating current I(t).

$$V(t) = -M \cdot \frac{dI(t)}{dt} \tag{3}$$

Signals in proportion to alternating current I(t) can be acquired from the integral of output voltage signal V(t) of the closed Rogowski coil, which is the theory for the closed Rogowski coil to measure alternating current.

$$I(t) = K \cdot \int V(t) dt \tag{4}$$

As the closed Rogowski coil has high accuracy for current measurement and big bandwidth for measuring signal, it achieves the measurement by electric isolation at low cost, and its current withstanding capacity is almost infinite. The closed Rogowski coil is used in accurate current measurement of current-carrying conductor with permanent position, which has application in fields such as relay protection, etc.

During the current measurement conducted by the closed Rogowski coil 100, the ring winding 110 picks up not only the magnetic variation of alternating current I(t) to be measured, but also other AC interfering magnetic fields in the space. For example, when the AC interfering magnetic field vertical to the page direction in FIG. 1 occurs, voltage signal will be generated between the starting point 130 and ending point 120 of the ring winding 110.

In order to reduce the influence on the measurement by the closed Rogowski coil 100 from the external magnetic field, besides the ring winding 110 of the closed Rogowski coil 100, a cycle of return wire turn 115 will be wound between the ending point 120 and signal output end 125 of the ring winding 110 along the circle centered in center of the ring winding 110. Thus, when the AC interfering magnetic field vertical to page direction in FIG. 1 occurs, the voltage signal will be generated between the starting point 120 and ending point 125 of the return wire turn 115 by the AC interfering magnetic field. The voltage signal and the voltage signal between the starting point 130 and ending point 120 of the ring winding 110 are approximately equal in size and opposite in polarity with signal superposition result of approximately zero. Therefore, when the AC interfering magnetic field vertical to the page direction in FIG. 1 occurs, almost no interfering voltage signal will be generated between the output ends 125 and 130 of the closed Rogowski coil 100.

The traditional closed winding Rogowski coil, shown in FIG. 2, is formed through the winding on framework made of the circular non-magnetic conducting material, including the ring winding and the return wire turn. During the winding, the ring winding is wound after a cycle of return wire turn is placed in the center of the circular framework. The voltage signal generated by the external interfering magnetic field on ring winding of the closed Rogowski coil is approximately equal in size to the voltage signal generated on return wire turn but is opposite in polarity. Therefore, with signal superposition resulting in approximately zero, it reduces the influence of external magnetic field on measurement conducted by the closed Rogowski coil.

As the winding of the traditional closed winding Rogowski coil is generally completed by manual work or winding machine, it is hard to achieve uniform winding coil or equal cross section of each coil turn. The traditional closed winding Rogowski coil has the disadvantage of easy disconnection, large capacitance increase error, etc., so the parameter consistency during the industrial production is hard to be guaranteed. As a result, the characteristics of Rogowski coil during current measurement are affected.

A new type of closed Rogowski coil, called closed PCB Rogowski coil for short, is made from PCB to overcome the disadvantages of traditional closed Rogowski coil. See the circular closed PCB Rogowski coils 305 and 310 in FIG. 3. The closed PCB Rogowski coil is adopted with computer aided design (CAD), which means the printed wire (hereafter called wiring) is uniformly arranged on the PCB. See closed PCB Rogowski coil 305 in FIG. 3. A cycle of wire turn on the ring winding of closed PCB Rogowski coil 305 is composed of wiring 315 on the top layer (the top layer of PCB is the PCB surface which faces the reader, and the bottom layer is in opposite direction of the top layer), with plated through hole (hereafter called through hole for short) 320 connecting with the top layer and bottom layer and the wiring 325 on the bottom layer. Each wire turn cycle of the closed PCB Rogowski coil 305 is in radius direction from the center of circular PCB and is uniformly arranged along the circle with the section of the wire turn vertical to PCB.

As better digital processing technology being adopted for the PCB, the equality of section area on each wire turn cycle of the closed PCB Rogowski coil is ensured in the technological aspect. The produced closed PCB Rogowski coil not only overcomes the disadvantages of traditional closed Rogowski coil, but also enjoys optimized sensitivity, measurement accuracy and performance stability as compared to the traditional coil wound by copper wire. The production of closed PCB Rogowski coil is convenient and rapid, because it only needs to draw the wiring diagram on the computer. The closed PCB Rogowski coil is produced by numerical control machine tool to avoid the tedious process of winding, which shortens the coil processing cycle and improves the production efficiency. The variance of the closed PCB Rogowski parameter is small during mass production, and therefore, the performance parameters of coils from the same production batch are basically the same.

When the closed PCB Rogowski coil 305 is used for current measurement, besides the magnetic variation of alternating current I(t) to be measured, the ring winding also picks up other AC interfering magnetic fields in the space. For example, when the AC interfering magnetic field vertical to page direction in FIG. 3 occurs, interfering voltage signal is generated between the output ends 345 and 350 of the closed PCB Rogowski coil 305. In order to reduce the influence on measurement of closed PCB Rogowski coil 305 caused by the external magnetic field, the two series-connected PCBs on the closed PCB Rogowski coil can be adopted to form a combined PCB closed Rogowski coil. FIG. 3 shows the series connection of closed PCB Rogowski coil 305 and closed PCB Rogowski coil 310, which forms the combined PCB closed Rogowski coil 300.

The wirings of closed PCB Rogowski coil 310 and closed PCB Rogowski coil 305 are arranged in a mirror image method with the wiring of ring winding in opposite direction. A wire turn cycle of the closed PCB Rogowski coil 310 is composed of wiring 330 on the bottom layer, the through hole 335 and wiring 340 on the top layer. The wire turn cycle of corresponding closed PCB Rogowski coil 305 is composed of wiring 315 on the top layer, the through hole 320 and wiring 325 on the bottom layer. Wiring 330 on the bottom layer and wiring 315 on the top layer are pairs, same as through hole 335 and through hole 320, same as the wiring 340 on the top layer and wiring 325 on the bottom layer. These pairs are identical in position. It is the same with other wire turn cycles.

During the formation of combined PCB closed Rogowski coil 300, the closed PCB Rogowski coil 305 and closed PCB Rogowski coil 310 are stacked up on the upper and lower layers. The output ends 345 and 350 of the closed PCB Rogowski coil 305 are in the same position completely with the output ends 355 and 360 of the closed PCB Rogowski coil 310. Output end 350 of the closed PCB Rogowski coil 305 is connected with the output end 360 of the closed PCB Rogowski coil 310 to achieve the series connection of closed PCB Rogowski coil 305 and closed PCB Rogowski coil 310. Output end 365 of the combined PCB closed Rogowski coil 300 is connected with the output end 345 of closed Rogowski coil 305, and the output end 370 of combined PCB closed Rogowski coil 300 is connected with the output end 355 of the closed Rogowski coil 310.

When the AC interfering magnetic field vertical to page direction in FIG. 3 occurs, the interfering voltage signal generated between output ends 345 and 350 of the closed PCB Rogowski coil 305 and the interfering voltage signal generated between the output ends 355 and 360 of the closed PCB Rogowski coil 310 are approximately equal in size and opposite in polarity. Under the circumstance of the series connection of closed PCB Rogowski coil 305 and closed PCB Rogowski coil 310, the superposition of the two interfering signals is approximately zero. Therefore, when the AC interfering magnetic field vertical to page direction in FIG. 1 occurs, almost no interfering voltage signal will be generated between the output ends 365 and 370 of the combined PCB closed Rogowski coil 300.

Although the distance of the two closed PCB Rogowski coils used in the handling method is very close, the interference of the two coils caused by the external magnetic field cannot be in full coherence and cannot be offset completely. Further, the two closed Rogowski coils can be designed on single PCB to achieve the interference reduction of external magnetic field more effectively through the series connection of the two designed closed PCB Rogowski coils. FIG. 4A and FIG. 4B show the closed PCB Rogowski coil formed by the series connection of two groups of coils in opposite wiring direction on single PCB (refer to HIGH PRECISION ROGOWSKI COIL, U.S. Pat. No. 6,313,623 Nov. 6, 2001). FIG. 4A shows two groups of series-connected closed PCB Rogowski coils with opposite winding directions, whose wires are arranged on single PCB in a stagger way, and FIG. 4B shows two groups of series-connected closed PCB Rogowski coils with opposite winding directions, whose wires are arranged on single PCB in an interdigital way.

FIG. 4A and FIG. 4B show a scheme of the closed PCB Rogowski coil formed by the series connection of two groups of coils in opposite wiring direction on single PCB, although by which the interference of external magnetic field can be reduced more effectively, the two coils designed like this still fail to be the same completely, so the influence from the interference of external magnetic field cannot be removed well.

The opened Rogowski coil is composed of coils in two halves. When the opened Rogowski coil is used for current measurement of the alternating current I(t) to be measured in the current-carrying conductor, firstly the two halves of coils of the opened Rogowski coil are required to be opened to surround the current-carrying conductor, and then two halves of coils of the opened Rogowski coil are required to be closed to place the current-carrying conductor in center of the opened Rogowski coil after being closed. Current-carrying conductor is made to pass through the center of opened Rogowski coil vertically to ensure measurement accuracy with the centers of the current-carrying conductor and opened Rogowski coil in superposition. The current-carrying conductor is surrounded by the opened Rogowski coil. When the alternating current I(t) to be measured flows through the current-carrying conductor, it generates an AC magnetic field around the current-carrying conductor, and the magnetic lines are approximated as the circle centered in center of the current-carrying conductor.

The opened Rogowski coil also has the above-mentioned disadvantages of closed Rogowski coil that the two coils fail to be the same completely, so the influence from the interference of external magnetic field cannot be removed well.

Therefore, it is necessary to provide a more accordant PCB Rogowski coil with two groups of series-connected coils in opposite winding direction, capable of further reducing the influence on measurement caused by the external magnetic field and improving the capacity of interference resistance of PCB Rogowski coil.

SUMMARY OF THE DISCLOSURE

The disclosure is aimed at providing a PCB Rogowski coil for being better to remove the influence from the interference of external magnetic field, so as to improve the capability of resisting external interference of the Rogowski coil.

The purpose of the disclosure is realized by the following technical scheme:

A PCB Rogowski coil comprises two groups of series-connected coils in opposite winding direction, i.e. a first coil and a second coil, each of which includes multiple cycles of wire turns, furthermore:

One cycle of wire turn on the first coil includes a first incoming line, a first winding line and a first outgoing line, wherein the first winding lines of various cycles of wire turns on the first coil are parallel with each other and respectively arranged on the upper and lower surfaces of a PCB. The first incoming line, passing through a first through hole on the PCB, is connected with the first winding line. Then the first winding line, passing through a second through hole, is connected with the first outgoing line. Finally, the first outgoing line is also connected with the first incoming line of the lower cycle of wire turn on the first coil;

One cycle of wire turn on the second coil includes a second incoming line, a second winding line and a second outgoing line, wherein the second winding lines of various cycles of wire turns on the second coil are parallel with each other and respectively arranged on the upper and lower surfaces of a PCB. The second incoming line is connected with the second winding line. Then the second winding line, passing through a third through hole on the PCB, is led out from a fourth through hole and connected with the second outgoing line. Finally, the second outgoing line is also connected with the second incoming line of the lower cycle of wire turn on the second coil;

The first through hole is adjacent with the fourth through hole, the second through hole is adjacent with the third through hole, and the distance between the first winding line and the second winding line is less than that between two adjacent cycles of wire turns.

According to the technical scheme provided by the disclosure, the embodiment in the disclosure provides two groups of series-connected PCB Rogowski coils, which are more coincident and featured with opposite winding directions, capable of further reducing the influence of external magnetic field on the measurement and improving the capability of the Rogowski coil for resisting interference of external magnetic field.

BRIEF DESCRIPTION OF THE DRAWINGS

In order to more clearly illustrate the technical solution of the embodiments of the present disclosure, the following figures are provided. Obviously, the figures are only describing some embodiments of the disclosure. For one of ordinary skill in the art, other figures can also be obtained based on these figures.

FIG. 1 shows a closed Rogowski coil.

FIG. 2 shows a traditional winding closed Rogowski coil with return wire turn.

FIG. 3 shows a combined PCB closed Rogowski coil composed of two mirror image PCB closed Rogowski coils in series connection way.

FIG. 4A shows two groups of series-connected PCB closed Rogowski coils with opposite winding directions, whose wires are arranged on single PCB in a stagger way, and FIG. 4B shows two groups of series-connected PCB closed Rogowski coils with opposite winding directions, whose wires are arranged on single PCB in an interdigital way.

FIG. 5 shows a closed Rogowski coil with single dual-sided PCB of the embodiment in the disclosure.

FIG. 5A shows a laminating layer of the top layer and bottom layer of the closed Rogowski coil with single dual-sided PCB.

FIG. 6 shows local details of closed Rogowski coil with single dual-sided PCB in the embodiment of the disclosure.

FIG. 7 shows the dual-sided PCBs from the $1^{st}$ piece to the $(N-1)^{th}$ piece in the closed Rogowski coils with N dual-sided PCBs in the embodiment of the disclosure.

FIG. 8 shows the $N^{th}$ dual-sided PCB in the closed Rogowski coil with N dual-sided PCBs in the embodiment of the disclosure.

FIG. 9 shows local details of the $N^{th}$ dual-sided PCB in the closed Rogowski coil with N dual-sided PCBs in the embodiment of the disclosure.

FIG. 10 shows an opened Rogowski coil with two dual-sided PCBs in the embodiment of the disclosure.

FIG. 11 shows local details of right half coil of the opened Rogowski coil with two PCBs in the embodiment of the disclosure.

FIG. 12 shows local details of left half coil of the opened Rogowski coil with two PCBs in the embodiment of the disclosure.

FIG. 13 shows a dual-sided PCB from the $1^{st}$ layer to the $(N-1)^{th}$ layer laminated on the opened Rogowski coil with multiple dual-sided PCBs composed of N layers of dual-sided PCBs by laminating in the embodiment of the disclosure. The dual-sided PCBs from the $1^{st}$ layer to the $(N-1)^{th}$ layer include two dual-sided PCBs, and they are respectively the each half of the dual-sided PCBs from the $1^{st}$ layer to the $(N-1)^{th}$ layer of the opened Rogowski coil with multiple dual-sided PCBs by laminating.

FIG. 14 A shows a laminating layer of the top layer and bottom layer of the dual-sided PCB on the $N^{th}$ layer of the opened Rogowski coil with multiple dual-sided PCBs.

FIG. 16 shows local details on the left of the $N^{th}$ dual-sided PCB on the opened Rogowski coil with multiple dual-sided PCBs composed of N layers of the dual-sided PCBs by laminating.

DETAILED DESCRIPTION OF THE DISCLOSURE

Figure 5B:
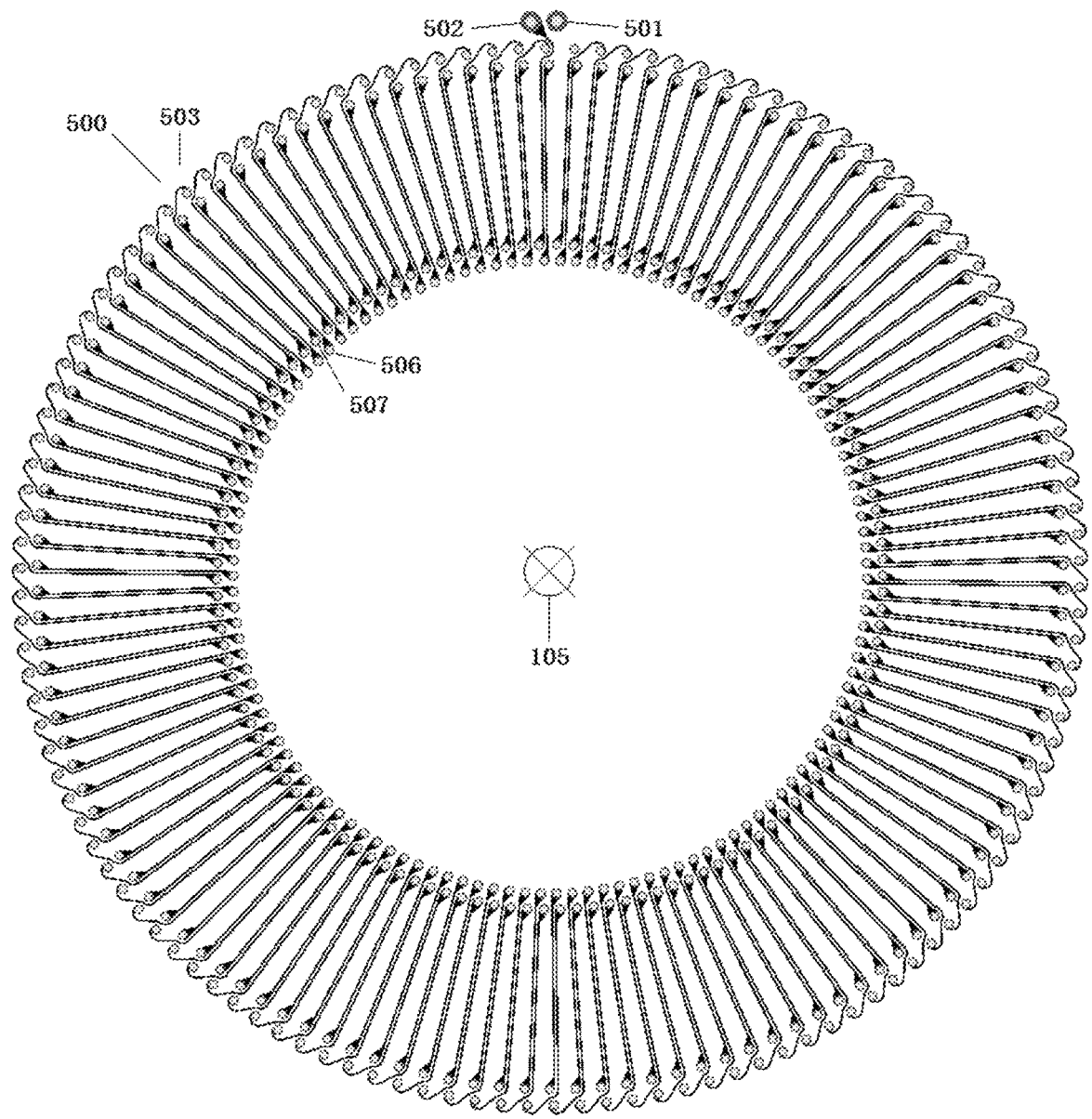
FIG. 5B shows a top layer of the closed Rogowski coil with single dual-sided PCB and FIG. 5C shows a bottom layer of the closed Rogowski coil with single dual-sided PCB.

Below in connection with the accompanying figures of the present disclosure embodiment, the present disclosure will be apparent in the technical implementation of the disclosure. The described embodiments are only part of the present disclosure, but not all. The described embodiments of the present disclosure, and all other embodiments perceived by those of ordinary skill in creativity, all belong to the scope of the present disclosure.

Below with references to the figures, the present disclosure is further described in detail.

The embodiment of the disclosure provides a PCB Rogowski coil, comprising two groups of series-connected coils in opposite winding direction, i.e. a first coil and a second coil, each of which includes multiple cycles of wire turns, furthermore:

One cycle of wire turn on the first coil includes a first incoming line, a first winding line and a first outgoing line, wherein the first winding lines of various cycles of wire turns on the first coil are parallel with each other and respectively arranged on the upper and lower surfaces of a PCB; the first incoming line, passing through a first through hole on the PCB, is connected with the first winding line, the first winding line, passing through a second through hole, is connected with the first outgoing line, and the first outgoing line is also connected with the first incoming line of the lower cycle of wire turn on the first coil;

One cycle of wire turn on the second coil includes a second incoming line, a second winding line and a second outgoing line, wherein the second winding lines of various cycles of wire turns on the second coil are parallel with each other and respectively arranged on the upper and lower surfaces of a PCB; the second incoming line is connected with the second winding line, the second winding line, passing through a third through hole on the PCB, is led out from a fourth through hole and connected with the second outgoing line, and the second outgoing line is also connected with the second incoming line of the lower cycle of wire turn on the second coil;

The first through hole is adjacent with the fourth through hole, the second through hole is adjacent with the third through hole, and the distance between the first winding line and the second winding line is less than that between two adjacent cycles of wire turns.

As multiple optional modes, the first coil and the second coil are arranged on single PCB to form a closed Rogowski coil with single PCB; or, they are arranged on multiple laminated PCBs to form an opened Rogowski coil with two PCBs; or they are arranged on they are arranged on two PCBs to form an opened Rogowski coil with two PCBs; or they are arranged on multiple PCB to form an opened Rogowski coils with multiple PCBs, wherein In the closed Rogowski coil with multiple PCBs, multiple PCBs are laminated; furthermore, multiple cycles of wire turns on the first and second coils are respectively wound on each one of multiple PCBs, and the PCBs with multiple cycles of wire turns are orderly connected through the external access points on the PCBs;

In the opened Rogowski coil with two PCBs, two PCBs are designed to semicircular annular PCBs, multiple cycles of wire turns of the first and second coils are wound on the two PCBs, respectively; two PCBs with multiple cycles of wire turns are respectively provided with two external access points, two PCBs are connected through respective external access point, and the other two external access points of two PCBs are taken as the respective signal output ends of two PCBs, respectively;

In the opened Rogowski coil with multiple PCBs, multiple PCBs are laminated to form two groups of semicircular annular PCBs, multiple cycles of wire turns of the first and second coils are wound on the two groups of PCBs, respectively; in the same group of semicircular annular PCBs, the semicircular annular PCB with multiple cycles of wire turns are connected by the respective external access point, and one of the other two external access points on the semicircular annular PCB is taken as the connecting point in the other group of semicircular annular PCBs, and the other one is taken as the signal output end of the group of semicircular annular PCBs;

The first one of multiple optional modes above is: closed Rogowski coil with single PCB:

(a) A composition unit is composed of a cycle of wire turn on the first coil and a cycle of adjacent wire turn on the second coil, two cycles of wire turns in the composition unit are adjacent closely, and multiple identical composition units are connected in series;

And/or, (b) the first incoming line and the first outgoing line of the first coil in each composition unit are respectively connected with the wire turns of the first coils on an upper composition unit and a lower composition unit, the first winding line is composed of wirings on the top layer and bottom layer, a first through hole and a second through hole between the top layer and the bottom layer by surrounding, the second incoming line and the second outgoing line of each composition unit are respectively connected with the wire turns of the second coils on the upper composition unit and the lower composition unit, and the second winding line is composed of wirings on the top layer and bottom layer, a third through hole and a fourth through hole between the top layer and the bottom layer by surrounding.

That two cycles of wire turns in the composition unit are adjacent closely can be understood as: the minimum space between two cycles of wire turns in the composition unit is equal to the minimum safety space between the PCBs, the minimum safety space between the PCBs is related to the technology of PCB, e.g. the minimum safety space between the PCBs is 6 mil, or 0.1524 mm.

Further, the closed Rogowski coil with single PCB also can be described as follows:

(a) Two signal output ends are provided, i.e. a first signal output end and a second signal output end, wherein that connected with the first signal output end is the first incoming line at the first cycle of wire turn on the first coil, that connected with the second signal output end is the second incoming line at the second cycle of wire turn on the second coil, the first outgoing line at the last cycle of wire turn on the first coil is connected with the second outgoing line at the last cycle of wire turn on the second coil, and serial connection between the first coil and the second coil of the closed Rogowski coil with single PCB is realized;

And/or, (b) the section composed of the first winding lines at the various cycles of wire turns on the first coil by surrounding is located on a cross section of PCB, and the first winding lines at the various cycles of wire turns on the first coil are overlapped in the direction vertical to the surface of PCB; the section composed of the second winding lines at the various cycles of wire turns on the second coil by surrounding is located on a cross section of PCB, and the second winding lines at the various cycles of wire turns on the second coil are overlapped in the direction vertical to the surface of PCB;

And/or, (c) the centers of all the composition units are uniformly distributed on a magnetic line of magnetic field for generating current to be measured, the direction of the section surrounded by the winding lines at the wire turns on the first coil of all the composition units is close to the normal direction of the magnetic line passing through the section center of the winding line, and the section surrounded by the winding lines at the wire turns on the first coil is approximately vertical to the normal direction of the magnetic line passing through the section center of the winding line; the direction of the section surrounded by the winding lines at the wire turns on the second coil of all the composition units is close to the normal direction of the magnetic line passing through the section center of the winding line, and the section surrounded by the winding lines at the wire turns on the second coil is approximately vertical to the normal direction of the magnetic line passing through the section center of the winding line.

The technical scheme provided by the embodiment in the disclosure provides two groups of series-connected PCB Rogowski coils, which are more coincident and featured with opposite winding directions, capable of further reducing the influence of external magnetic field on the measurement and improving the capability of the Rogowski coil for resisting interference of external magnetic field.

As the total magnetic flux picked up by the ring winding of closed PCB Rogowski coil is in direct proportion to the sectional area, the larger the sectional area of ring winding is, the larger the variation of the total magnetic flux will be. For the same current to be measured, the stronger the output signals the PCB Rogowski coil is, and the higher the detection sensitivity of the closed PCB Rogowski coil will be. As the sectional area of the ring winding of the closed PCB Rogowski coil is in direct proportion to the thickness of the PCB, the thicker the latter is, the larger the former will be, and the higher the detection sensitivity of the closed PCB Rogowski coil will be. Hence, a thicker PCB can be adopted to improve the detection sensitivity of the closed PCB Rogowski coil: However, the thickness of the PCB can't be increased definitely as the processing technology. The processing cost will largely increase with the increase of the thickness of the PCB. The closed Rogowski coil with single PCB at a certain thickness will cost much higher than the PCB Rogowski coil with the same thickness composed of multiple thin PCBs. Whereas it's better to produce the closed Rogowski coils with multiple PCBs composed of multiple thin PCBs than the closed Rogowski coil with single PCB at the same thickness.

Thus, the second one of multiple optional modes above is: closed Rogowski coil with multiple PCBs:

(a) Two signal output ends are provided, i.e. a first signal output end and a second signal output end, wherein in N laminated PCBs, the PCB with the first signal output end and the second signal output end is the $1^{st}$ PCB, the PCB adjacent with the $1^{st}$ board is the $2^{nd}$ PCB, till the $N^{th}$ PCB is present;

And/or, (b) four external access points are set on the $1^{st}$ PCB to the $(N-1)^{th}$ PCB, i.e. the first external access point, the second external access point, the third external access point and the fourth external access point, wherein the first external access point and the third external access point are the starting point and ending point of the first coil from the $1^{st}$ PCB to the $(N-1)^{th}$ PCB, the second external access point and the fourth external access point are the starting point and ending point of the second coil from the $1^{st}$ PCB to the $(N-1)^{th}$ PCB; the $N^{th}$ PCB is provided with two external access points, i.e. the first external access point and the second external access point, wherein the first external access point is the starting point of the first coil on the $N^{th}$ PCB, and the second external access point is the starting point of the second coil on the $N^{th}$ PCB;

And/or, (c) the first external access point on the $1^{st}$ PCB is the first signal output end, and the second external access point on the $1^{st}$ PCB is the second signal output end;

And/or, (d) the third external access point of an upper PCB in the adjacent laminated PCBs is connected with the first external access point on a lower PCB to realize series connection between the first coil on the upper PCB and the first coil on the lower PCB to form a complete first coil; the fourth external access point of an upper PCB in the adjacent laminated PCBs is connected with the second external access point on a lower PCB to realize series connection between the second coil on the upper PCB and the second coil on the lower PCB to form a complete second coil; and the first coil and second coil are directly connected in series on the $N^{th}$ PCB.

Further, multiple closed PCB Rogowski coil also can be described as follows:

(a) A composition unit is composed of a cycle of wire turn on the first coil and a cycle of adjacent wire turn on the second coil in each PCB, multiple identical composition units are connected in series, and two cycles of wire turns in the composition unit are adjacent closely;

And/or, (b) the first incoming line and the first outgoing line of the first coil in each composition unit are respectively connected with the wire turns of the first coils on an upper composition unit and a lower composition unit, the first winding line is composed of wirings on the top layer and bottom layer, a first through hole and a second through hole between the top layer and the bottom layer by surrounding, the second incoming line and the second outgoing line of each composition unit are respectively connected with the wire turns of the second coils on the upper composition unit and the lower composition unit, and the second winding line is composed of wirings on the top layer and bottom layer, a third through hole and a fourth through hole between the top layer and the bottom layer by surrounding.

And/or, (c) the first incoming line at one cycle of wire turn on the first coil of the first composition unit from the $1^{st}$ PCB to the $N^{th}$ PCB is connected with the first external access point from the $1^{st}$ PCB to the $N^{th}$ PCB, the second incoming line at one cycle of wire turn on the second coil of the first composition unit from the $1^{st}$ PCB to the $N^{th}$ PCB is connected with the second external access point from the $1^{st}$ PCB to the $N^{th}$ PCB, the first outgoing line at one cycle of wire turn on the first coil of the last composition unit from the $1^{st}$ PCB to the $(N-1)^{th}$ PCB is connected with the third external access point from the $1^{st}$ PCB to the $(N-1)^{th}$ PCB, the second outgoing line at one cycle of wire turn on the second coil of the last composition unit from the $1^{st}$ PCB to the $(N-1)^{th}$ PCB is connected with the fourth external access point from the $1^{st}$ PCB to the $(N-1)^{th}$ PCB, and the first outgoing line at one cycle of wire turn on the first coil of the last composition unit on the $N^{th}$ PCB is directly connected with the second outgoing line at one cycle of wire turn on the second coil of the last composition unit on the $N^{th}$ PCB, so as to realize the series connection of the first coil and second coil on the $N^{th}$ PCB;

And/or, (d) the section composed of the winding lines at two cycles of wire turns of each composition unit by surrounding is vertical to the surface of PCB, the section composed of the winding lines by surrounding is located on the cross section of PCB, and the wiring paths of the winding lines are overlapped in the direction vertical to the surface of PCB;

And/or, (e) the centers of the composition units on each PCB are uniformly distributed on a magnetic line of magnetic field for generating current to be measured, the direction of the section surrounded by the winding lines at two cycles of wire turns of the composition units is close to the normal direction of the magnetic line passing through the section center of the winding line, and the section surrounded by the winding lines at two cycles of wire turns of all the composition units is approximately vertical to the tangential direction of the magnetic line passing through the section center of the winding line.

That two cycles of wire turns in the composition unit are adjacent closely can be understood as: the minimum space between two cycles of wire turns in the composition unit is equal to the minimum safety space between the PCBs, the minimum safety space between the PCBs is related to the technology of PCB, e.g. the minimum safety space between the PCBs is 6 mil, or 0.1524 mm.

The technical scheme provided by the embodiment in the disclosure provides two groups of series-connected PCB Rogowski coils, which are more coincident and featured with opposite winding directions, capable of further reducing the influence of external magnetic field on the measurement and improving the capability of the Rogowski coil for resisting interference of external magnetic field.

The third one of multiple optional modes above is: opened Rogowski coil with two PCBs:

(a) Two external access points are set each PCB, i.e. the first external access point and the second external access point, wherein the first external access point on each PCB is the starting point of the first coil on the PCB, and the second external access point on the PCB is the ending point of the second coil on the PCB;

And/or, (b) two connection modes are provided for two PCBs: the first external access points of two PCBs are connected directly, the second external access points of two PCBs are taken as two signal output ends of the opened Rogowski coil with two PCBs, i.e. the first signal output end and the second signal output end; or, the second external access points of two PCBs are connected directly, the first access points of two PCBs are taken as two signal output ends of the opened Rogowski coil with two PCBs, i.e. the first signal output end and the second signal output end.

Further, the opened Rogowski coil with two PCBs also can be described as follows:

(a) A composition unit is composed of a cycle of wire turn on the first coil and a cycle of adjacent wire turn on the second coil in each of the opened Rogowski coil with two PCBs, multiple identical composition units are connected in series, and two cycles of wire turns in the composition unit are adjacent closely;

And/or, (b) the first incoming line and the first outgoing line of the first coil in each composition unit are respectively connected with the wire turns of the first coils on an upper composition unit and a lower composition unit, the first winding line is composed of wirings on the top layer and bottom layer, a first through hole and a second through hole between the top layer and the bottom layer by surrounding, the second incoming line and the second outgoing line of each composition unit are respectively connected with the wire turns of the second coils on the upper composition unit and the lower composition unit, and the second winding line is composed of wirings on the top layer and bottom layer, a third through hole and a fourth through hole between the top layer and the bottom layer by surrounding.

And/or, (c) the PCB with the first signal output end is the $1^{st}$ PCB, the PCB with the second signal output end is the $2^{nd}$ PCB, the first incoming line at one cycle of wire turn on the first coil of the first composition unit on the $1^{st}$ PCB is connected with the first external access point of the $1^{st}$ PCB, the second incoming line at one cycle of wire turn on the second coil of the first composition unit on the $1^{st}$ PCB is connected with the second external access point of the $1^{st}$ PCB, the first incoming line at one cycle of wire turn on the first coil of the first composition unit on the $2^{nd}$ PCB is connected with the first external access point of the $2^{nd}$ PCB, and the second incoming line at one cycle of wire turn on the second coil of the first composition unit on the $2^{nd}$ PCB is connected with the second external access point of the $2^{nd}$ PCB;

And/or, (d) the first outgoing line at one cycle of wire turn on the first coil of the last composition unit on the $1^{st}$ PCB is directly connected with the second outgoing line at one cycle of wire turn on the second coil of the last composition unit on the $1^{st}$ PCB to realize series connection between the first coil and the second coil on the $1^{st}$ PCB, and the first outgoing line at one cycle of wire turn on the first coil of the last composition unit on the $2^{nd}$ PCB is directly connected with the second outgoing line at one cycle of wire turn on the second coil of the last composition unit on the $2^{nd}$ PCB to realize series connection between the first coil and the second coil on the $2^{nd}$ PCB;

And/or, (e) the section composed of the winding lines at two cycles of wire turns of each composition unit by surrounding is vertical to the surface of PCB, the section composed of the winding lines by surrounding is located on the cross section of PCB, and the wiring paths of the winding lines are overlapped in the direction vertical to the surface of PCB;

And/or, (f) the centers of the composition units on each PCB are uniformly distributed on a magnetic line of magnetic field for generating current to be measured, the direction of the section surrounded by the winding lines at two cycles of wire turns of all the composition units is close to the normal direction of the magnetic line passing through the section center of the winding line, and the section surrounded by the winding lines at two cycles of wire turns of all the composition units is approximately vertical to the tangential direction of the magnetic line passing through the section center of the winding line.

That two cycles of wire turns in the composition unit are adjacent closely can be understood as: the minimum space between two cycles of wire turns in the composition unit is equal to the minimum safety space between the PCBs, the minimum safety space between the PCBs is related to the technology of PCB, e.g. the minimum safety space between the PCBs is 6 mil, or 0.1524 mm.

The technical scheme provided by the embodiment in the disclosure provides two groups of series-connected PCB Rogowski coils, which are more coincident and featured with opposite winding directions, capable of further reducing the influence of external magnetic field on the measurement and improving the capability of the Rogowski coil for resisting interference of external magnetic field.

As the total magnetic flux picked up by the ring winding of the PCB Rogowski coil is in direct proportion to the sectional area, the larger the sectional area of ring winding is, the larger variation of the total magnetic flux will be. For the same current to be measured, the stronger the output signals output from the PCB Rogowski coil is, and the higher the detection sensitivity of the PCB Rogowski coil will be. As the sectional area of the ring winding of the PCB Rogowski coil is in direct proportion to the thickness of the PCB, the thicker the latter is, the larger the former will be, and the higher the detection sensitivity of the PCB Rogowski coil will be. Hence, a thicker PCB can be adopted to improve the detection sensitivity of the PCB Rogowski coil. However, the thickness of the PCB can't be increased definitely as the processing technology. The processing cost will largely increase with the increase of the thickness of the PCB. The Rogowski coil with single PCB at a certain thickness will cost much higher than the PCB Rogowski coil with the same thickness composed of multiple thin PCBs. Whereas it's better to produce the Rogowski coils with multiple PCBs composed of multiple thin PCBs than that with a single PCB.

Thus, the fourth one of multiple optional modes above is: opened Rogowski coils with multiple PCBs:

(a) The same group of semicircular annular PCBs are composed of N PCBs by alternating, each group of semicircular annular PCBs is provided with two signal output ends, i.e. the first signal output end and the second signal output end, wherein the PCB with first signal output end and the second signal output end is the $1^{st}$ PCB, and the PCB adjacent with the $1^{st}$ PCB is the $2^{nd}$ PCB, till the $N^{th}$ PCB is present;

And/or, (b) four external access points are set on the $1^{st}$ PCB to the $(N-1)^{th}$ PCB in each group of semicircular annular PCBs, i.e. the first external access point, the second external access point, the third external access point and the fourth external access point, wherein the first external access point and the third external access point are the starting point and ending point of the first coil from the $1^{st}$ PCB to the $(N-1)^{th}$ PCB, the second external access point and the fourth external access point are the starting point and ending point of the second coil from the $1^{st}$ PCB to the $(N-1)^{th}$ PCB; the $N^{th}$ PCB in each group of semicircular annular PCBs is provided with two external access points, i.e. the first external access point and the second external access point, wherein the first external access point is the starting point of the first coil on the $N^{th}$ PCB, and the second external access point is the starting point of the second coil on the $N^{th}$ PCB;

And/or, (c) the first external access point on the $1^{st}$ PCB in each group of semicircular annular PCBs is the first signal output end, the second external access point on the $1^{st}$ PCB is the second signal output end, the third external access point of the upper PCB in the adjacent laminated PCBs in each group of semicircular annular PCBs is connected with the first external access point on the lower PCB to realize the series connection between the first coil on the upper PCB and the first coil on the lower PCB to form the complete first coil; the fourth access point of the upper PCB in the adjacent laminated PCBs in each group of semicircular annular PCBs is connected with the second external access point on the lower PCB to realize the series connection between the second coil on the upper PCB and the second coil on the lower PCB to form the complete second coil; the first coil and second coil on each half of PCB Rogowski coil are directly connected in series on the $N^{th}$ PCB to form a group of semicircular annular PCBs;

And/or, (d) the first signal output ends on two groups of semicircular annular PCBs are connected directly, and the second signal output ends thereon are taken as two signal output ends of the opened Rogowski coil with multiple PCBs, i.e. the first signal output end and the second signal output end; or the second signal output ends on two groups of semicircular annular PCBs are connected directly, and the first signal output ends thereon are taken as two signal output ends of, the opened Rogowski coil with multiple PCBs, i.e. the first signal output end and the second signal output end.

Further, opened Rogowski coil with multiple PCBs also can be described as follows:

(a) A composition unit is composed of a cycle of wire turn on the first coil and a cycle of adjacent wire turn on the second coil in each PCB of the opened Rogowski coil with multiple PCBs, multiple identical composition units are connected in series, and two cycles of wire turns in the composition unit are adjacent closely;

And/or, (b) the first incoming line and the first outgoing line of the first coil in each composition unit are respectively connected with the wire turns of the first coils on an upper composition unit and a lower composition unit, the first winding line is composed of wirings on the top layer and bottom layer, a first through hole and a second through hole between the top layer and the bottom layer by surrounding, the second incoming line and the second outgoing line of each composition unit are respectively connected with the wire turns of the second coils on the upper composition unit and the lower composition unit, and the second winding line is composed of wirings on the top layer and bottom layer, a third through hole and a fourth through hole between the top layer and the bottom layer by surrounding.

And/or, (c) the first incoming line at one cycle of wire turn on the first coil of the first composition unit from the $1^{st}$ PCB to the $N^{th}$ PCB is connected with the first external access point from the $1^{st}$ PCB to the $N^{th}$ PCB, the second incoming line at one cycle of wire turn on the second coil of the first composition unit from the $1^{st}$ PCB to the $N^{th}$ PCB is connected with the second external access point from the $1^{st}$ PCB to the $N^{th}$ PCB, the first outgoing line at one cycle of wire turn on the first coil of the last composition unit from the $1^{st}$ PCB to the $(N-1)^{th}$ PCB is connected with the third external access point from the $1^{st}$ PCB to the $(N-1)^{th}$ PCB, the second outgoing line at one cycle of wire turn on the second coil of the last composition unit from the $1^{st}$ PCB to the $(N-1)^{th}$ PCB is connected with the fourth external access point from the $1^{st}$ PCB to the $(N-1)^{th}$ PCB, and the first outgoing line at one cycle of wire turn on the first coil of the last composition unit on the $N^{th}$ PCB is directly connected with the second outgoing line at one cycle of wire turn on the second coil of, the last composition unit on the $N^{th}$ PCB, so as to realize the series connection of the first coil and second coil on the $N^{th}$ PCB;

And/or, (d) the section composed of the winding lines at two cycles of wire turns of each composition unit by surrounding is vertical to the surface of PCB, the section composed of the winding lines by surrounding is located on the cross section of PCB, and the wiring paths on the top layer and bottom layer of the winding lines are overlapped in the direction vertical to the surface of PCB;

And/or, (e) the centers of each composition unit are uniformly distributed on a magnetic line of magnetic field for generating current to be measured, the direction of the section surrounded by the winding lines at two cycles of wire turns of all the composition units is close to the normal direction of the magnetic line passing through the section center of the winding line, and the section surrounded by the winding lines at two cycles of wire turns of all the composition units is approximately vertical to the tangential direction of the magnetic line passing through the section center of the winding line.

That two cycles of wire turns in the composition unit are adjacent closely can be understood as: the minimum space between two cycles of wire turns in the composition unit is equal to the minimum safety space between the PCBs, the minimum safety space between the PCBs is related to the technology of PCB, e.g. the minimum safety space between the PCBs is 6 mil, or 0.1524 mm.

The technical scheme provided by the embodiment in the disclosure provides two groups of series-connected PCB Rogowski coils, which are more coincident and featured with opposite winding directions, capable of further reducing the influence of external magnetic field on the measurement and improving the capability of the PCB Rogowski coil for resisting interference of external magnetic field.

For easy understanding, specific implementation mode for different types of Rogowski coils is described in detail below.

(I) Closed Rogowski Coil with Single PCB

Closed Rogowski coil with single PCB capable of resisting interference of external magnetic field comprises two groups of series-connected coils in opposite winding direction, i.e. a first coil and a second coil, both of which are located on single PCB and are connected in series to form a closed Rogowski coil with single PCB.

The closed Rogowski coil with single PCB capable of resisting interference of external magnetic field is specifically composed of multiple identical composition units in series connection, each of which comprises one cycle of wire turn on the first coil and one cycle of wire turn on the second coil, and the two cycles of wire turns are adjacent closely. That two cycles of wire turns are adjacent closely can be understood as: the minimum space between two cycles of wire turns is equal to the minimum safety space between the PCBs, the minimum safety space between the PCBs is related to the technology of PCB, e.g. the minimum safety space between the PCBs is 6 mil, or 0.1524 mm.

One cycle of wire turn on the first coil of each composition unit on the closed Rogowski coil with single PCB comprises an incoming line, a winding line and an outgoing line, wherein the incoming line and outgoing line are respectively connected with the wire turns of the first coils on the upper composition unit and the lower composition unit, and the winding line is composed of wirings and through holes among different layers by surrounding. Specifically, the wiring path on the top layer is overlapped with that on the bottom layer. The section of winding lines composed of the wirings on the top layer and bottom layer and two through holes by surrounding is similar to a rectangle. One cycle of wire turn on the first coil of each composition unit on the closed Rogowski coil with single PCB comprises an incoming line, a winding line and an outgoing line, wherein the incoming line and outgoing line are respectively connected with the wire turns of the first coils on the upper composition unit and the lower composition unit, and the winding line is composed of wirings and through holes among different layers by surrounding.

The closed Rogowski coil with single PCB capable of resisting interference of external magnetic field is provided with two signal output ends, i.e. the first signal output end and the second signal output end, wherein that connected with the first signal output end is the incoming line of the wire turn on the first coil of the first composition unit, and that connected with the second signal output end is the incoming line of the wire turn on the second coil of the first composition unit. That adjacent with the first composition unit is the second composition unit, the rest can be done in the same manner till the last composition unit is present. The outgoing line of the wire turn on the first coil of the last composition unit is directly connected with the outgoing line of the wire turn on the second coil of the last composition to realize the series connection between the first coil and the second coil of the closed Rogowski coil with single PCB.

For the closed Rogowski coil with single PCB capable of resisting interference of external magnetic field, the section composed of the wire turns of the first coil on each composition unit by surrounding is vertical to the surface of PCB, the section composed of the winding lines by surrounding is located on the cross section of PCB, and the wiring paths of the winding lines are overlapped in the direction vertical to the surface of PCB. The section composed of the winding lines at the wire turn of the second coil on each composition unit by surrounding is vertical to the surface of PCB, the section composed of the winding lines by surrounding is located on the cross section of PCB, and the wiring paths of the winding lines are overlapped in the direction vertical to the surface of PCB.

For the closed Rogowski coil with single PCB capable of resisting interference of external magnetic field, the centers of all the composition units are uniformly distributed on the magnetic line of magnetic field for generating current to be measured. The direction of section composed of the winding lines on the wire turns of the first coils on all the composition units by surrounding is approximate to the normal direction of the magnetic line passing through the section center of the winding line, and the section composed of the winding lines on the wire turns of the first coils is approximately vertical to the tangential direction of the magnetic line passing through the section center of the winding line (namely strength direction of magnetic field). The direction of section composed of the winding lines on the wire turns of the second coils on all the composition units by surrounding is approximate to the normal direction of the magnetic line passing through the section center of the winding line, and the section composed of the winding lines on the wire turns of the second coils is approximately vertical to the tangential direction of the magnetic line passing through the section center of the winding line (namely strength direction of magnetic field).

In the closed Rogowski coil with single PCB, the PCB is a dual-sided PCB, wherein the first coil and the second coil are located on the upper and lower surfaces of the PCB, so the closed Rogowski coil with single PCB can be called a closed Rogowski coil with single dual-sided PCB.

Closed Rogowski coil with single dual-sided PCB capable of resisting interference of external magnetic field comprises two groups of series-connected coils in opposite winding direction, i.e. a first coil and a second coil, both of which are located on single dual-sided PCB and are connected in series to form a closed Rogowski coil with single dual-sided PCB.

The closed Rogowski coil with single dual-sided PCB capable of resisting interference of external magnetic field is specifically composed of multiple identical composition units in series connection, each of which comprises one cycle of wire turn on the first coil and one cycle of wire turn on the second coil, and the two cycles of wire turns are adjacent closely. That two cycles of wire turns are adjacent closely can be understood as: the minimum space between two cycles of wire turns is equal to the minimum safety space between the PCBs, the minimum safety space between the PCBs is related to the technology of PCB, e.g. the minimum safety space between the PCBs is 6 mil, or 0.1524 mm.

One cycle of wire turn on the first coil of each composition unit comprises an incoming line, a winding line and an outgoing line, wherein the incoming line and outgoing line are respectively connected with the wire turns of the first coils on the upper composition unit and the lower composition unit, and the winding line is composed of wirings and through holes between the top layer and the bottom layer by surrounding. One cycle of wire turn on the second coil of each composition unit on closed Rogowski coil with single dual-sided PCB comprises an incoming line, a winding line and an outgoing line, wherein the incoming line and outgoing line are respectively connected with the wire turns of the second coils on the upper composition unit and the lower composition unit, and the winding line is composed of wirings and through holes between the top layer and the bottom layer by surrounding.

The closed Rogowski coil with single dual-sided PCB capable of resisting interference of external magnetic field is provided with two signal output ends, i.e. the first signal output end and the second signal output end, wherein that connected with the first signal output end is the incoming line of the wire turn on the first coil of the first composition unit, and that connected with the second signal output end is the incoming line of the wire turn on the second coil of the first composition unit. That adjacent with the first composition unit is the second composition unit, the rest can be done in the same manner till the last composition unit is present. The outgoing line of the wire turn on the first coil of the last composition unit is directly connected with the outgoing line of the wire turn on the second coil of the last composition to realize the series connection between the first coil and the second coil of closed Rogowski coil with single dual-sided PCB.

For the closed Rogowski coil with single dual-sided PCB capable of resisting interference of external magnetic field, the section composed of the wire turns of the first coil on each composition unit by surrounding is vertical to the surface of dual-sided PCB, the section composed of the winding lines by surrounding is located on the cross section of PCB, and the wiring paths of the winding lines are overlapped in the direction vertical to the surface of dual-sided PCB. The section composed of the winding lines at the wire turn of the second coil on each composition unit by surrounding is vertical to the surface of dual-sided PCB, the section composed of the winding lines by surrounding is located on the cross section of dual-sided PCB, and the wiring paths of the winding lines are overlapped in the direction vertical to the surface of dual-sided PCB.

For the closed Rogowski coil with single dual-sided PCB capable of resisting interference of external magnetic field, the centers of all the composition units are uniformly distributed on the magnetic line of magnetic field for generating current to be measured. The direction of section composed of the winding lines on the wire turns of the first coils on all the composition units by surrounding is approximate to the normal direction of the magnetic line passing through the section center of the winding line, and the section composed of the winding lines on the wire turns of the first coils is approximately vertical to the tangential direction of the magnetic line passing through the section center of the winding line (namely strength direction of magnetic field). The direction of section composed of the winding lines on the wire turns of the second coils on all the composition units by surrounding is approximate to the normal direction of the magnetic line passing through the section center of the winding line, and the section composed of the winding lines on the wire turns of the second coils is approximately vertical to the tangential direction of the magnetic line passing through the section center of the winding line (namely strength direction of magnetic field).

Figure 5C:
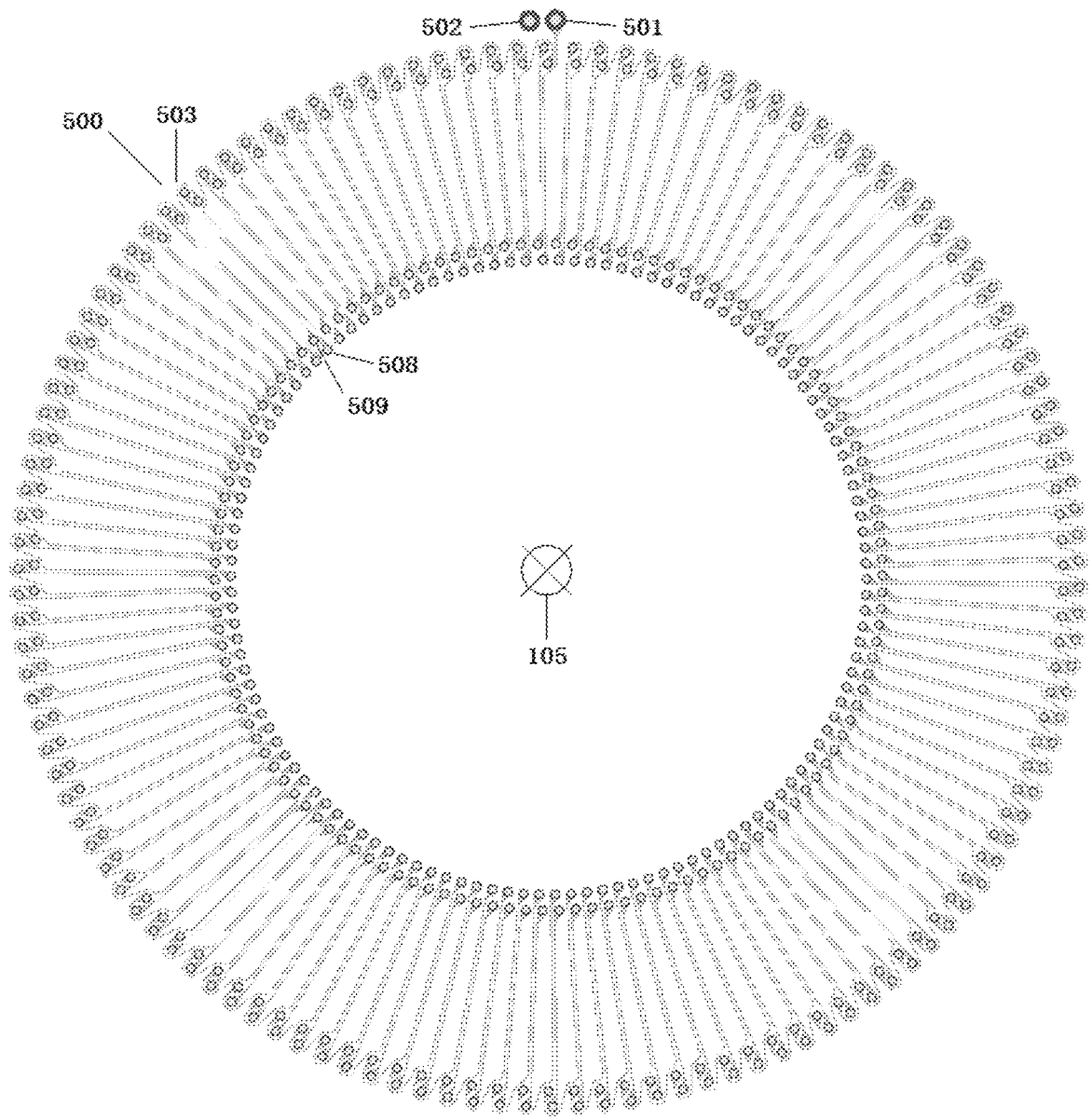

FIG. 5 shows a specific embodiment of the disclosure, or a closed Rogowski coil with single dual-sided PCB 500 capable of resisting interference of external magnetic field, which is suitable for measuring the current flowing on a current-carrying conductor 105 vertically passing through the center of closed PCB Rogowski coil 500, and the magnetic line of AC magnetic field generated by the current is a circle of taking the center of closed PCB Rogowski coil 500 as the center of a circle. FIG. 5A shows a laminating layer on the top layer and bottom layer of the closed Rogowski coil with single dual-sided PCB, FIG. 5B shows a top layer of the closed Rogowski coil with single dual-sided PCB, and FIG. 5C shows a bottom layer of the closed Rogowski coil with single dual-sided PCB.

The closed Rogowski coil with single dual-sided PCB 500 comprises two groups of coils 501 and 502 with opposite winding directions, Wherein the coil 501 is connected with the coil 502 in series to form a closed PCB Rogowski coil 500. The closed Rogowski coil with single dual-sided PCB 500 is composed of multiple identical composition units in series connection, and FIG. 5A shows a composition unit 503. As shown in FIG. 5A, FIG. 5B and FIG. 5C, the center of composition unit 503 and the centers of other composition units are located on a circular magnetic line generated by the current flowing on the current-carrying conductor 105, and various composition units are uniformly distributed on the circular magnetic line.

Each composition unit comprises one cycle of wire turn of two groups of coils with opposite winding directions. The composition unit 503 comprises a cycle of wire turn 504 on the coil 501 and a cycle of wire turn 505 on the coil 502, and the two cycles of wire turns are adjacent closely. FIG. 5B shows a top layer part 506 of the wire turn 504 and a top layer part 507 of the wire turn 505 on the composition unit 503. The top layer part 506 of the wire turn 504 is adjacent with the top layer part 507 of the wire turn 506 closely, FIG. 5C shows a bottom layer part 508 of the wire turn 504 and a bottom layer part 509 of the wire turn 505 on the composition unit 503. The bottom layer part 508 of the wire turn 504 is adjacent with the bottom layer part 509 of the wire turn 506 closely.

Figure 6A:
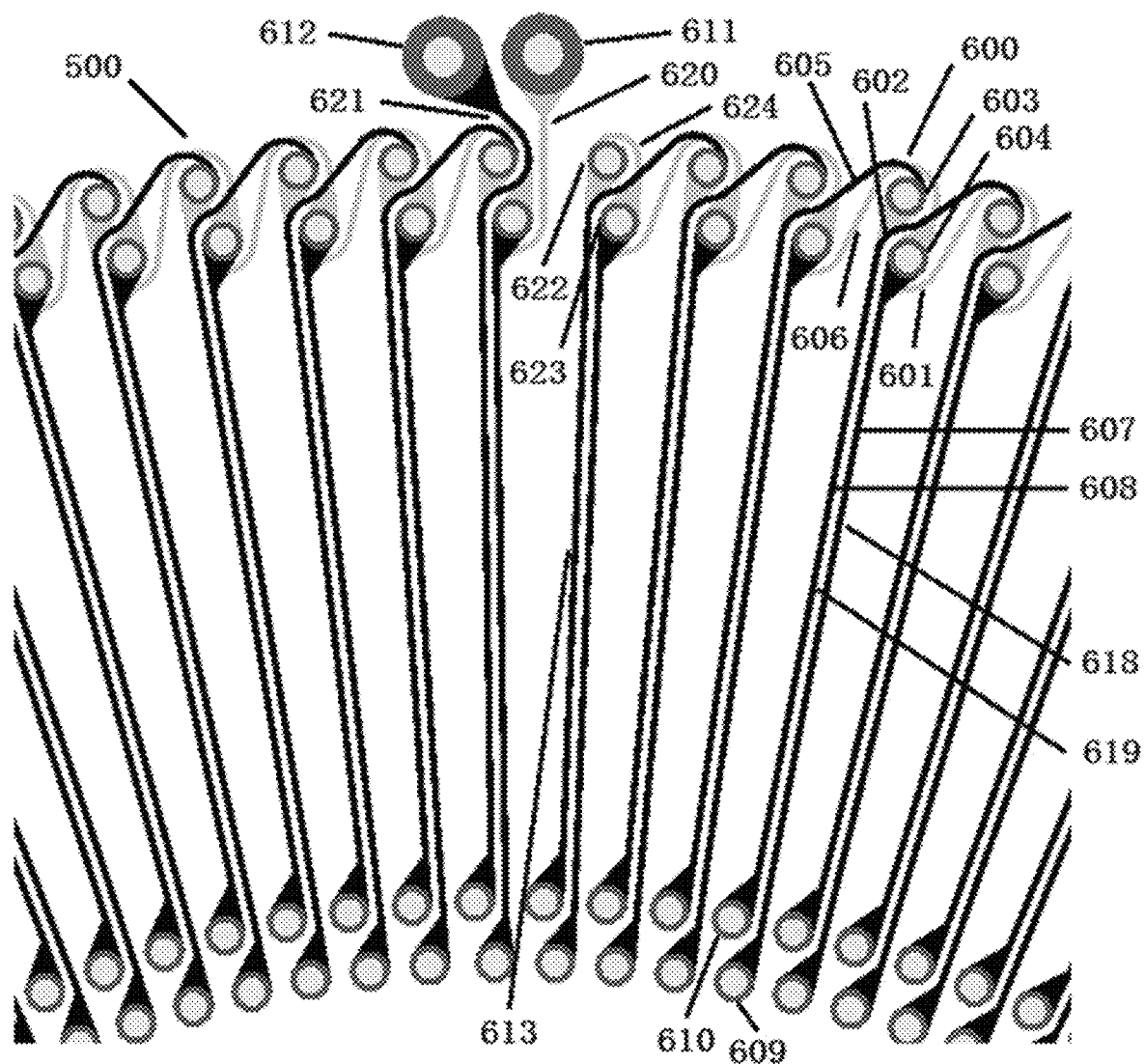
FIG. 6A shows a laminating layer of the partial top layer and bottom layer of the closed Rogowski coil with single dual-sided PCB.
Figure 6B:
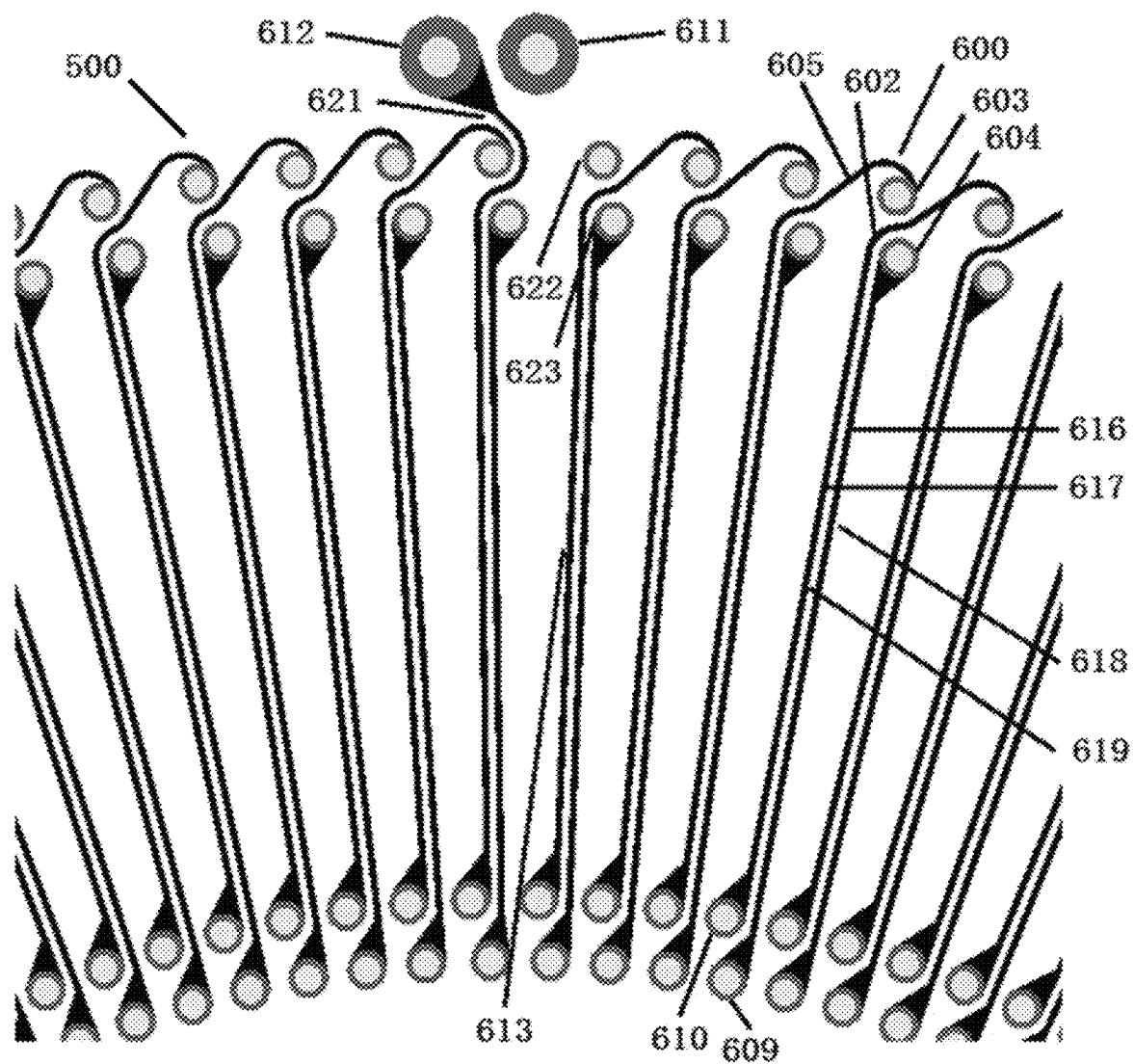
FIG. 6B shows a partial top layer of the closed Rogowski coil with single dual-sided PCB and FIG. 6C shows a partial bottom layer of the closed Rogowski coil with single dual-sided PCB.
Figure 6C:
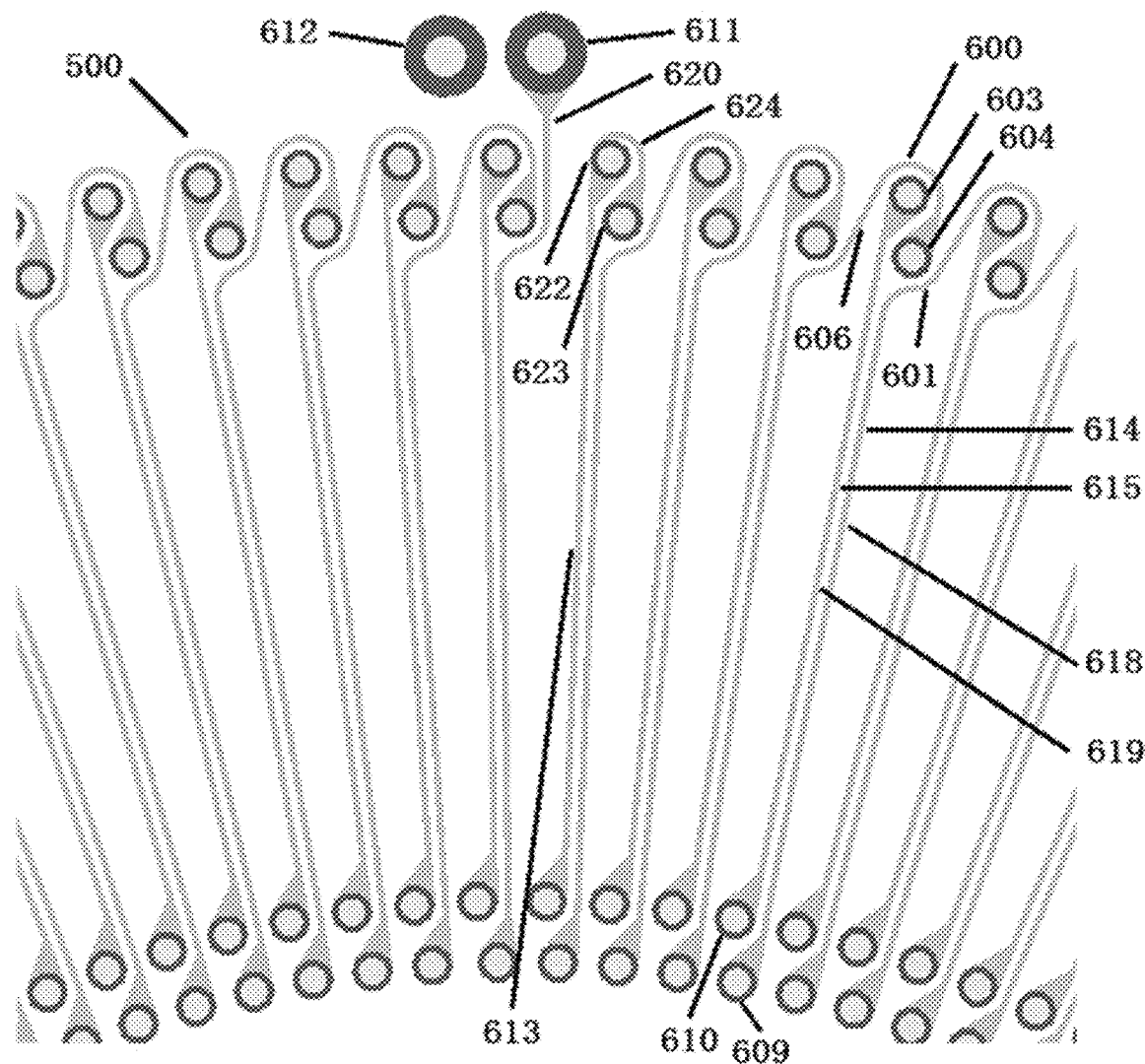

FIG. 6 shows local details of the closed Rogowski coil with single dual-sided PCB 500. FIG. 6A shows a laminating layer on the local top layer and bottom layer of the closed Rogowski coil with single dual-sided PCB 500, FIG. 6B shows a local top layer of the closed Rogowski coil with single dual-sided PCB 500, and FIG. 6C shows a local bottom layer of the closed Rogowski coil with single dual-sided PCB 500.

The laminating layer on the top layer and bottom layer of a composition unit 600 on the closed PCB Rogowski coil 500, as shown in FIG. 6A, comprises a laminating layer part of a cycle of wire turn 618 on the coil 620 and a laminating layer part of a cycle of wire turn 619 on the other group of coil 621 with opposite winding direction. The laminating layer part of a cycle of wire turn 618 on the coil 620 comprises an incoming line 601, a wiring line 607, a through hole 609, a through hole 604 and an outgoing line 606. The laminating layer part of a cycle of wire turn 619 on the coil 621 comprises an incoming line 602, a wiring line 608, a through hole 610, a through hole 603 and an outgoing line 605.

The top layer of a composition unit 600 on the closed PCB Rogowski coil 500, as shown in FIG. 6B, comprises a top layer part of a cycle of wire turn 618 on the coil 620 and a top layer part of a cycle of wire turn 619 on the other group of coil 621 with opposite winding direction. The top layer part of a cycle of wire turn 618 on the coil 620 comprises a through hole 609, a wiring line 616 and a through hole 604. The top layer part of a cycle of wire turn 619 on the coil 621 comprises an incoming line 602, a wiring line 617, a through hole 610, a through hole 603 and an outgoing line 605.

The bottom layer of a composition unit 600 on the closed PCB Rogowski coil 500, as shown in FIG. 6C, comprises a bottom layer part of a cycle of wire turn 618 on the coil 620 and a bottom layer part of a cycle of wire turn 619 on the other group of coil 621 with opposite winding direction. The bottom layer part of a cycle of wire turn 618 on the coil 620 comprises an incoming line 601, a wiring line 614, a through hole 609, a through hole 604 and an outgoing line 606. The bottom layer part of a cycle of wire turn 619 on the coil 621 comprises a through hole 610, a wiring line 615 and a through hole 603.

As shown in FIG. 6A, FIG. 6B and FIG. 6C, the rectangular winding part of a cycle of wire turn 618 on the coil 620 of the closed PCB Rogowski coil 500 is composed of a wiring line 616, a through hole 609, a wiring line 614 and a through hole 604, wherein the wiring line 616 on the top layer of the rectangular winding part and the wiring line 614 on the bottom layer are overlapped in the direction vertical to the surface of PCB. The rectangular winding part of a cycle of wire turn 619 on the other group of coil 621 with opposite winding direction is composed of a wiring line 615, a through hole 610, a wiring line 617 and a through hole 603, wherein the wiring line 615 on the bottom layer of the rectangular winding part and the wiring line 617 on the top layer are overlapped in the direction vertical to the surface of PCB.

As shown in FIG. 6A, FIG. 6B and FIG. 6C, the rectangular winding section directions of a cycle of wire turn 618 and a cycle of wire turn 619 on the first composition unit 600 of the closed PCB Rogowski coil 500 are along the radial direction of the centers of closed PCB Rogowski coil 500 and winding section, or the magnetic line with the centers of various composition units on the closed PCB Rogowski coil 500 is in the normal direction in the center of the winding section.

As shown in FIG. 6A, FIG. 6B and FIG. 6C, the rectangular winding section directions of a cycle of wire turn 618 and a cycle of wire turn 619 on the first composition unit 600 of the closed PCB Rogowski coil 500 are vertical to the radial direction of the centers of closed PCB Rogowski coil 500 and winding section, or the magnetic line with the centers of various composition units on the closed PCB Rogowski coil 500 is in the tangential direction in the center of the winding section.

As shown in FIG. 6A, FIG. 6B and FIG. 6C, the first composition unit of the closed PCB Rogowski coil 500 is provided with an external access point 611, which is connected with the incoming line of the first wire turn on the coil 620 of the first composition unit, and the first composition unit of the closed PCB Rogowski coil 500 is provided with an external access point 612, which is connected with the incoming line of the first wire turn on the other group of coil 621 with opposite winding direction of the first composition unit. The external access points 611 and 612 are taken as two signal output ends of the closed PCB Rogowski coil 500.

As shown in FIG. 6A, FIG. 6B and FIG. 6C, two outgoing lines between the through hole 622 of the coil 620 and the through hole 623 of the other group of coil 621 on the last composition unit 613 of the closed PCB Rogowski coil 500 are directly connected through a wiring line 624 to realize the series connection between two groups of coils 620 and 621 with opposite winding directions on the closed PCB Rogowski coil 500.

(II) Closed Rogowski Coil with Multiple (N≥2) PCBs

The closed Rogowski coil with multiple PCBs capable of resisting interference of external magnetic field comprises two groups of series-connected coils in opposite winding direction, i.e. a first coil and a second coil.

The closed Rogowski coil with multiple PCBs capable of resisting interference of external magnetic field is specifically composed of N PCBs by laminating. The closed Rogowski coil with multiple PCBs is provided with two signal output ends, i.e. the first signal output end and the second signal output end. The PCB with the first and second signal output ends is the $1^{st}$ PCB, the PCB adjacent with the $1^{st}$ PCB is the $2^{nd}$ PCB, if N≥3, the rest can be done in the same manner, it is the $3^{rd}$ PCB till the $N^{th}$ PCB is present.

Four external access points are set from the $1^{st}$ PCB to the $(N-1)^{th}$ PCB, i.e. the first external access point, the second external access point, the third external access point and the fourth external access point, wherein the first external access point and the third external access point are the starting point and the ending point of the first coil from the $1^{st}$ PCB to the $(N-1)^{th}$ PCB, respectively; and the second external access point and the fourth external access point are the starting point and the ending point of the second coil from the $1^{st}$ PCB to the $(N-1)^{th}$ PCB, respectively. The $N^{th}$ PCB is provided with two external access points, i.e. the first external access point and the second external access point, wherein the first external access point is the starting point of the first coil on the $N^{th}$ PCB, and the second external access point is the starting point of the second coil on the $N^{th}$ PCB.

The first external access point on the $1^{st}$ PCB is the first signal output end, and the second external access point on the $1^{st}$ PCB is the second signal output end; The third external access point on the upper one of the adjacent and laminated PCBs is connected with the first external access point on the lower one to realize the series connection between the first coil part on the upper PCB and the first coil part on the lower PCB to form a complete first coil. The fourth external access point on the upper one of the adjacent and laminated PCBs is connected with the second external access point on the lower one to realize the series connection between the second coil part on the upper PCB and the second coil part on the lower PCB to form a complete second coil. The first and second coils are directly connected in series on the $N^{th}$ PCB to form the closed Rogowski coil with multiple PCBs capable of resisting interference of external magnetic field.

Each PCB from the $1^{st}$ PCB to the $N^{th}$ PCB is composed of multiple identical composition units in series connection, each of which comprises the cycles of wire turns of the first coil and the second coil, and the two cycles of wire turns are adjacent closely. That two cycles of wire turns are adjacent closely can be understood as: the minimum space between two cycles of wire turns is equal to the minimum safety space between the PCBs, the minimum safety space between the PCBs is related to the technology of PCB, e.g. the minimum safety space between the PCBs is 6 mil, or 0.1524 mm. One cycle of wire turn on the first coil of each composition unit on each PCB of the closed Rogowski coil with multiple PCBs comprises an incoming line, a winding line and an outgoing line, wherein the incoming line and outgoing line are respectively connected with the wire turns of the first coils on the upper composition unit and the lower composition unit, and the winding line is composed of wirings and through holes among different layers by surrounding. One cycle of wire turn on the second coil of each composition unit on each PCB of the closed Rogowski coil with multiple PCBs comprises an incoming line, a winding line and an outgoing line, wherein the incoming line and outgoing line are respectively connected with the wire turns of the second coils on the upper composition unit and the lower composition unit, and the winding line is composed of wirings and through holes among different layers by surrounding. Specifically, the wiring path on the top layer is overlapped with that on the bottom layer. The section of winding lines composed of the wirings on the top layer and bottom layer and two through holes by surrounding is similar to a rectangle.

The incoming line at one cycle of wire turn on the first coil of the first composition unit from the $1^{st}$ PCB to the $N^{th}$ PCB is connected with the first external access point from the $1^{st}$ PCB to the $N^{th}$ PCB, and the incoming line at one cycle of wire turn on the second coil of the first composition unit from the $1^{st}$ PCB to the $N^{th}$ PCB is connected with the second external access point from the $1^{st}$ PCB to the $N^{th}$ PCB. The outgoing line at one cycle of wire turn on the first coil of the last composition unit from the $1^{st}$ PCB to the $(N-1)^{th}$ PCB is connected with the third external access point from the $1^{st}$ PCB to the $(N-1)^{th}$ PCB, and the outgoing line at one cycle of wire turn on the second coil of the last composition unit from the $1^{st}$ PCB to the $(N-1)^{th}$ PCB is connected with the fourth external access point from the $1^{st}$ PCB to the $(N-1)^{th}$ PCB. The outgoing line at one cycle of wire turn on the first coil of the last composition unit on the $N^{th}$ PCB is directly connected with the outgoing line at one cycle of wire turn on the second coil of the last composition unit on the $N^{th}$ PCB to realize the series connection between the first coil and the second coil on the $N^{th}$ PCB.

For the closed Rogowski coil with multiple PCBs capable of resisting interference of external magnetic field, the section composed of two cycles of wire turns on each composition unit by surrounding is vertical to the surface of PCB, the section composed of the winding lines by surrounding is located on the cross section of PCB, and the wiring paths of the winding lines are overlapped in the direction vertical to the surface of PCB.

For the closed Rogowski coil with multiple PCBs capable of resisting interference of external magnetic field, the centers of the composition units on each PCB are uniformly distributed on a magnetic line of magnetic field for generating current to be measured, the direction of the section surrounded by the winding lines at two cycles of wire turns of all the composition units is close to the normal direction of the magnetic line passing through the section center of the winding line, and the section surrounded by the winding lines at two cycles of wire turns of all the composition units is approximately vertical to the tangential direction (strength direction of the magnetic field) of the magnetic line passing through the section center of the winding line.

In the closed Rogowski coil with multiple PCBs, the PCB is a dual-sided PCB, wherein the first coil and the second coil are located on the upper and lower surfaces of the PCB, so the closed Rogowski coil with multiple PCBs can be called a closed Rogowski coil with multiple dual-sided PCBs.

The closed Rogowski coil with multiple dual-sided PCBs capable of resisting interference of external magnetic field comprises two groups of series-connected coils in opposite winding direction, i.e. a first coil and a second coil.

The closed Rogowski coil with multiple dual-sided PCBs capable of resisting interference of external magnetic field is specifically composed of N dual-sided PCBs by laminating. The closed Rogowski coil with multiple dual-sided PCBs is provided with two signal output ends, i.e. the first signal output end and the second signal output end. The PCB with the first and second signal output ends is the $1^{st}$ PCB, the PCB adjacent with the $1^{st}$ PCB is the $2^{nd}$ PCB, if the rest can be done in the same manner, it is the $3^{rd}$ PCB till the $N^{th}$ PCB is present.

Four external access points are set from the $1^{st}$ PCB to the $(N-1)^{th}$ PCB, i.e. the first external access point, the second external access point, the third external access point and the fourth external access point, wherein the first external access point and the third external access point are the starting point and the ending point of the first coil from the $1^{st}$ PCB to the $(N-1)^{th}$ PCB, respectively; and the second external access point and the fourth external access point are the starting point and the ending point of the second coil from the $1^{st}$ PCB to the $(N-1)^{th}$ PCB, respectively. The $N^{th}$ PCB is provided with two external access points, i.e. the first external access point and the second external access point, wherein the first external access point is the starting point of the first coil on the $N^{th}$ PCB, and the second external access point is the starting point of the second coil on the $N^{th}$ PCB.

The first external access point on the $1^{st}$ PCB is the first signal output end, and the second external access point on the $1^{st}$ PCB is the second signal output end; The third external access point on the upper one of the adjacent and laminated PCBs is connected with the first external access point on the lower one to realize the series connection between the first coil part on the upper PCB and the first coil part on the lower PCB to form a complete first coil. The fourth external access point on the upper one of the adjacent and laminated PCBs is connected with the second external access point on the lower one to realize the series connection between the second coil part on the upper PCB and the second coil part on the lower PCB to form a complete second coil. The first and second coils are directly connected in series on the $N^{th}$ PCB to form the closed Rogowski coil with multiple dual-sided PCBs capable of resisting interference of external magnetic field.

Each dual-sided PCB from the $1^{st}$ PCB to the $N^{th}$ PCB is composed of multiple identical composition units in series connection, each of which comprises the cycles of wire turns of the first coil and the second coil, and the two cycles of wire turns are adjacent closely. That two cycles of wire turns are adjacent closely can be understood as: the minimum space between two cycles of wire turns is equal to the minimum safety space between the PCBs, the minimum safety space between the PCBs is related to the technology of PCB, e.g. the minimum safety space between the PCBs is 6 mil, or 0.1524 mm. One cycle of wire turn on the first coil of each composition unit on each dual-sided PCB of the closed Rogowski coil with multiple dual-sided PCBs comprises an incoming line, a winding line and an outgoing line, wherein the incoming line and outgoing line are respectively connected with the wire turns of the first coils on the upper composition unit and the lower composition unit, and the winding line is composed of wirings and through holes between the top layer and the bottom layer by surrounding. One cycle of wire turn on the second coil of each composition unit on each dual-sided PCB of the closed Rogowski coil with multiple dual-sided PCBs comprises an incoming line, a winding line and an outgoing line, wherein the incoming line and outgoing line are respectively connected with the wire turns of the second coils on the upper composition unit and the lower composition unit, and the winding line is composed of wirings and through holes between the top layer and the bottom layer by surrounding. Specifically, the wiring path on the top layer is overlapped with that on the bottom layer. The section of winding lines composed of the wirings on the top layer and bottom layer and two through holes by surrounding is similar to a rectangle.

The incoming line at one cycle of wire turn on the first coil of the first composition unit from the $1^{st}$ PCB to the $N^{th}$ PCB is connected with the first external access point from the $1^{st}$ PCB to the $N^{th}$ PCB, and the incoming line at one cycle of wire turn on the second coil of the first composition unit from the $1^{st}$ PCB to the $N^{th}$ PCB is connected with the second external access point from the $1^{st}$ PCB to the $N^{th}$ PCB. The outgoing line at one cycle of wire turn on the first coil of the last composition unit from the $1^{st}$ PCB to the $(N-1)^{th}$ PCB is connected with the third external access point from the $1^{st}$ PCB to the $(N-1)^{th}$ PCB, and the outgoing line at one cycle of wire turn on the second coil of the last composition unit from the $1^{st}$ PCB to the $(N-1)^{th}$ PCB is connected with the fourth external access point from the $1^{st}$ PCB to the $(N-1)^{th}$ PCB. The outgoing line at one cycle of wire turn on the first coil of the last composition unit on the $N^{th}$ PCB is directly connected with the outgoing line at one cycle of wire turn on the second coil of the last composition unit on the $N^{th}$ PCB to realize the series connection between the first coil and the second coil on the $N^{th}$ PCB.

For the closed Rogowski coil with multiple dual-sided PCBs capable of resisting interference of external magnetic field, the section composed of two cycles of wire turns on each composition unit by surrounding is vertical to the surface of dual-sided PCB, the section composed of the winding lines by surrounding is located on the cross section of dual-sided PCB, and the wiring paths of the winding lines are overlapped in the direction vertical to the surface of PCB.

For the closed Rogowski coil with multiple dual-sided PCBs capable of resisting interference of external magnetic field, the centers of the composition units on each dual-sided PCB are uniformly distributed on a magnetic line of magnetic field for generating current to be measured, the direction of the section surrounded by the winding lines at two cycles of wire turns of all the composition units is close to the normal direction of the magnetic line passing through the section center of the winding line, and the section surrounded by the winding lines at two cycles of wire turns of all the composition units is approximately vertical to the tangential direction (strength direction of the magnetic field) of the magnetic line passing through the section center of the winding line.

Figure 7A:
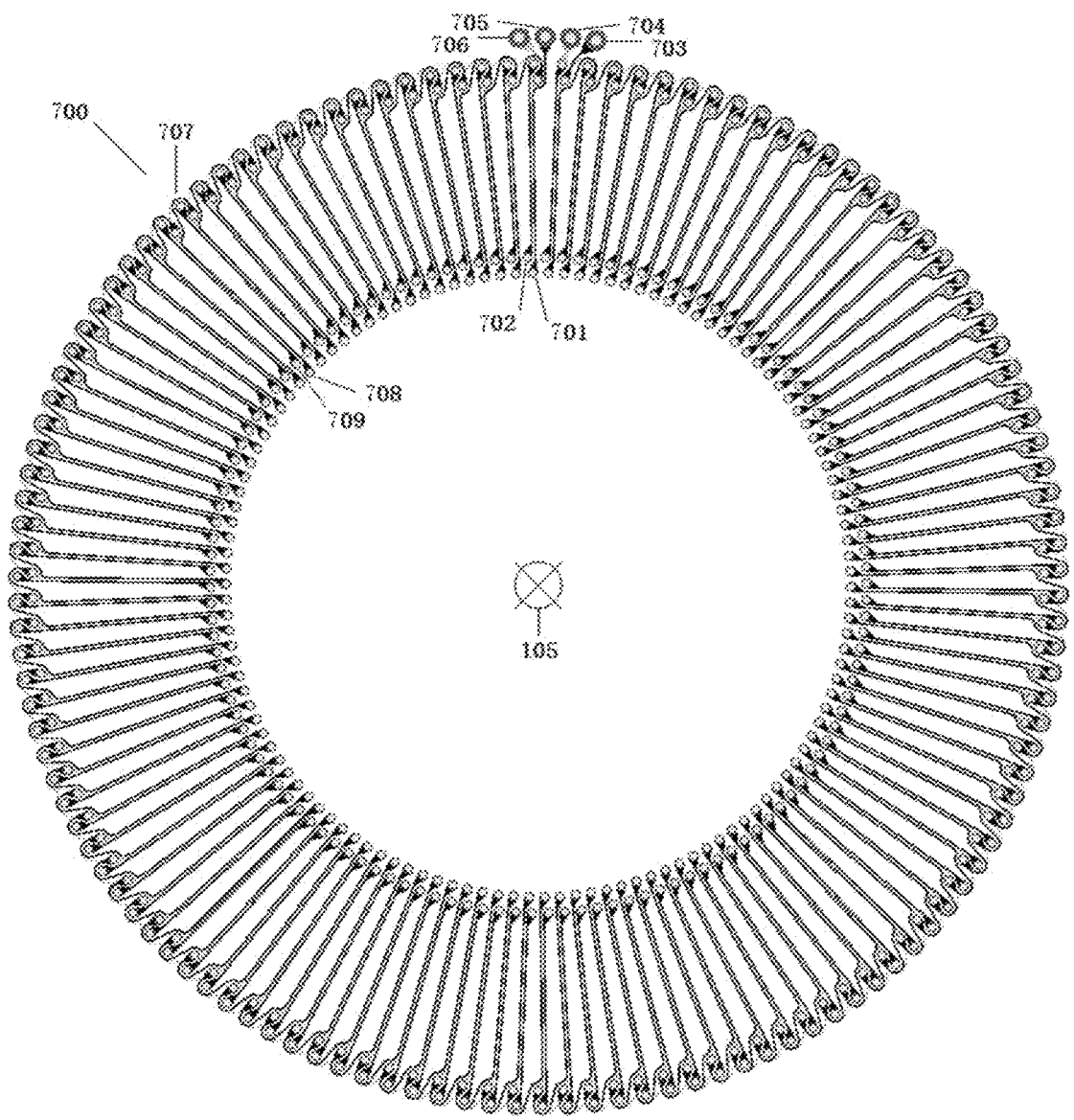
FIG. 7A shows a laminating layer of the top layer and bottom layer of the dual-sided PCBs from the $1^{st}$ piece to the $(N-1)^{th}$ piece in the closed Rogowski coil with N dual-sided PCBs.
Figure 7B:
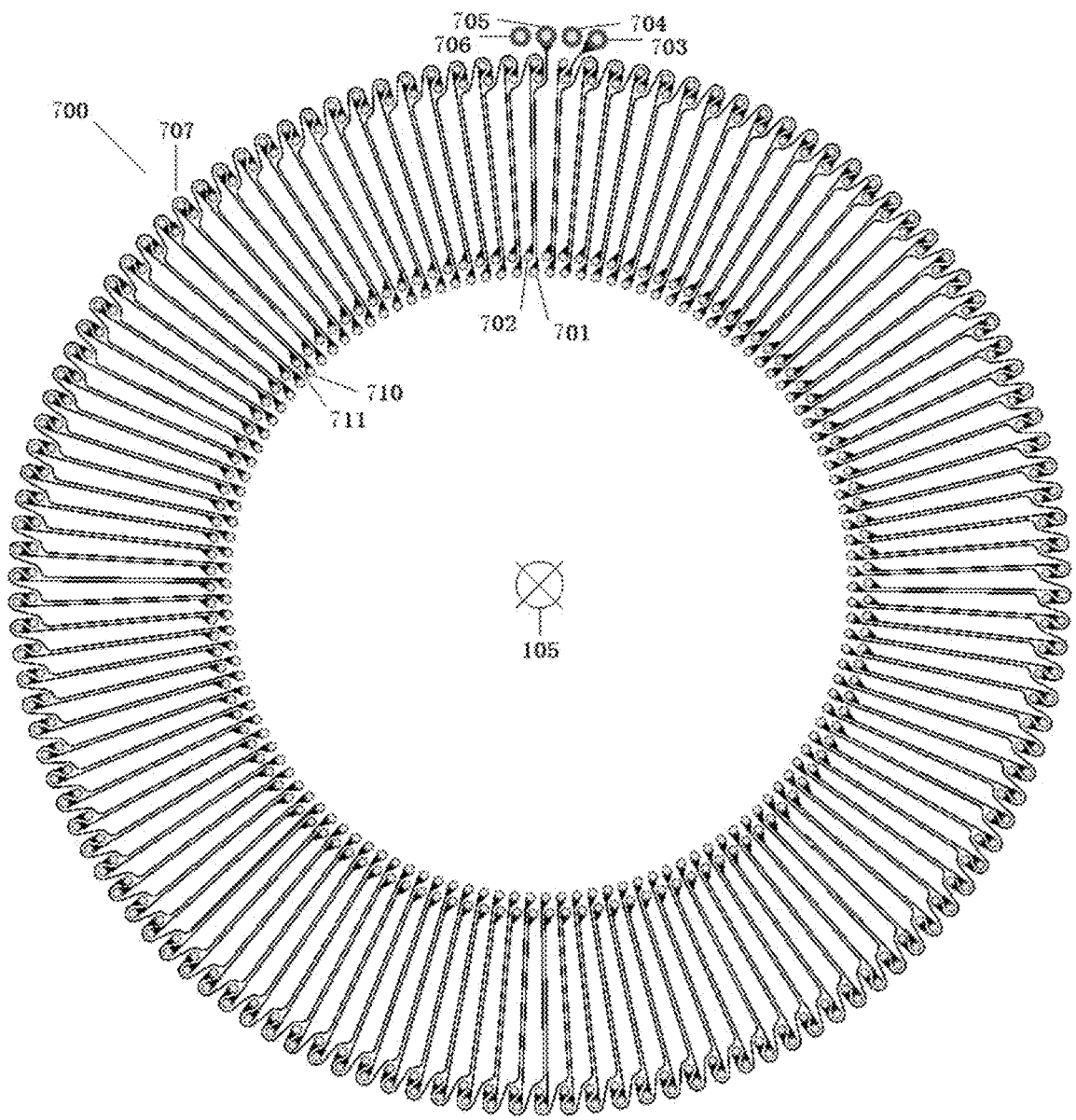
FIG. 7B shows a top layer of dual-sided PCBs from the $1^{st}$ piece to the $(N-1)^{th}$ piece in the closed Rogowski coil with N dual-sided PCBs.
Figure 7C:
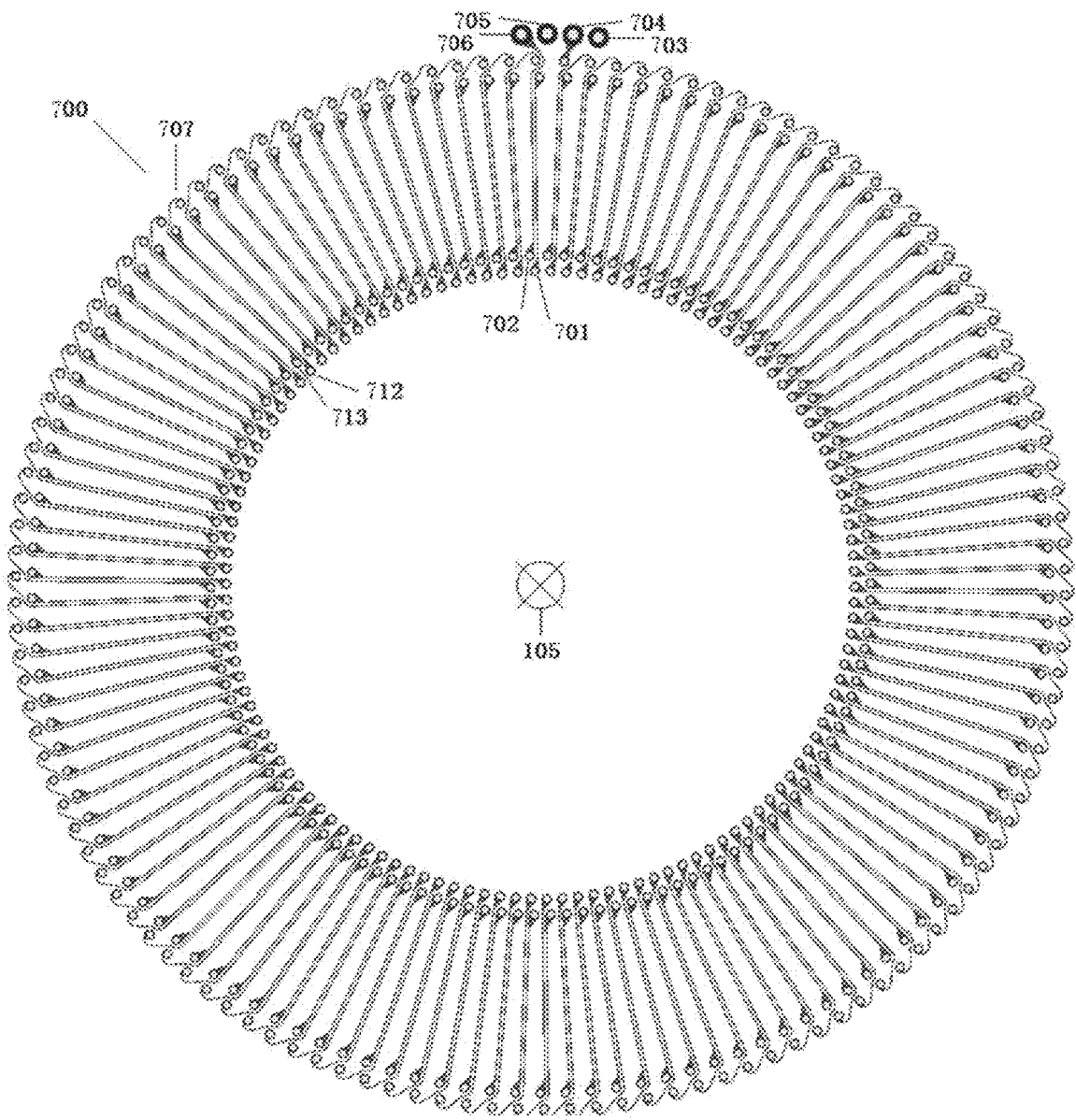
FIG. 7C shows a bottom layer of dual-sided PCBs from the $1^{st}$ piece to the $(N-1)^{th}$ piece in the closed Rogowski coil with N dual-sided PCBs.

FIG. 7 shows dual-sided PCBs from the $1^{st}$ PCB to the $(N-1)^{th}$ PCB in the closed Rogowski coil with N dual-sided PCBs in the embodiment of the disclosure, FIG. 7A shows the laminating layer of the top layer and bottom layer of the dual-sided PCBs from the $1^{st}$ PCB to the $(N-1)^{th}$ PCB in the closed Rogowski coil with N dual-sided PCBs, FIG. 7B shows the top layers of the dual-sided PCBs from the $1^{st}$ PCB to the $(N-1)^{th}$ PCB in the closed Rogowski coil with N dual-sided PCBs, and FIG. 7C shows bottom layers of the dual-sided PCBs from the $1^{st}$ PCB to the $(N-1)^{th}$ PCB in the closed Rogowski coil with N dual-sided PCBs.

The coil 700 on the dual-sided PCBs from the $1^{st}$ PCB to the $(N-1)^{th}$ PCB in the closed Rogowski coil with N dual-sided PCBs comprises two groups of coils 701 and 702 with opposite winding directions, which represent one part of the first coil and second coil on the closed Rogowski coil with N dual-sided PCBs, respectively.

The coil 700 is provided with four external access points, i.e. 703, 704, 705, 706. The external access point 703 is taken as the starting point of the coil 701, the external access point 705 is taken as the ending point of the coil 701, the external access point 704 is taken as the starting point of the coil 702, and the external access point 706 is taken as the ending point of the coil 702.

The external access points 703 and 704 are also taken as the signal output ends of the closed Rogowski coil with N dual-sided PCBs at the same time. The external access point 707 is connected with the first coil part on the lower dual-sided PCB, and the external access point 706 is connected with the second coil part thereon.

The coil 700 is composed of multiple identical composition units in series connection, and FIG. 7A shows a composition unit 707. As shown in FIG. 7A, FIG. 7B and FIG. 7C, the center of composition unit 707 and the centers of other composition units are located on a circular magnetic line generated by the current flowing on the current-carrying conductor 105, and various composition units are uniformly distributed on the circular magnetic line.

Each composition unit comprises one cycle of wire turn of two groups of coils with opposite winding directions. The composition unit 707 comprises a cycle of wire turn 708 on the coil 701 and a cycle of wire turn 709 on the coil 702, and the two cycles of wire turns are adjacent closely. FIG. 7B shows a top layer part 710 of the wire turn 708 and a top layer part 711 of the wire turn 709 on the composition unit 707. The top layer part 710 of the wire turn 708 is adjacent with the top layer part 711 of the wire turn 709 closely, FIG. 7C shows a bottom layer part 712 of the wire turn 708 and a bottom layer part 713 of the wire turn 709 on the composition unit 707. The bottom layer part 712 of the wire turn 708 is adjacent with the bottom layer part 713 of the wire turn 709 closely.

Figure 8A:
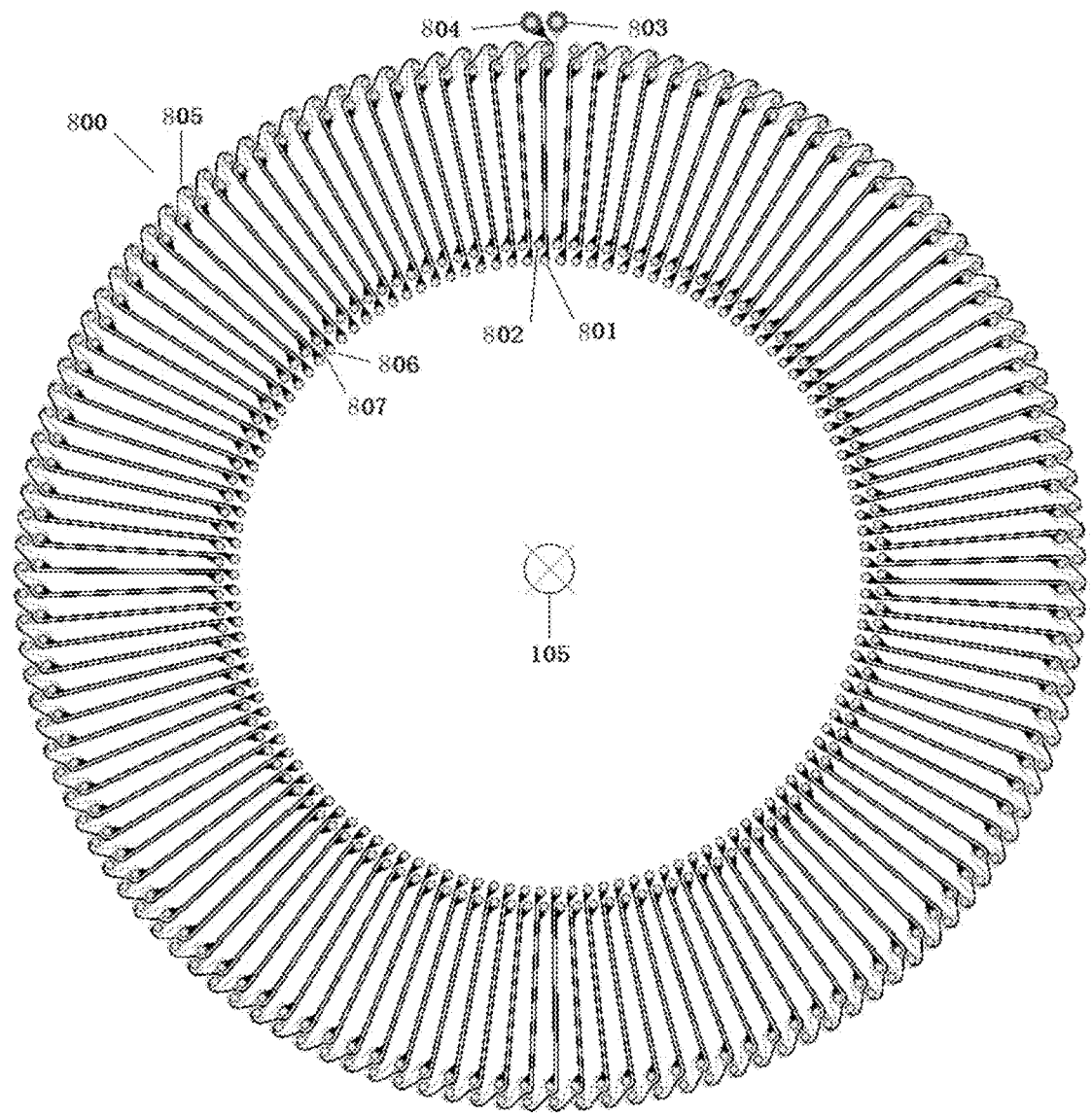
FIG. 8A shows a laminating layer of the top layer and bottom layer of the $N^{th}$ dual-sided PCB among N closed Rogowski coils with dual-sided PCB.
Figure 8B:
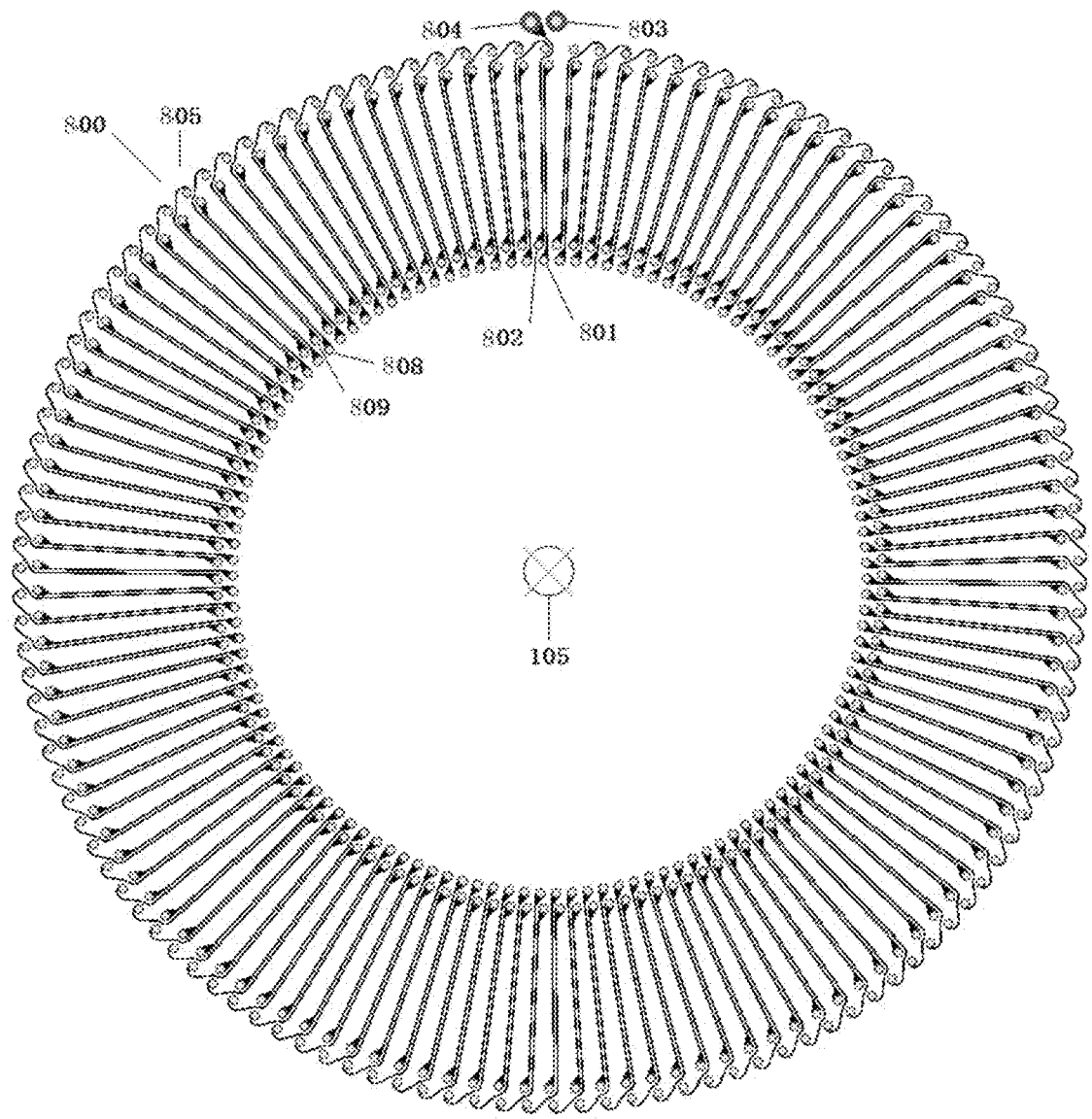
FIG. 8B shows a top layer of the $N^{th}$ dual-sided PCB in the closed Rogowski coil with N dual-sided PCBs.
Figure 8C:
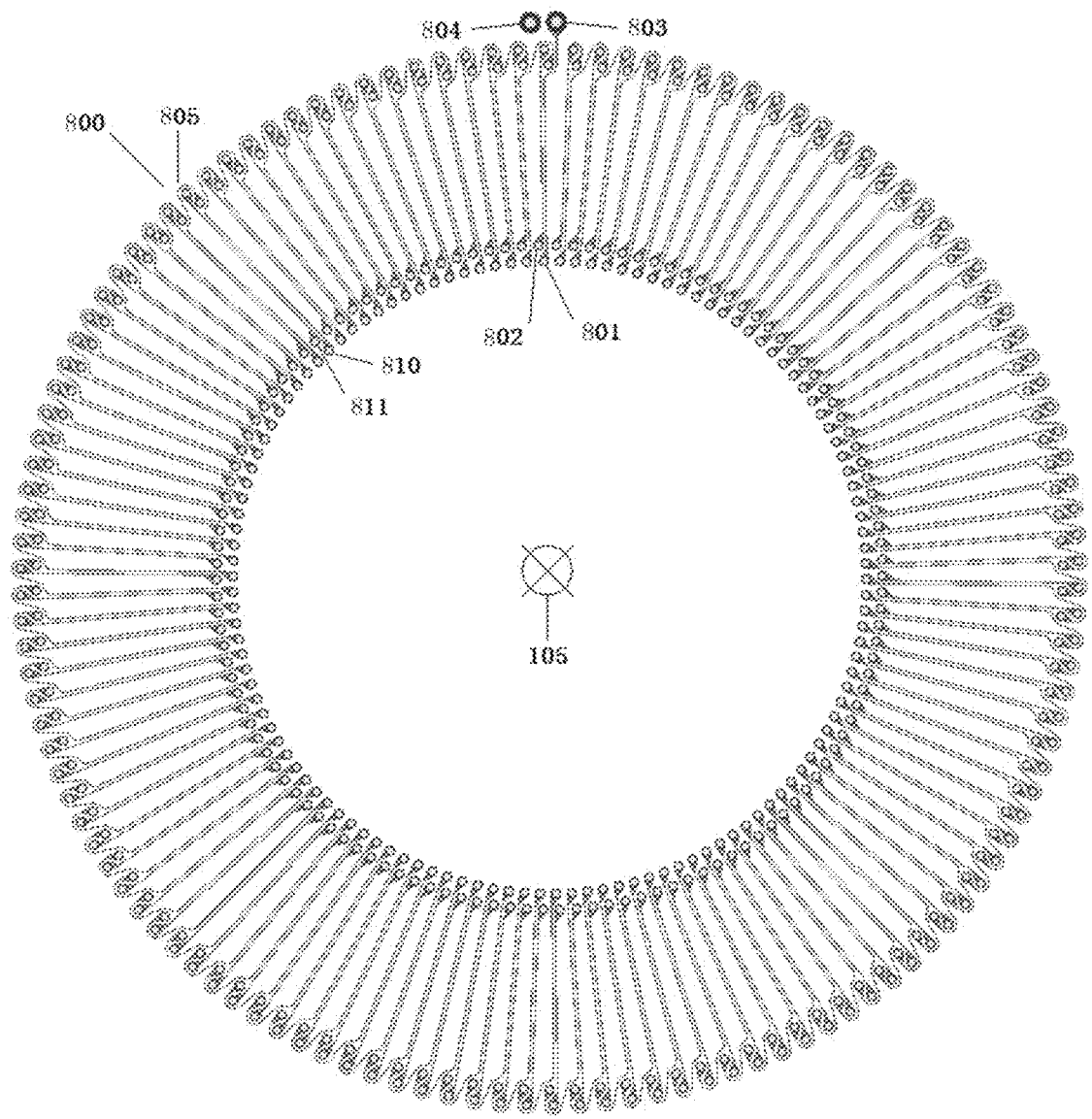
FIG. 8C shows a bottom layer of the $N^{th}$ dual-sided PCB in the closed Rogowski coil with N dual-sided PCBs.

FIG. 8 shows the $N^{th}$ dual-sided PCB in the closed Rogowski coil with N dual-sided PCBs according to the specific embodiment of the disclosure, FIG. 8A shows the laminating layer of the top layer and bottom layer of the $N^{th}$ dual-sided PCB in the closed Rogowski coil with N dual-sided PCBs, FIG. 8B shows the top layer of the $N^{th}$ dual-sided PCB in the closed Rogowski coil with N dual-sided PCBs, and FIG. 8C shows bottom layer of the $N^{th}$ dual-sided PCB in the closed Rogowski coil with N dual-sided PCBs.

The coil 800 on the $N^{th}$ dual-sided PCB in the closed Rogowski coil with N dual-sided PCBs comprises two groups of coils 801 and 802 with opposite winding directions, which represent one part of the first coil and second coil on the closed Rogowski coil with N dual-sided PCBs, respectively.

The coil 800 is provided with two external access points, i.e. 803, 804. The external access point 803 is taken as the starting point of the coil 801, and the external access point 804 is taken as the starting point of the coil 802. The external access point 803 is connected with the first coil part on the upper dual-sided PCB, and the external access point 804 is connected with the second coil part thereon.

The coil 800 is composed of multiple identical composition units in series connection, and FIG. 8A shows a composition unit 807. As shown in FIG. 8A, FIG. 8B and FIG. 8C, the center of composition unit 807 and the centers of other composition units are located on a circular magnetic line generated by the current flowing on the current-carrying conductor 105, and various composition units are uniformly distributed on the circular magnetic line.

Each composition unit comprises one cycle of wire turn of two groups of coils with opposite winding directions. The composition unit 807 comprises a cycle of wire turn 806 on the coil 801 and a cycle of wire turn 807 on the coil 802, and the two cycles of wire turns are adjacent closely. FIG. 8B shows a top layer part 808 of the wire turn 806 and a top layer part 809 of the wire turn 807 on the composition unit 807. The top layer part 808 of the wire turn 808 is adjacent with the top layer part 809 of the wire turn 807 closely, FIG. 8C shows a bottom layer part 810 of the wire turn 806 and a bottom layer part 811 of the wire turn 807 on the composition unit 807. The bottom layer part 810 of the wire turn 806 is adjacent with the bottom layer part 811 of the wire turn 807 closely.

FIG. 7 shows that the closed Rogowski coil with N dual-sided PCBs laminated can be formed by means of series connection for the coils 700 and 800 on the dual-sided PCB. FIG. 7 shows that the external access point 705 of the coil 700 on the dual-sided PCBs is connected with the external access point 803 on the first coil part of the coil 800 on the dual-sided PCBs, the external access point 706 is connected with the external access point 804 on the second coil part of the dual-sided PCBs, and the external access points 703 and 704 are taken as the signal output ends of the closed Rogowski coil.

Figure 9A:
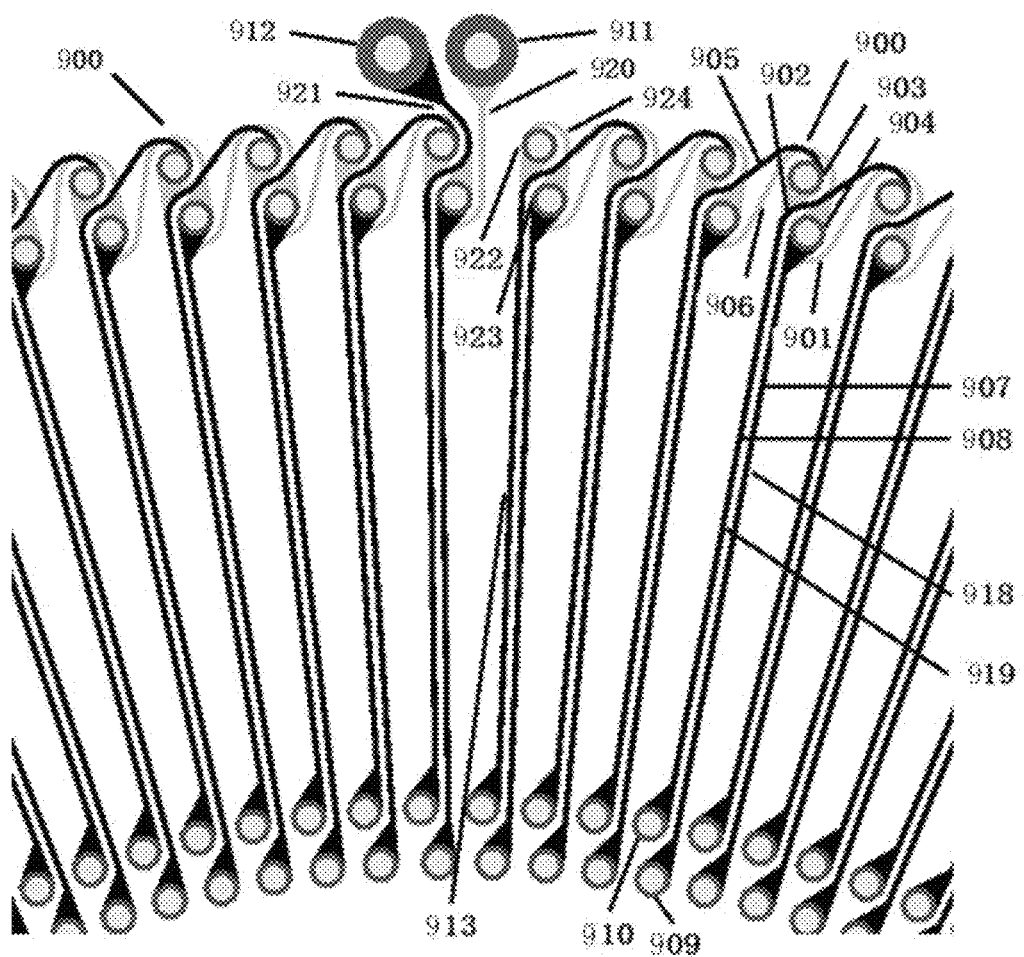
FIG. 9A shows a laminating layer of local top layer and bottom layer of the $N^{th}$ dual-sided PCB in the closed Rogowski coil with N dual-sided PCBs.
Figure 9B:
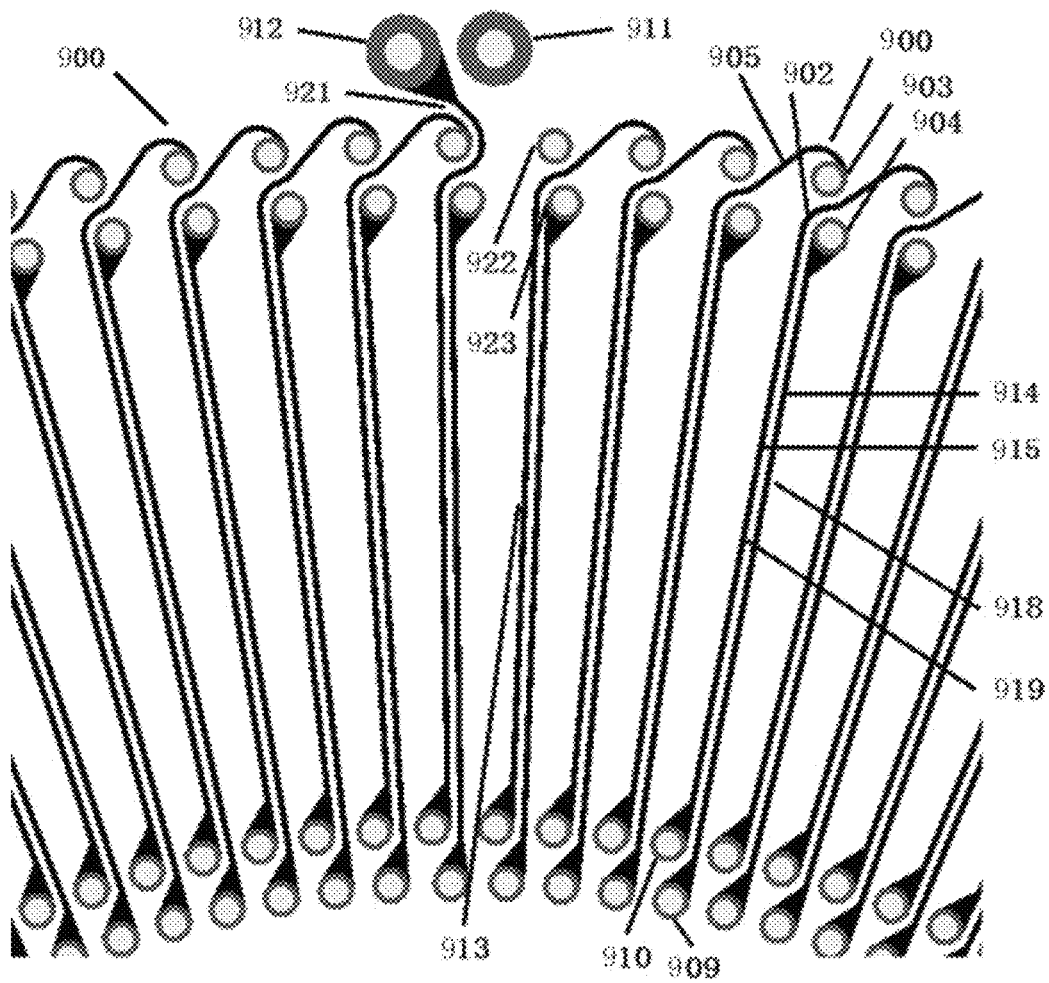
FIG. 9B shows a local top layer of the $N^{th}$ dual-sided PCB in the closed Rogowski coil with N dual-sided PCBs.
Figure 9C:
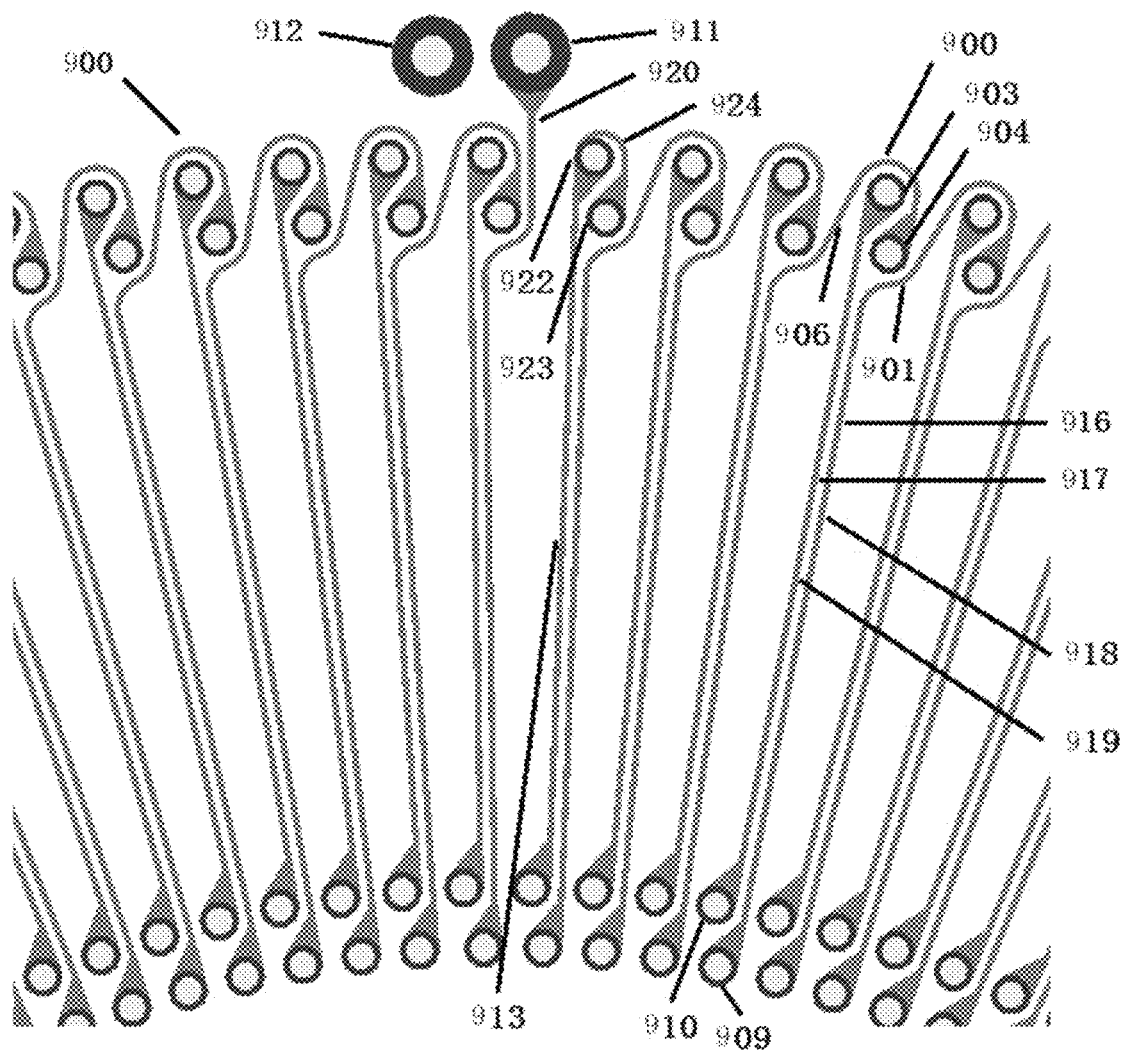
FIG. 9C shows a local bottom layer of the $N^{th}$ dual-sided PCB in the closed Rogowski coil with N dual-sided PCBs.

FIG. 9 shows local details of the coil 900 on the $N^{th}$ PCB in the closed Rogowski coil with N dual-sided PCBs. FIG. 9A shows a laminating layer on the local top layer and bottom layer of the closed Rogowski coil with single dual-sided PCB 900, FIG. 9B shows a local top layer of the closed Rogowski coil with single dual-sided PCB 900, and FIG. 9C shows a local bottom layer of the closed Rogowski coil with single dual-sided PCB 900.

The laminating layer on the top layer and bottom layer of a composition unit 900 on the N dual-sized PCBs, as shown in FIG. 9A, comprises a laminating layer part of a cycle of wire turn 918 on the coil 920 and a laminating layer part of a cycle of wire turn 919 on the other group of coil 921 with opposite winding direction. The laminating layer part of a cycle of wire turn 918 on the coil 920 comprises an incoming line 901, a wiring line 907, a through hole 909, a through hole 904 and an outgoing line 906. The laminating layer part of a cycle of wire turn 919 on the coil 921 comprises an incoming line 902, a wiring line 908, a through hole 910, a through hole 903 and an outgoing line 905.

The top layer of a composition unit 900 on the closed PCB Rogowski coil 900, as shown in FIG. 9B, comprises a top layer part of a cycle of wire turn 918 on the coil 920 and a top layer part of a cycle of wire turn 919 on the other group of coil 921 with opposite winding direction. The top layer part of a cycle of wire turn 918 on the coil 920 comprises a through hole 909, a wiring line 914 and a through hole 904. The top layer part of a cycle of wire turn 919 on the coil 921 comprises an incoming line 902, a wiring line 915, a through hole 910, a through hole 903 and an outgoing line 905.

The bottom layer of a composition unit 900 on the closed PCB Rogowski coil 900, as shown in FIG. 9C, comprises a bottom layer part of a cycle of wire turn 918 on the coil 920 and a bottom layer part of a cycle of wire turn 919 on the other group of coil 921 with opposite winding direction. The bottom layer part of a cycle of wire turn 918 on the coil 920 comprises an incoming line 901, a wiring line 916, a through hole 909, a through hole 904 and an outgoing line 906. The bottom layer part of a cycle of wire turn 919 on the coil 921 comprises a through hole 910, a wiring line 917 and a through hole 903.

As shown in FIG. 9A, FIG. 9B and FIG. 9C, the rectangular winding part of a cycle of wire turn 918 on the coil 920 of the closed PCB Rogowski coil 900 is composed of a wiring line 914, a through hole 909, a wiring line 916 and a through hole 904, wherein the wiring line 914 on the top layer of the rectangular winding part and the wiring line 916 on the bottom layer are overlapped in the direction vertical to the surface of PCB. The rectangular winding part of a cycle of wire turn 919 on the other group of coil 921 with opposite winding direction is composed of a wiring line 917, a through hole 910, a wiring line 915 and a through hole 903, wherein the wiring line 917 on the bottom layer of the rectangular winding part and the wiring line 915 on the top layer are overlapped in the direction vertical to the surface of PCB.

As shown in FIG. 9A, FIG. 9B and FIG. 9C, the rectangular winding section directions of a cycle of wire turn 918 and a cycle of wire turn 919 on the composition unit 900 of the closed PCB Rogowski coil 900 are along the radial direction of the centers of closed PCB Rogowski coil 900 and winding section, or the magnetic line with the centers of various composition units on the closed PCB Rogowski coil 900 is in the normal direction in the center of the winding section.

As shown in FIG. 9A, FIG. 9B and FIG. 9C, the rectangular winding section directions of a cycle of wire turn 918 and a cycle of wire turn 919 on the composition unit 900 of the closed PCB Rogowski coil 900 are vertical to the radial direction of the centers of closed PCB Rogowski coil 900 and winding section, or the magnetic line with the centers of various composition units on the closed PCB Rogowski coil 900 is in the tangential direction in the center of the winding section.

As shown in FIG. 9A, FIG. 9B and FIG. 9C, the first composition unit of the closed PCB Rogowski coil 900 is provided with an external access point 911, which is connected with the incoming line of the first wire turn on the coil 920 of the first composition unit, and the first composition unit of the closed PCB Rogowski coil 900 is provided with an external access point 912, which is connected with the incoming line of the first wire turn on the other group of coil 921 with opposite winding direction of the first composition unit. The external access point 911 is connected with the first coil part on the upper dual-sided PCB, and the external access point 912 is connected with the second coil part, thereon.

As shown in FIG. 9A, FIG. 9B and FIG. 9C, two outgoing lines between the through hole 922 of the coil 920 and the through hole 923 of the other group of coil 921 on the last composition unit 913 of the closed PCB Rogowski coil 900 are directly connected through a wiring line 924 to realize the series connection between two groups of coils 920 and 921 with opposite winding directions on the closed PCB Rogowski coil 900.

(III) Opened Rogowski Coil with Two PCBs

The opened Rogowski coil with two PCBs capable of resisting interference of external magnetic field comprises two groups of series-connected coils in opposite winding direction, i.e. a first coil and a second coil, and each PCB is provided with one part of the first coil and the second coil.

The opened Rogowski coil with two PCBs capable of resisting interference of external magnetic field specifically comprises two PCBs, each of which is provided with two external access points, i.e. the first external access point and the second external access point. The first external access point on each PCB is the starting point of the first coil thereon and the second external access point is the ending point of the second coil thereon.

Two connection modes are provided for two PCBs: the first external access points of two PCBs are connected directly, the second external access points of two PCBs are taken as two signal output ends of the opened Rogowski coil with two PCBs, i.e. the first signal output end and the second signal output end; the second external access points of two PCBs are connected directly, the first access points of two PCBs are taken as two signal output ends of the opened Rogowski coil with two PCBs, i.e. the first signal output end and the second signal output end. The PCB with the first signal output end is the $1^{st}$ PCB, and the PCB with the second signal output end is the $2^{nd}$ PCB.

Each one of the $1^{st}$ PCB and the $2^{nd}$ PCB is composed of multiple identical composition units in series connection, each of which comprises the cycles of wire turns of the first coil and the second coil, and the two cycles of wire turns are adjacent closely. That two cycles of wire turns are adjacent closely can be understood as: the minimum space between two cycles of wire turns is equal to the minimum safety space between the PCBs, the minimum safety space between the PCBs is related to the technology of PCB, e.g. the minimum safety space between the PCBs is 6 mil, or 0.1524 mm. One cycle of wire turn on the first coil of each composition unit on each PCB of the opened Rogowski coil with two PCBs comprises an incoming line, a winding line and an outgoing line, wherein the incoming line and outgoing line are respectively connected with the wire turns of the first coils on the upper composition unit and the lower composition unit, and the winding line is composed of wirings and through holes among different layers by surrounding. One cycle of wire turn on the second coil of each composition unit on each PCB of the opened Rogowski coil with two PCBs comprises an incoming line, a winding line and an outgoing line, wherein the incoming line and outgoing line are respectively connected with the wire turns of the second coils on the upper composition unit and the lower composition unit, and the winding line is composed of wirings and through holes among different layers by surrounding. Specifically, the wiring path on the top layer is overlapped with that on the bottom layer. The section of winding lines composed of the wirings on the top layer and bottom layer and two through holes by surrounding is similar to a rectangle.

The incoming line at one cycle of wire turn on the first coil of the first composition unit on the $1^{st}$ PCB is connected with the first external access point on the $1^{st}$ PCB, and the incoming line at one cycle of wire turn on the second coil of the first composition unit on the $1^{st}$ PCB is connected with the second external access point on the $1^{st}$ PCB. The incoming line at one cycle of wire turn on the first coil of the first composition unit on the $1^{st}$ PCB is connected with the first external access point on the $1^{st}$ PCB, and the incoming line at one cycle of wire turn on the second coil of the first composition unit on the $1^{st}$ PCB is connected with the second external access point on the $1^{st}$ PCB.

The outgoing line at one cycle of wire turn on the first coil of the last composition unit on the $1^{st}$ PCB is directly connected with the outgoing line at one cycle of wire turn on the second coil of the last composition unit on the $1^{st}$ PCB to realize the series connection between the first coil and the second coil on the $1^{st}$ PCB. The outgoing line at one cycle of wire turn on the first coil of the last composition unit on the $2^{nd}$ PCB is directly connected with the outgoing line at one cycle of wire turn on the second coil of the last composition unit on the $2^{nd}$ PCB to realize the series connection between the first coil and the second coil on the $2^{nd}$ PCB.

For the opened Rogowski coil with two PCBs capable of resisting interference of external magnetic field, the section composed of two cycles of wire turns on each composition unit by surrounding is vertical to the surface of PCB, the section composed of the winding lines by surrounding is located on the cross section of PCB, and the wiring paths of the winding lines are overlapped in the direction vertical to the surface of PCB.

For the opened Rogowski coil with two PCBs capable of resisting interference of external magnetic field, the centers of the composition units on each PCB are uniformly distributed on a magnetic line of magnetic field for generating current to be measured, the direction of the section surrounded by the winding lines at two cycles of wire turns of all the composition units is close to the normal direction of the magnetic line passing through the section center of the winding line, and the section surrounded by the winding lines at two cycles of wire turns of all the composition units is approximately vertical to the tangential direction (strength direction of the magnetic field) of the magnetic line passing through the section center of the winding line.

In the opened Rogowski coil with two PCBs, the PCB is a dual-sided PCB, wherein the first coil and the second coil are located on the upper and lower surfaces of the PCB, so the opened Rogowski coil with two PCBs can be called an opened Rogowski coil with two dual-sided PCBs.

The opened Rogowski coil with two dual-sized PCBs capable of resisting interference of external magnetic field comprises two groups of series-connected coils in opposite winding direction, i.e. a first coil and a second coil, and each dual-sized PCB is provided with one part of the first coil and the second coil.

The opened Rogowski coil with two PCBs capable of resisting interference of external magnetic field specifically comprises two dual-sized PCBs, each of which is provided with two external access points, i.e. the first external access point and the second external access point. The first external access point on each dual-sized PCB is the starting point of the first coil thereon and the second external access point is the ending point of the second coil thereon.

Two connection modes are provided for two PCBs: the first external access points of two PCBs are connected directly, the second external access points of two PCBs are taken as two signal output ends of the opened Rogowski coil with two PCBs, i.e. the first signal output end and the second signal output end; the second external access points of two PCBs are connected directly, the first access points of two PCBs are taken as two signal output ends of the opened Rogowski coil with two PCBs, i.e. the first signal output end and the second signal output end. The PCB with the first signal output end is the $1^{st}$ PCB, and the PCB with the second signal output end is the $2^{nd}$ PCB.

Each dual-sided one of the $1^{st}$ PCB and the $2^{nd}$ PCB is composed of multiple identical composition units in series connection, each of which comprises the cycles of wire turns of the first coil and the second coil, and the two cycles of wire turns are adjacent closely. That two cycles of wire turns are adjacent closely can be understood as: the minimum space between two cycles of wire turns is equal to the minimum safety space between the PCBs, the minimum safety space between the PCBs is related to the technology of PCB, e.g. the minimum safety space between the PCBs is 6 mil, or 0.1524 mm.

One cycle of wire turn on the first coil of each composition unit on each dual-sided PCB of the opened Rogowski coil with two dual-sided PCBs comprises an incoming line, a winding line and an outgoing line, wherein the incoming line and outgoing line are respectively connected with the wire turns of the first coils on the upper composition unit and the lower composition unit, and the winding line is composed of wirings and through holes between the top layer and the bottom layer by surrounding. One cycle of wire turn on the second coil of each composition unit on each dual-sided PCB of the opened Rogowski coil with two dual-sided PCBs comprises an incoming line, a winding line and an outgoing line, wherein the incoming line and outgoing line are respectively connected with the wire turns of the second coils on the upper composition unit and the lower composition unit, and the winding line is composed of wirings and through holes between the top layer and the bottom layer by surrounding. Specifically, the wiring path on the top layer is overlapped with that on the bottom layer. The section of winding lines composed of the wirings on the top layer and bottom layer and two through holes by surrounding is similar to a rectangle.

The incoming line at one cycle of wire turn on the first coil of the first composition unit on the $1^{st}$ PCB is connected with the first external access point on the $1^{st}$ PCB, and the incoming line at one cycle of wire turn on the second coil of the first composition unit on the $1^{st}$ PCB is connected with the second external access point on the $1^{st}$ PCB. The incoming line at one cycle of wire turn on the first coil of the first composition unit on the $2^{nd}$ PCB is connected with the first external access point on the $2^{nd}$ PCB, and the incoming line at one cycle of wire turn on the second coil of the first composition unit on the $2^{nd}$ PCB is connected with the second external access point on the $2^{nd}$ PCB.

The outgoing line at one cycle of wire turn on the first coil of the last composition unit on the $1^{st}$ PCB is directly connected with the outgoing line at one cycle of wire turn on the second coil of the last composition unit on the $1^{st}$ PCB to realize the series connection between the first coil and the second coil on the $1^{st}$ PCB. The outgoing line at one cycle of wire turn on the first coil of the last composition unit on the $2^{nd}$ PCB is directly connected with the outgoing line at one cycle of wire turn on the second coil of the last composition unit on the $2^{nd}$ PCB to realize the series connection between the first coil and the second coil on the $2^{nd}$ PCB.

For the opened Rogowski coil with two dual-sided PCBs capable of resisting interference of external magnetic field, the section composed of two cycles of wire turns on each composition unit by surrounding is vertical to the surface of dual-sided PCB, the section composed of the winding lines by surrounding is located on the cross section of dual-sided PCB, and the wiring paths of the winding lines are overlapped in the direction vertical to the surface of PCB.

For the opened Rogowski coil with two dual-sized PCBs capable of resisting interference of external magnetic field, the centers of the composition units on each dual-sized PCB are uniformly distributed on a magnetic line of magnetic field for generating current to be measured, the direction of the section surrounded by the winding lines at two cycles of wire turns of all the composition units is close to the normal direction of the magnetic line passing through the section center of the winding line, and the section surrounded by the winding lines at two cycles of wire turns of all the composition units is approximately vertical to the tangential direction (strength direction of the magnetic field) of the magnetic line passing through the section center of the winding line.

Figure 10A:
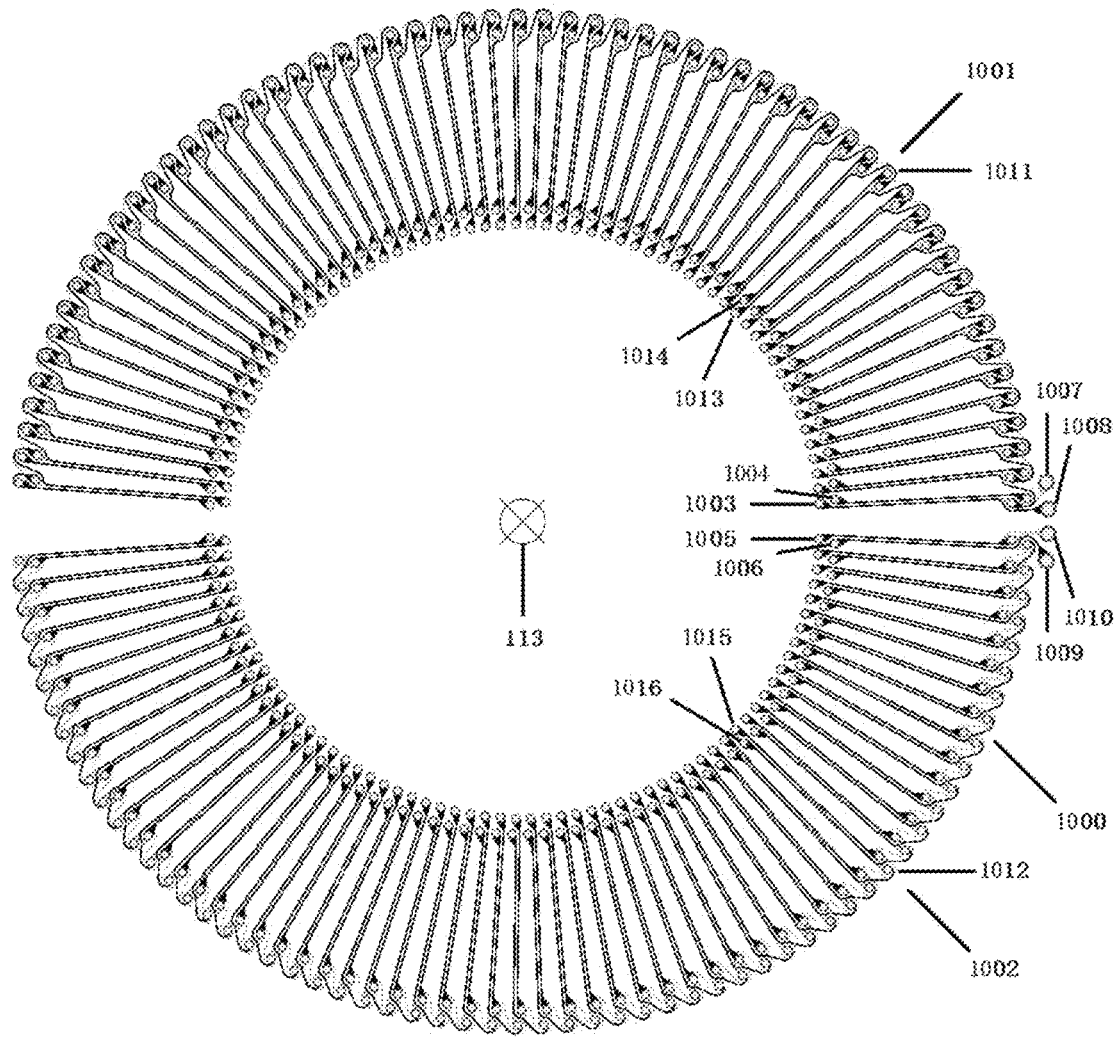
FIG. 10A shows a laminating layer of the top layer and bottom layer in the opened Rogowski coil with two dual-sided PCB.
Figure 10B:
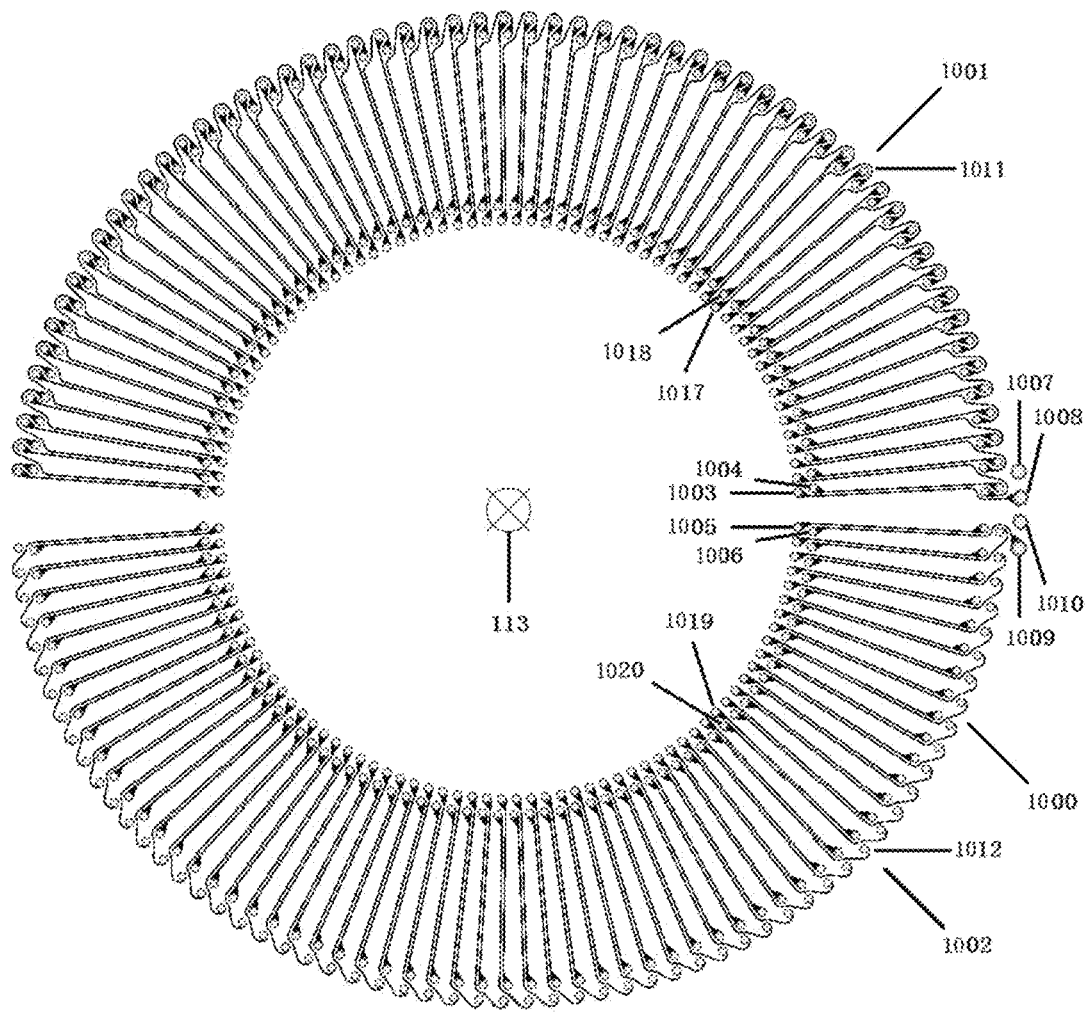
FIG. 10B shows a top layer of the opened Rogowski coil with two dual-sided PCBs.

FIG. 10 shows a specific embodiment of the disclosure, or an opened Rogowski coil with two dual-sided PCBs 1000 capable of resisting interference of external magnetic field, which is suitable, for measuring the current flowing on a current-carrying conductor 113 vertically passing through the center of opened PCB Rogowski coil 1000, and the magnetic line of AC magnetic field generated by the current is a circle of taking the center of opened PCB Rogowski coil 1000 as the center of a circle. FIG. 10A shows a laminating layer on the top layer and bottom layer of the opened Rogowski coil with two dual-sided PCBs, FIG. 10B shows a top layer of the opened Rogowski coil with two dual-sided PCBs, and FIG. 10O shows a bottom layer of the opened Rogowski coil with two dual-sided PCBs.

The opened Rogowski coil with two dual-sided PCBs 1000 comprises two halves of dual-sided PCB Rogowski coils, i.e. the coil 1001 and the coil 1002. The coil 1001 comprises two groups of coils with opposite winding directions, i.e. the coil 1003 and the coil 1004, both of which form a half dual-sided PCB Rogowski coil 1001. The coil 1002 comprises two groups of coils with opposite winding directions, i.e. the coil 1005 and the coil 1006, both of which form a half dual-sided PCB Rogowski coil 1002.

The coil 1000 is provided with four external access points, i.e. 1007, 1008, 1009, 1010. The external access point 1008 is taken as the starting point of the coil 1003, and the external access point 1007 is taken as the ending point of the coil 1004. The external access point 1010 is taken as the starting point of the coil 1005, and the external access point 1009 is taken as the ending point of the coil 1006.

Figure 10C:
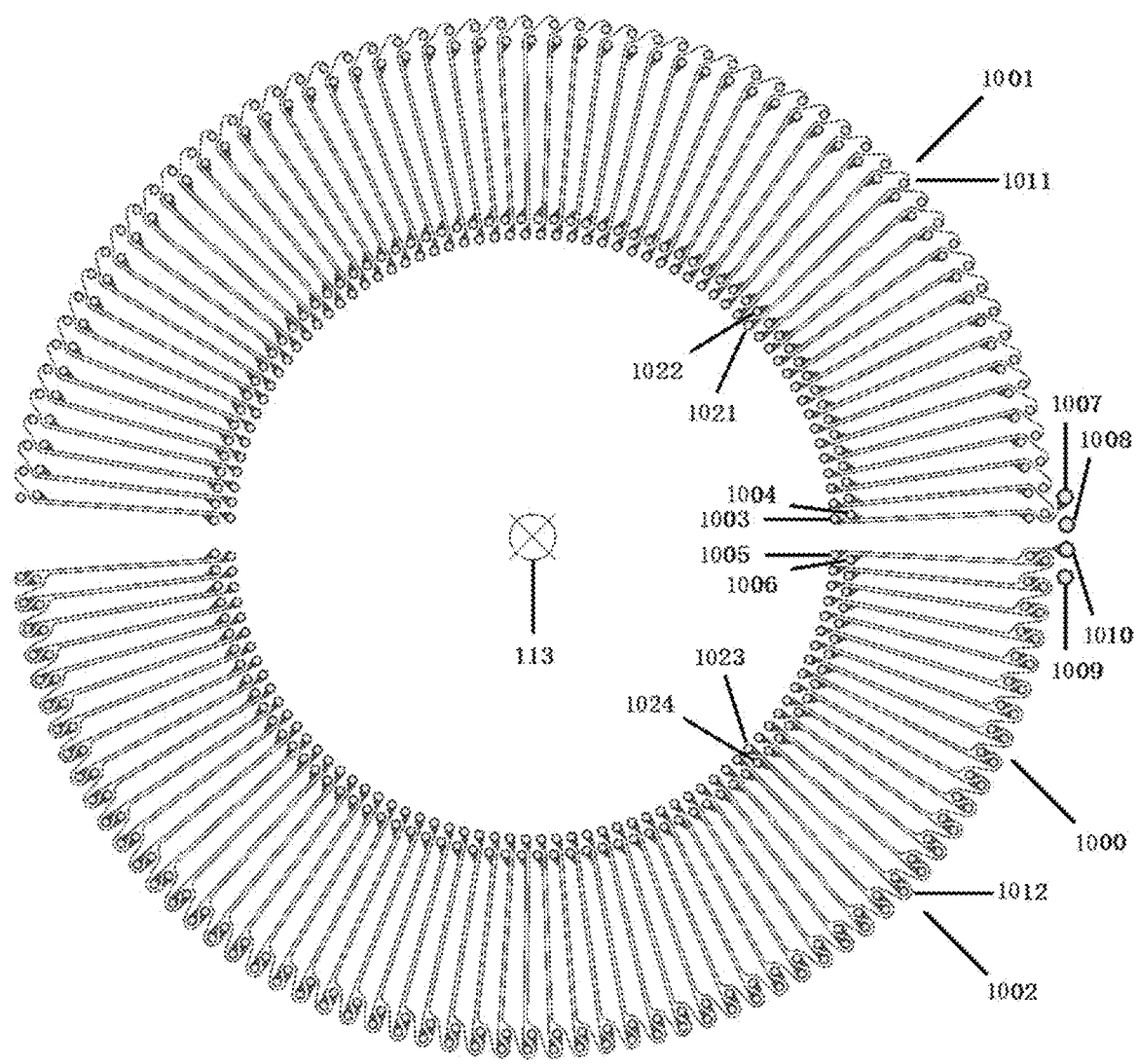
FIG. 10C shows a bottom layer of the opened Rogowski coil with two dual-sided PCBs.

The coils 1001 and 1002 can be used for forming the opened Rogowski coil with two dual-sided PCBs in two ways as follows:

The external access point 1007 and the external access point 1009 are taken as the signal output ends of the opened Rogowski coil with two dual-sided PCBs, and the external access point 1008 is directly connected with the external access point 1010 for connecting the coils 1001 and 1002;

The external access point 1008 and the external access point 1010 are taken as the signal output ends of the opened Rogowski coil with two dual-sided PCBs, and the external access point 1007 is directly connected with the external access point 1009 for connecting the coils 1001 and 1002;

Half a coil 1001 of the opened dual-sided PCB Rogowski coil is composed of multiple identical composition units in series connection, and FIG. 10A shows a composition unit 1011. As shown in FIG. 10A, FIG. 10B and FIG. 10C, the center of composition unit 1011 and the centers of other composition units are located on a circular magnetic line generated by the current flowing on the current-carrying conductor 113, and various composition units are uniformly distributed on the circular magnetic line.

Each composition unit on half a coil 1001 of the opened dual-sided PCB Rogowski coil 1000 comprises two groups of coils with opposite winding directions: respective one cycle of wire turn of the coils 1003 and 1004; the composition unit 1011 comprises a cycle of wire turn 1013 of the coil 1003 and a cycle of wire turn 1014 of the coil 1004, and the two cycles of wire turns are adjacent closely. FIG. 10B shows a top layer part 1017 of the wire turn 1013 and a top layer part 1018 of the wire turn 1014 on the composition unit 1011. The top layer part 1017 of the wire turn 1013 is adjacent with the top layer part 1018 of the wire turn 1014 closely, FIG. 10C shows a bottom layer part 1021 of the wire turn 1013 and a bottom layer part 1022 of the wire turn 1014 on the composition unit 1011. The bottom layer part 1021 of the wire turn 1013 is adjacent with the bottom layer part 1022 of the wire turn 1014 closely.

Half a coil 1002 of the opened dual-sided PCB Rogowski coil 1000 is composed of multiple identical composition units in series connection, and FIG. 10A shows a composition unit 1012. As shown in FIG. 10A, FIG. 10B and FIG. 10C, the center of composition unit 1012 and the centers of other composition units are located on a circular magnetic line generated by the current flowing on the current-carrying conductor 113, and various composition units are uniformly distributed on the circular magnetic line.

Each composition unit on half a coil 1002 of the opened dual-sided PCB Rogowski coil 1000 comprises two groups of coils with opposite winding directions: respective one cycle of wire turn of the coils 1005 and 1006; the composition unit 1012 comprises a cycle of wire turn 1015 of the coil 1005 and a cycle of wire turn 1016 of the coil 1006, and the two cycles of wire turns are adjacent closely. FIG. 5B shows a top layer part 1019 of the wire turn 1015 and a top layer part 1020 of the wire turn 1016 on the composition unit 1012. The top layer part 1019 of the wire turn 1015 is adjacent with the top layer part 1020 of the wire turn 1016 closely, FIG. 5C shows a bottom layer part 1023 of the wire turn 1015 and a bottom layer part 1024 of the wire turn 1016 on the composition unit 1012. The bottom layer part 1023 of the wire turn 1015 is adjacent with the bottom layer part 1024 of the wire turn 1016 closely.

Figure 11A:
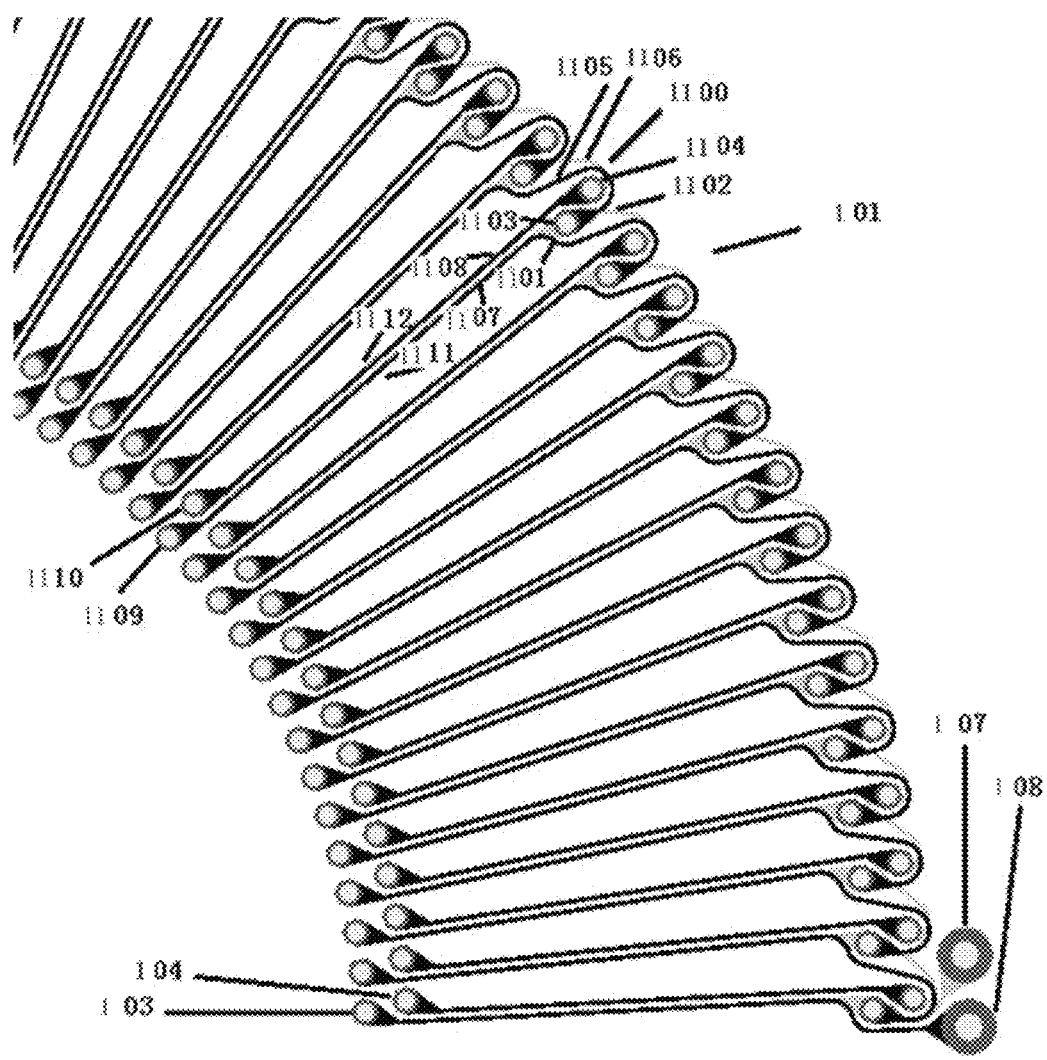
FIG. 11A shows a laminating layer of the local top layer and bottom layer of right half coil of the opened Rogowski coil with two PCBs.
Figure 11B:
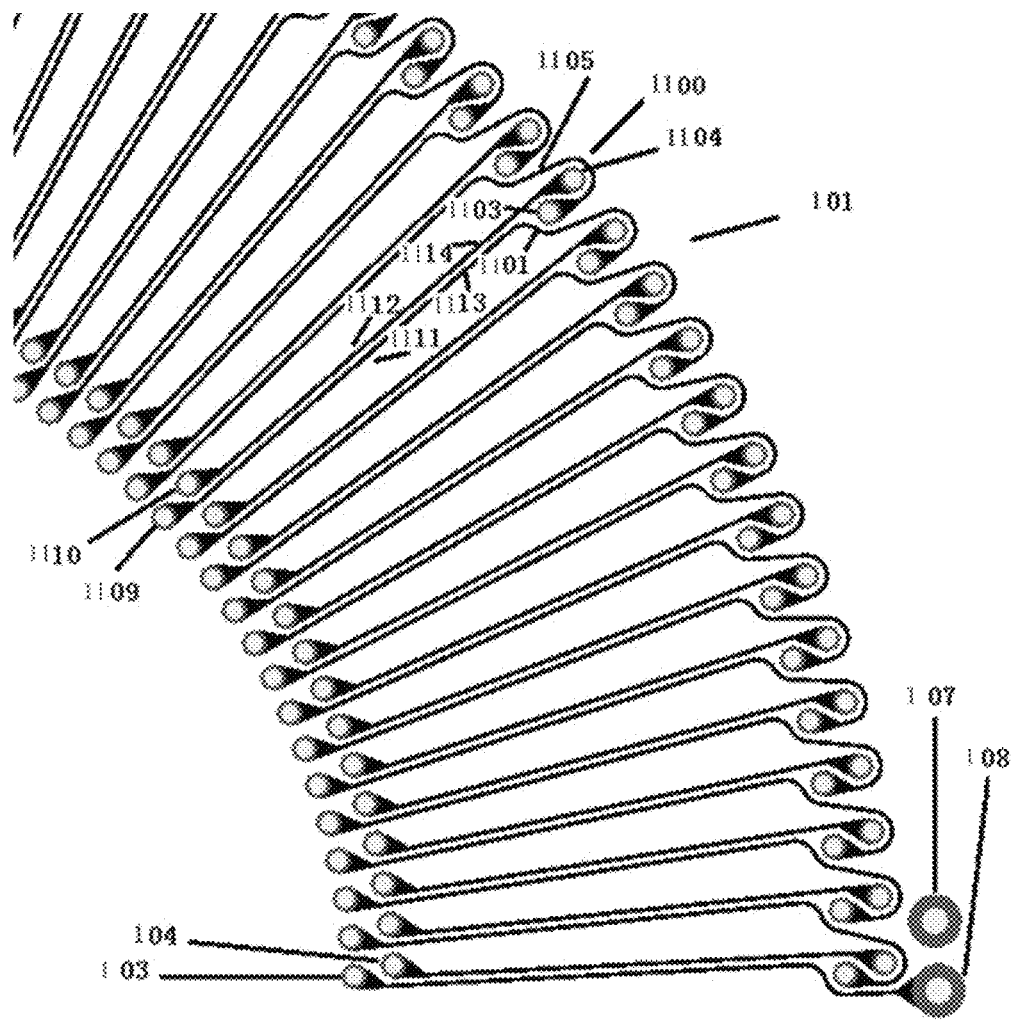
FIG. 11B shows a local top layer of right half coil of the opened Rogowski, coil with two PCBs.

FIG. 11 shows local details on the right of half a coil 101 on the opened Rogowski coil with two dual-sided PCBs 1100 according to the specific embodiment in the disclosure. FIG. 11A shows a laminating layer on the local top layer and bottom layer on the right of half a coil 101 on the opened Rogowski coil with two dual-sided PCBs 1100, FIG. 11B shows a local top layer and FIG. 6C shows a local bottom layer on the right thereof.

The laminating layer on the top layer and bottom, layer of a composition unit 1100 of half a coil 101 on the opened Rogowski coil with two dual-sided PCBs 100, as shown in FIG. 11A, comprises a laminating layer part of a cycle of wire turn 1111 on the coil 103 and a laminating layer part of a cycle of wire turn 1112 on the other group of coil 104 with opposite winding direction. The laminating layer part of a cycle of wire turn 1111 on the coil 103 comprises an incoming line 1101, a wiring line 1107, a through hole 1109, a through hole 1103 and an outgoing line 1105. The laminating layer part of a cycle of wire turn 1112 on the coil 104 comprises an incoming line 1102, a wiring line 1108, a through hole 1110, a through hole 1104 and an outgoing line 1106.

The top layer of a composition unit 1100 of half a coil 101 on the opened Rogowski coil with two dual-sided PCBs 100, as shown in FIG. 11B, comprises a top layer part of a cycle of wire turn 1111 on the coil 103 and a top layer part of a cycle of wire turn 1112 on the other group of coil 104 with opposite winding direction. The top layer part of a cycle of wire turn 1111 on the coil 103 comprises an incoming line 1101, a wiring line 1113, a through hole 1109, a through hole 1103 and an outgoing line 1105. The top layer part of a cycle of wire turn 1112 on the coil 104 comprises a through hole 1110, a wiring line 1114 and a through hole 1104.

Figure 11C:
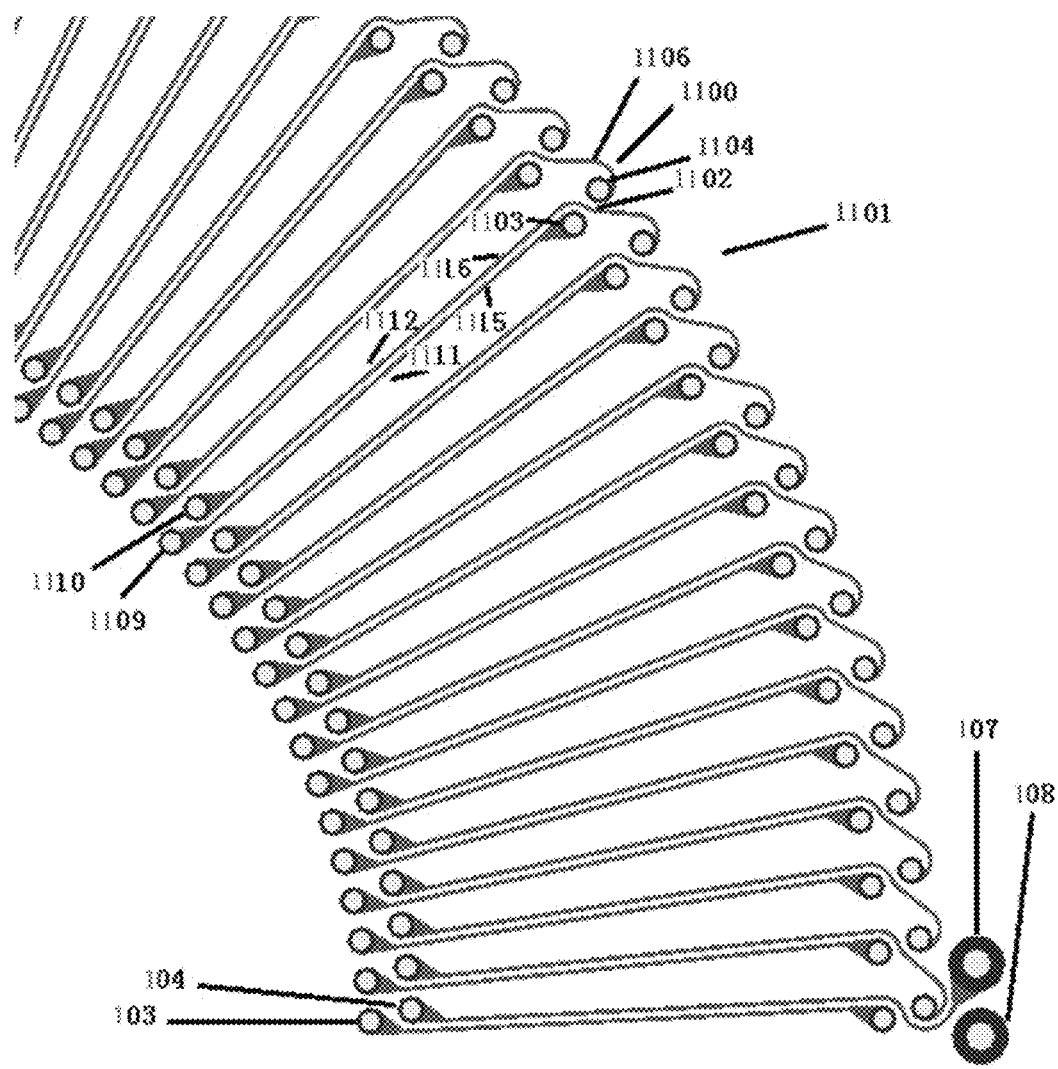
FIG. 11C shows a local bottom layer of right half coil of the opened Rogowski coil with two PCBs.

The bottom layer of a composition unit 1100 of half a coil 101 on the opened Rogowski coil with two dual-sided PCBs 100, as shown in FIG. 11C, comprises a bottom layer part of a cycle of wire turn 1111 on the coil 103 and a top layer part of a cycle of wire turn 1112 on the other group of coil 104 with opposite winding direction. The bottom layer part of a cycle of wire turn 1111 on the coil 103 comprises a through hole 1109, a wiring line 1115 and a through hole 1103. The bottom layer part of a cycle of wire turn 1112 on the coil 104 comprises an incoming line 1102, a wiring line 1116, a through hole 1110, a through hole 1104 and an outgoing line 1106.

As shown in FIG. 11A, FIG. 11B and FIG. 11C, the rectangular winding part of a cycle of wire turn 1111 on the coil 103 is composed of a wiring line 1113, a through hole 1109, a wiring line 1115 and a through hole 1104, wherein the wiring line 1113 on the top layer of the rectangular winding part and the wiring line 1115 on the bottom layer are overlapped in the direction vertical to the surface of PCB. The rectangular winding part of a cycle of wire turn 1112 on the other group of coil 104 with opposite winding direction is composed of a wiring line 1116, a through hole 1110, a wiring line 1114 and a through hole 1104, wherein the wiring line 1116 on the bottom layer of the rectangular winding part and the wiring line 1114 on the top layer are overlapped in the direction vertical to the surface of PCB.

As shown in FIG. 11A, FIG. 11B and FIG. 11C, the rectangular winding section directions of a cycle of wire turn 1111 on the coil 103 and a cycle of wire turn 1112 on the coil 104 are approximately along the radial direction of the centers of opened Rogowski coil with two dual-sized PCBs 1100 and winding section, or the magnetic line with the centers of various composition units on the opened Rogowski coil with two dual-sided PCBs 100 is in the normal direction in the center of the winding section.

As shown in FIG. 11A, FIG. 11B and FIG. 11C, the rectangular winding section directions of a cycle of wire turn 1111 on the coil 103 and a cycle of wire turn 1112 on the coil 104 are approximately vertical to the radial direction of the centers of opened Rogowski coil with two dual-sized PCBs 100 and winding section, or the magnetic line with the centers of various composition units on the opened Rogowski coil with two dual-sized PCBs 100 is in the tangential direction in the center of the winding section.

As shown in FIG. 11A, FIG. 11B and FIG. 11C, the first composition unit on the half a coil 101 of the opened Rogowski coil with two dual-sized PCBs 1100 is provided with an external access point 108, which is connected with the incoming line of the first wire turn on the coil 103 of the first composition unit. The first composition unit on the half a coil 101 of the opened Rogowski coil with two dual-sized PCBs 1100 is provided with an external access point 107, which is connected with the incoming line of the first wire turn on the other group of coil 104 with opposite winding direction.

Figure 12A:
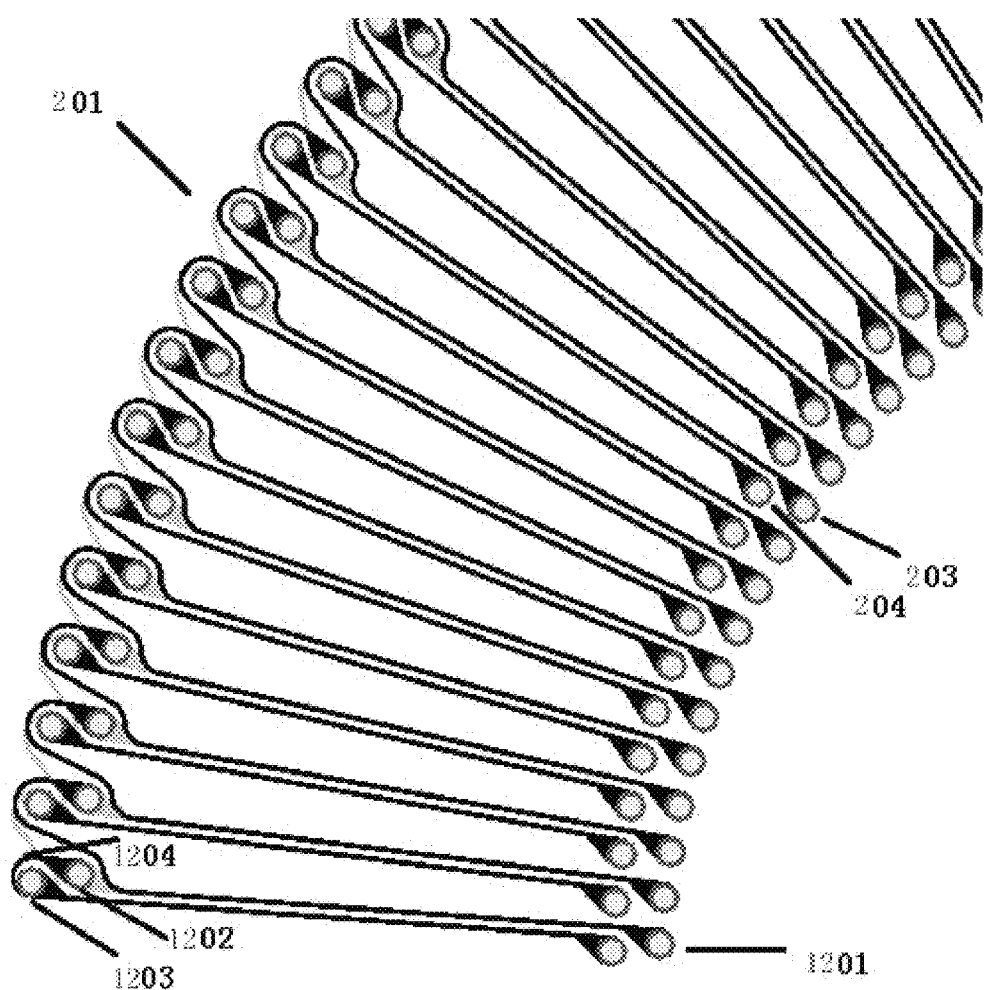
FIG. 12A shows a local laminating layer of the top layer and bottom layer of left half coil of the opened Rogowski coil with two PCBs.
Figure 12B:
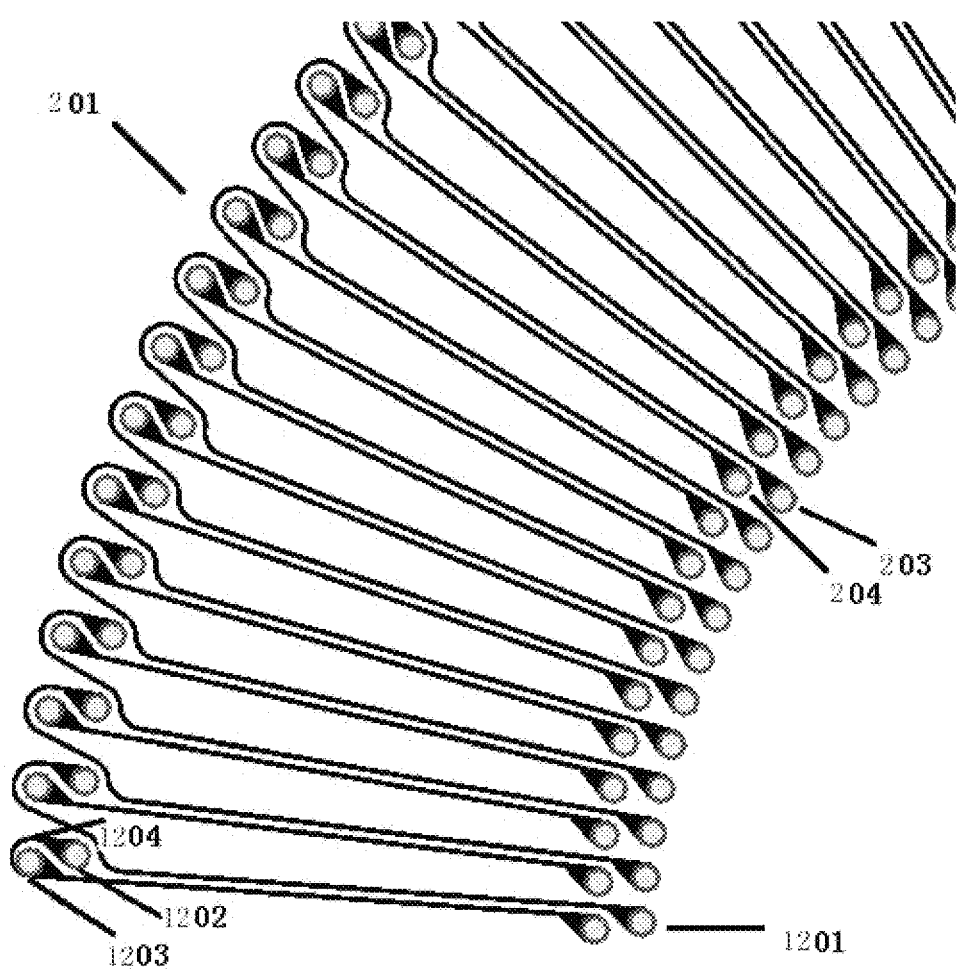
FIG. 12B shows a local top layer of left half coil of the opened Rogowski coil with two PCBs.
Figure 12C:
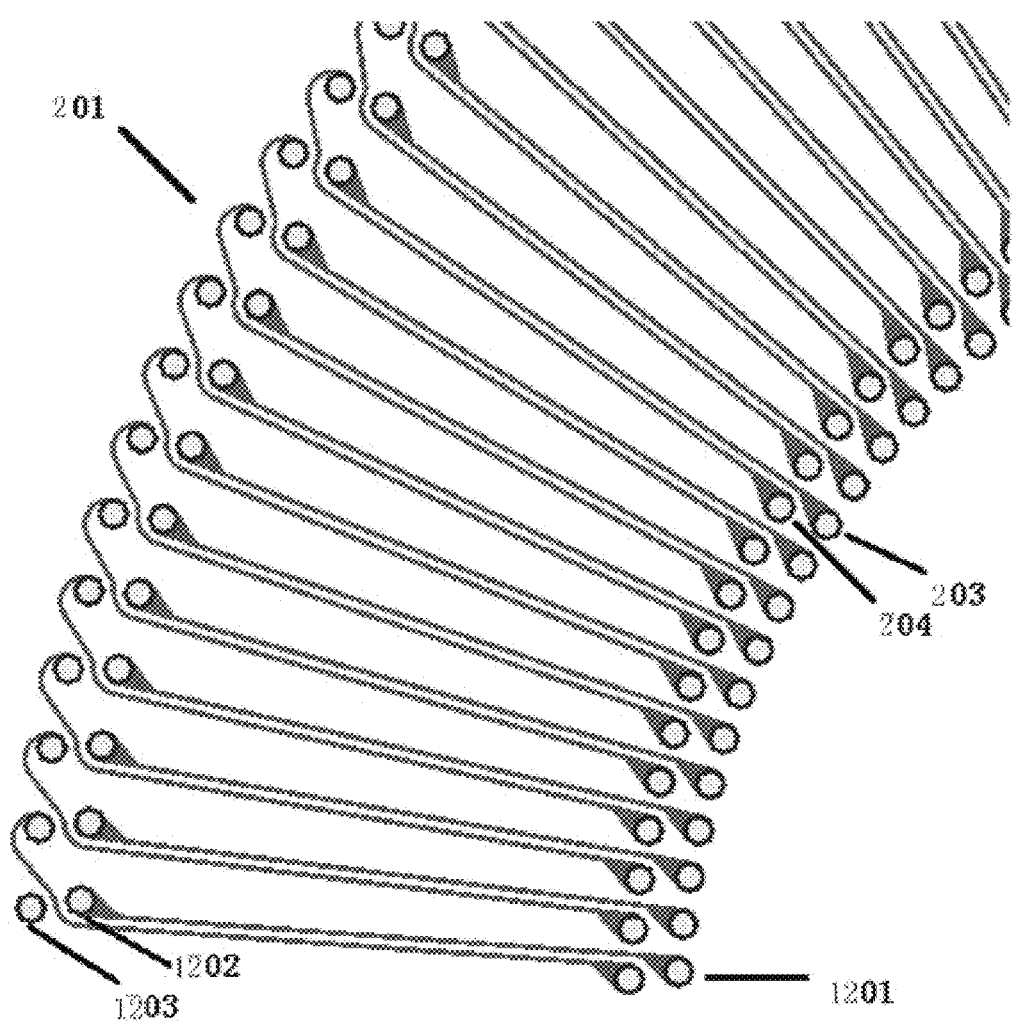
FIG. 12C shows a local bottom layer of left half coil of the opened Rogowski coil with two PCBs.

FIG. 12 shows local details on the left of half a coil on the opened Rogowski coil with two dual-sided PCBs according to the specific embodiment in the disclosure. FIG. 12A shows a laminating layer on the local top layer and bottom layer on the left of half a coil on the opened Rogowski coil with two dual-sided PCBs, FIG. 12B shows a local top layer and FIG. 12C shows a local bottom layer on the left thereof.

As shown in FIG. 12A, FIG. 12B and FIG. 12C, the outgoing line from the through hole 1202 of the coil 203 on the last composition unit 1201 of half a coil 201 on the opened Rogowski coil with two dual-sided PCBs is directly connected with the outgoing line from the through hole 1203 on the other group of coil 204 with opposite winding direction through the wiring line 1204 to realize the series connection between two groups of coils 203 and 204 with opposite winding directions of half a coil 201 on the opened Rogowski coil with two dual-sided PCBs.

(IV) Opened Rogowski Coil with Multiple (N≥3) PCBs

The opened Rogowski coil with multiple PCBs capable of resisting interference of external magnetic field comprises two groups of series-connected coils in opposite winding direction, i.e. a first coil and a second coil, and each PCB is provided with one part of the first coil and the second coil.

The opened Rogowski coil with multiple PCBs capable of resisting interference of external magnetic field is specifically composed of two halves of PCB Rogowski coils, each of which is composed of N PCBs by laminating. Each half of the PCB Rogowski coil is provided with two signal output ends, i.e. the first signal output end and the second signal output end. The PCB with the first and second signal output ends is the $1^{st}$ PCB, the PCB adjacent with the $1^{st}$ PCB is the $2^{nd}$ PCB, if N≥3, the rest can be done in the same manner, it is the $3^{rd}$ PCB till the $N^{th}$ PCB is present.

Four external access points are set from the $1^{st}$ PCB to the $(N-1)^{th}$ PCB on each half of the PCB Rogowski coil, i.e. the first external access point, the second external access point, the third external access point and the fourth external access point, wherein the first external access point and the third external access point are the starting point and the ending point of the first coil from the $1^{st}$ PCB to the $(N-1)^{th}$ PCB, respectively; and the second external access point and the fourth external access point are the starting point and the ending point of the second coil from the $1^{st}$ PCB to the $(N-1)^{th}$ PCB, respectively. The $N^{th}$ PCB on each half of the PCB Rogowski coil is provided with two external access points, i.e. the first external access point and the second external access point, wherein the first external access point is the starting point of the first coil on the $N^{th}$ PCB, and the second external access point is the starting point of the second coil on the $N^{th}$ PCB.

The first external access point on the $1^{st}$ PCB on each half of the PCB Rogowski coil is the first signal output end, and the second external access point on the $1^{st}$ PCB is the second signal output end. The third external access point on the upper one of the adjacent and laminated PCBs on each half of the PCB Rogowski coil is connected with the first external access point on the lower one to realize the series connection between the first coil part on the upper PCB and the first coil part on the lower PCB to form a complete first coil. The fourth external access point on the upper one of the adjacent and laminated PCBs on each half of the PCB Rogowski coil is connected with the second external access point on the lower one to realize the series connection between the second coil part on the upper PCB and the second coil part on the lower PCB to form a complete second coil. The first coil and the second coil on each half of the PCB Rogowski coil are directly connected, in series on the $N^{th}$ PCB to form half an opened Rogowski coil with multiple PCBs capable of resisting interference of external magnetic field.

Two connection modes are provided for two halves of PCB Rogowski coils on the opened Rogowski coil with multiple PCBs: the first external access points of two halves of PCB Rogowski coils are connected directly, the second external access points of two halves of PCB Rogowski coils are taken as two signal output ends of the opened Rogowski coil with multiple PCBs, i.e. the first signal output end and the second signal output end; the second external access points of two halves of Rogowski coils are connected directly, and the first access points of two halves of PCB Rogowski coils are taken as two signal output ends of the opened Rogowski coil with multiple PCBs, i.e. the first signal output end and the second signal output end.

Each PCB of the opened Rogowski coil with multiple PCBs is composed of multiple identical composition units in series connection, each of which comprises the cycles of wire turns of the first coil and the second coil, and the two cycles of wire turns are adjacent closely. That two cycles of wire turns are adjacent closely can be understood as: the minimum space between two cycles of wire turns is equal to the minimum safety space between the PCBs, the minimum safety space between the PCBs is related to the technology of PCB, e.g. the minimum safety space between the PCBs is 6 mil, or 0.1524 mm. One cycle of wire turn on the first coil of each composition unit on each PCB of the opened Rogowski coil with multiple PCBs comprises an incoming line, a winding line and an outgoing line, wherein the incoming line and outgoing line are respectively connected with the wire turns of the first coils on the upper composition unit and the lower composition unit, and the winding line is composed of wirings and through holes among different layers by surrounding. One cycle of wire turn on the second coil of each composition unit on each PCB of the opened Rogowski coil with multiple PCBs comprises an incoming line, a winding line and an outgoing line, wherein the incoming line and outgoing line are respectively connected with the wire turns of the second coils on the upper composition unit and the lower composition unit, and the winding line is composed of wirings and through holes among different layers by surrounding. Specifically, the wiring path on the top layer is overlapped with that on the bottom layer. The section of winding lines composed of the wirings on the top layer and bottom layer and two through holes by surrounding is similar to a rectangle.

The incoming line at one cycle of wire turn on the first coil of the first composition unit from the $1^{st}$ PCB to the $N^{th}$ PCB on the opened Rogowski coil with multiple PCBs is connected with the first external access point from the $1^{st}$ PCB to the $N^{th}$ PCB, and the incoming line at one cycle of wire turn on the second coil of the first composition unit from the $1^{st}$ PCB to the $N^{th}$ PCB is connected with the second external access point from the $1^{st}$ PCB to the $N^{th}$ PCB. The outgoing line at one cycle of wire turn on the first coil of the last composition unit from the $1^{st}$ PCB to the $(N-1)^{th}$ PCB is connected with the third external access point from the $1^{st}$ PCB to the $(N-1)^{th}$ PCB, and the outgoing line at one cycle of wire turn on the second coil of the last composition unit from the $1^{st}$ PCB to the $(N-1)^{th}$ PCB is connected with the fourth external access point from the $1^{st}$ PCB to the $(N-1)^{th}$ PCB. The outgoing line at one cycle of wire turn on the first coil of the last composition unit on the $N^{th}$ PCB is directly connected with the outgoing line at one cycle of wire turn on the second coil of the last composition unit on the $N^{th}$ PCB to realize the series connection between the first coil and the second coil on the $N^{th}$ PCB.

For the opened Rogowski coil with multiple PCBs capable of resisting interference of external magnetic field, the section composed of two cycles of wire turns on each composition unit by surrounding is vertical to the surface of PCB, the section composed of the winding lines by surrounding is located on the cross section of PCB, and the wiring paths of the winding lines are overlapped in the direction vertical to the surface of PCB.

For the opened Rogowski coil with multiple PCBs capable of resisting interference of external magnetic field, the centers of the composition units on each PCB are uniformly distributed on a magnetic line of magnetic field for generating current to be measured, the direction of the section surrounded by the winding lines at two cycles of wire turns of all the composition units is approximately along the normal direction of the magnetic line passing through the section center of the winding line, and the section surrounded by the winding lines at two cycles of wire turns of all the composition units is approximately vertical to the tangential direction (strength direction of the magnetic field) of the magnetic line passing through the section center of the winding line.

In the opened Rogowski coil with multiple PCBs, the PCB is a dual-sided PCB, wherein the first coil and the second coil are located on the upper and lower surfaces of the PCB, so the opened Rogowski coil with multiple PCBs can be called an opened Rogowski coil with multiple dual-sided PCBs.

The opened Rogowski coil with multiple dual-sized PCBs capable of resisting interference of external magnetic field comprises two groups of series-connected coils in opposite winding direction, i.e. a first coil and a second coil, and each dual-sized PCB is provided with one part of the first coil and the second coil.

The opened Rogowski coil with multiple dual-sized PCBs capable of resisting interference of external magnetic field is specifically composed of two halves of PCB Rogowski coils, each of which is composed of N dual-sized PCBs by laminating. Each half of the Rogowski coil is provided with two signal output ends, i.e. the first signal output end and the second signal output end. The PCB with the first and second signal output ends is the $1^{st}$ PCB, the PCB adjacent with the $1^{st}$ PCB is the $2^{nd}$ PCB, if $N≥3$, the rest can be done in the same manner, it is the $3^{rd}$ PCB till the $N^{th}$ PCB is present.

Four external access points are set from the $1^{st}$ PCB to the $(N-1)^{th}$ PCB on each half of the PCB Rogowski coil, i.e. the first external access point, the second external access point, the third external access point and the fourth external access point, wherein the first external access point and the third external access point are the starting point and the ending point of the first coil from the $1^{st}$ PCB to the $(N-1)^{th}$ PCB, respectively; and the second external access point and the fourth external access point are the starting point and the ending point of the second coil from the $1^{st}$ PCB to the $(N-1)^{th}$ PCB, respectively. The $N^{th}$ PCB on each half of the PCB Rogowski coil is provided with two external access points, i.e. the first external access point and the second external access point, wherein the first external access point is the starting point of the first coil on the $N^{th}$ PCB, and the second external access point is the starting point of the second coil on the $N^{th}$ PCB.

The first external access point on the 1ˢᵗ PCB on each half of the PCB Rogowski coil is the first signal output end, and the second external access point on the 1ˢᵗ PCB is the second signal output end. The third external access point on the upper one of the adjacent and laminated PCBs on each half of the PCB Rogowski coil is connected with the first external access point on the lower one to realize the series connection between the first coil part on the upper PCB and the first coil part on the lower PCB to form a complete first coil. The fourth external access point on the upper one of the adjacent and laminated PCBs on each half of the PCB Rogowski coil is connected with the second external access point on the lower one to realize the series connection between the second coil part on the upper PCB and the second coil part on the lower PCB to form a complete second coil. The first coil and the second coil on each half of the PCB Rogowski coil are directly connected in series on the $N^{th}$ PCB to form half an opened Rogowski coil with multiple dual-sized PCBs capable of resisting interference of external magnetic field.

Two connection modes are provided for two halves of PCB Rogowski coils on the opened Rogowski coil with multiple PCBs: the first external access points of two halves of PCB Rogowski coils are connected directly, the second external access points of two halves of PCB Rogowski coils are taken as two signal output ends of the opened Rogowski coil with multiple dual-sized PCBs, i.e. the first signal output end and the second signal output end; the second external access points of two halves of Rogowski coils are connected directly, and the first access points of two halves of PCB Rogowski coils are taken as two signal output ends of the opened Rogowski coil with multiple dual-sized PCBs, i.e. the first signal output end and the second signal output end.

Each dual-sized PCB of the opened Rogowski coil with multiple dual-sized PCBs is composed of multiple identical composition units in series connection, each of which comprises the cycles of wire turns of the first coil and the second coil, and the two cycles of wire turns are adjacent closely. That two cycles of wire turns are adjacent closely can be understood as: the minimum space between two cycles of wire turns is equal to the minimum safety space between the PCBs, the minimum safety space between the PCBs is related to the technology of PCB, e.g. the minimum safety space between the PCBs is 6 mil, or 0.1524 mm.

One cycle of wire turn on the first coil of each composition unit on each dual-sided PCB of the opened Rogowski coil with multiple dual-sided PCBs comprises an incoming line, a winding line and an outgoing line, wherein the incoming line and outgoing line are respectively connected with the wire turns of the first coils on the upper composition unit and the lower composition unit, and the winding line is composed of wirings and through holes between the top layer and the bottom layer by surrounding. One cycle of wire turn on the second coil of each composition unit on each dual-sided PCB of the opened Rogowski coil with multiple dual-sided PCBs comprises an incoming line, a winding line and an outgoing line, wherein the incoming line and outgoing line are respectively connected with the wire turns of the second coils on the upper composition unit and the lower composition unit, and the winding line is composed of wirings and through holes between the top layer and the bottom layer by surrounding. Specifically, the wiring path on the top layer is overlapped with that on the bottom layer. The section of winding lines composed of the wirings on the top layer and bottom layer and two through holes by surrounding is similar to a rectangle.

The incoming line at one cycle of wire turn on the first coil of the first composition unit from the 1ˢᵗ PCB to the $N^{th}$ PCB on the opened Rogowski coil with multiple dual-sized PCBs is connected with the first external access point from the 1ˢᵗ PCB to the $N^{th}$ PCB, and the incoming line at one cycle of wire turn on the second coil of the first composition unit from the 1ˢᵗ PCB to the $N^{th}$ PCB is connected with the second external access point from the 1ˢᵗ PCB to the $N^{th}$ PCB. The outgoing line at one cycle of wire turn on the first coil of the last composition unit from the 1ˢᵗ PCB to the $(N-1)^{th}$ PCB is connected with the third external access point from the 1ˢᵗ PCB to the $(N-1)^{th}$ PCB, and the outgoing line at one cycle of wire turn on the second coil of the last composition unit from the 1ˢᵗ PCB to the $(N-1)^{th}$ PCB is connected with the fourth external access point from the 1ˢᵗ PCB to the $(N-1)^{th}$ PCB. The outgoing line at one cycle of wire turn on the first coil of the last composition unit on the $N^{th}$ PCB is directly connected with the outgoing line at one cycle of wire turn on the second coil of the last composition unit on the $N^{th}$ PCB to realize the series connection between the first coil and the second coil on the $N^{th}$ PCB.

For the opened Rogowski coil with multiple dual-sided PCBs capable of resisting interference of external magnetic field, the section composed of two cycles of wire turns on each composition unit by surrounding is vertical to the surface of dual-sided PCB, the section composed of the winding lines by surrounding is located on the cross section of dual-sided PCB, and the wiring paths on the top layer and bottom layer of the winding lines are overlapped in the direction vertical to the surface of PCB.

For the opened Rogowski coil with multiple dual-sized PCBs capable of resisting interference of external magnetic field, the centers of the composition units on each dual-sized PCB are uniformly distributed on a magnetic line of magnetic field for generating current to be measured, the direction of the section surrounded by the winding lines at two cycles of wire turns of all the composition units is approximately along the normal direction of the magnetic line passing through the section center of the winding line, and the section surrounded by the winding lines at two cycles of wire turns of all the composition units is approximately vertical to the tangential direction (strength direction of the magnetic field) of the magnetic line passing through the section center of the winding line.

Figure 13A:
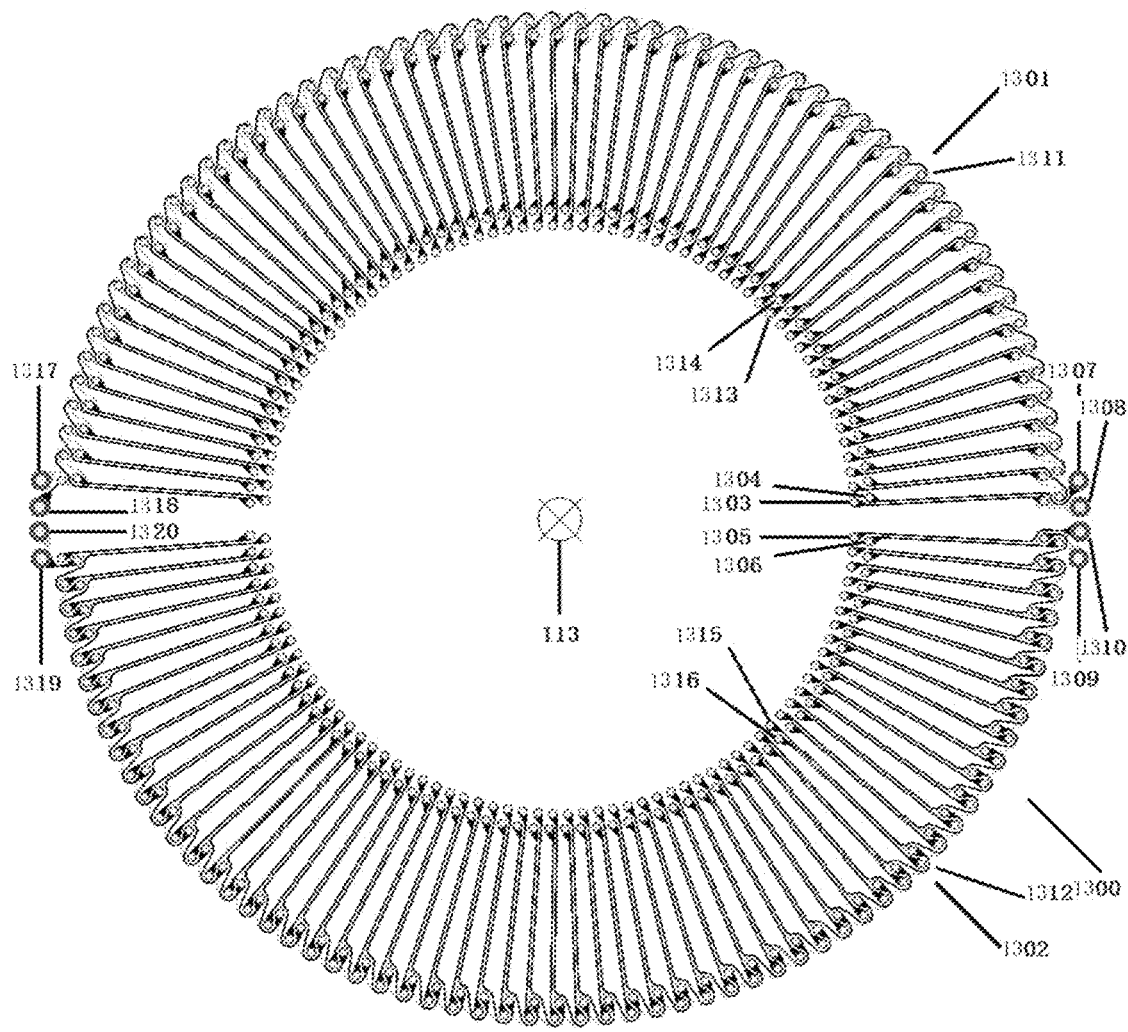
FIG. 13A shows a laminating layer of the top layer and bottom layer of the dual-sided PCBs from the $1^{st}$ layer to the $(N-1)^{th}$ layer of the opened Rogowski coil with multiple dual-sided PCBs.
Figure 13B:
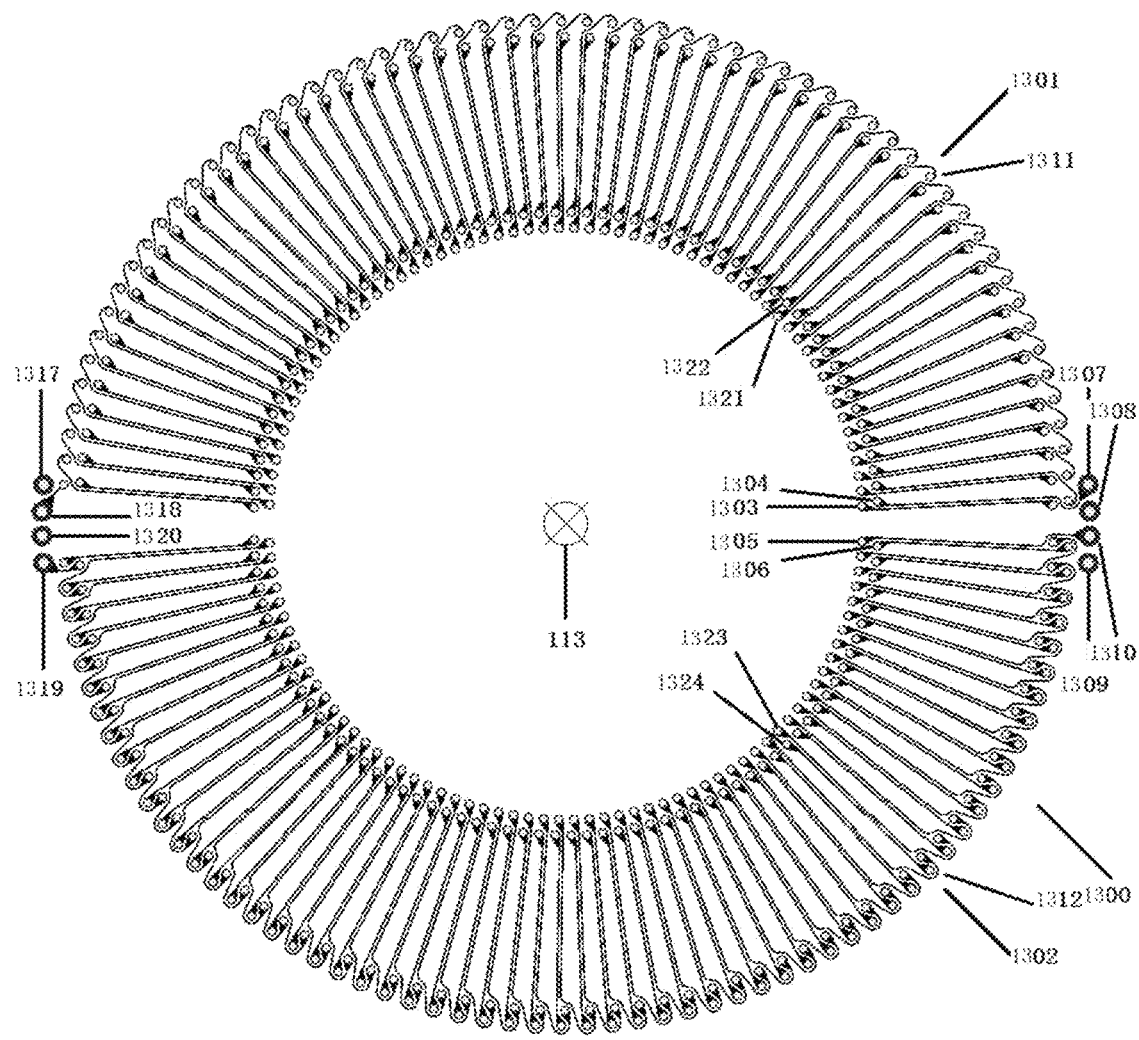
FIG. 13B shows a top layer of the dual-sided PCBs from the $1^{st}$ layer to the $(N-1)^{th}$ layer of the opened Rogowski coil with multiple dual-sided PCBs.
Figure 13C:
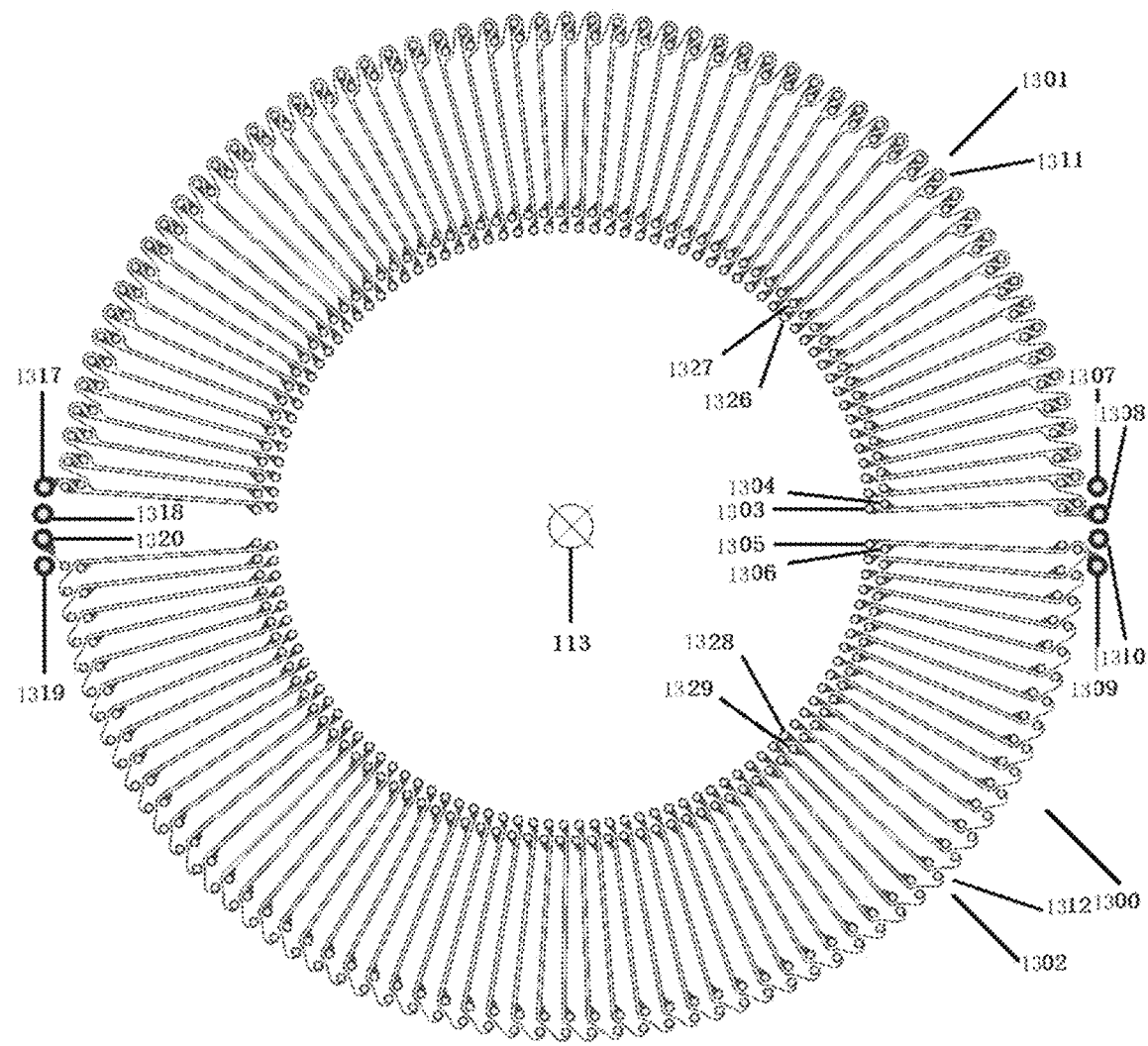
FIG. 13C shows a bottom layer of the dual-sided PCB from the $1^{st}$ layer to the $(N-1)^{th}$ layer of the opened Rogowski coil with multiple dual-sided PCBs.

FIG. 13 shows a specific embodiment of the disclosure, or an opened Rogowski coil with multiple dual-sided PCBs 1300 composed of N layers of dual-sized PCBs by laminating from the 1ˢᵗ layer to the $(N-1)^{th}$ layer, which is suitable for measuring the current flowing on a current-carrying conductor 113 vertically passing through the center of opened PCB Rogowski coil 1300, and the magnetic line of AC magnetic field generated by the current is a circle of taking the center of opened PCB Rogowski coil 1300 as the center of a circle. FIG. 13A shows a laminating layer on the top layer and bottom layer of the dual-sized PCB from the 1ˢᵗ layer to the $(N-1)^{th}$ layer on the opened Rogowski coil with multiple dual-sized PCBs 1300 composed of N layers of dual-sized PCBs by laminating, FIG. 13B shows a top layer and FIG. 13C shows a bottom layer thereof.

The dual-sized PCB from the 1ˢᵗ layer to the $(N-1)^{th}$ layer on the opened Rogowski coil with multiple dual-sided PCBs 1300 composed of N layers of dual-sized PCBs by laminating comprises two halves of dual-sided PCB Rogowski coils, i.e. the coils 1301 and 1302. The coil 1301 comprises two groups of coils with opposite winding directions, i.e. the coil 1303 and the coil 1304, both of which form a half dual-sided PCB Rogowski coil 1301. The coil 1302 comprises two groups of coils with opposite winding directions, i.e. the coil 1305 and the coil 1306, both of which form a half dual-sided PCB Rogowski coil 1302.

The coil 1301 is provided with four external access points, i.e. 1307, 1308, 1317, 1318. The external access point 1308 is taken as the starting point of the coil 1303, and the external access point 1317 is taken as the ending point of the coil 1303. The external access point 1307 is taken as the starting point of the coil 1304, and the external access point 1318 is taken as the ending point of the coil 1304.

The coil 1302 is provided with four external access points, i.e. 1309, 1310, 1319, 1320. The external access point 1310 is taken as the starting point of the coil 1305, and the external access point 1319 is taken as the ending point of the coil 1305. The external access point 1309 is taken as the starting point of the coil 1306, and the external access point 1320 is taken as the ending point of the coil 1306.

The coil 1301 is composed of multiple identical composition units in series connection, and FIG. 13A shows a composition unit 1311. As shown in FIG. 13A, FIG. 13B and FIG. 13C, the center of composition unit 1311 and the centers of other composition units are located on a circular magnetic line generated by the current flowing on the current-carrying conductor 113, and various composition units are uniformly distributed on the circular magnetic line.

Each composition unit of the coil 1301 comprises two groups of coils with opposite winding directions: one cycle of wire turns of the coils 1303 and 1304. The composition unit 1311 comprises a cycle of wire turn 1313 on the coil 1303 and a cycle of wire turn 1314 on the coil 1304, and the two cycles of wire turns are adjacent closely. FIG. 13B shows a top layer part 1321 of the wire turn 1313 and a top layer part 1322 of the wire turn 1314 on the composition unit 1311. The top layer part 1321 of the wire turn 1313 is adjacent with the top layer part 1322 of the wire turn 1314 closely, FIG. 13C shows a bottom layer part 1326 of the wire turn 1313 and a bottom layer part 1327 of the wire turn 1314 on the composition unit 1311. The bottom layer part 1326 of the wire turn 1313 is adjacent with the bottom layer part 1327 of the wire turn 1314 closely.

The coil 1302 is composed of multiple identical composition units in series connection, and FIG. 13A shows a composition unit 1312. As shown in FIG. 13A, FIG. 13B and FIG. 13C, the center of composition unit 1312 and the centers of other composition units are located on a circular magnetic line generated by the current flowing on the current-carrying conductor 113, and various composition units are uniformly distributed on the circular magnetic line.

Each composition unit of the coil 1302 comprises two groups of coils with opposite winding directions: one cycle of wire turns of the coils 1305 and 1306. The composition unit 1312 comprises a cycle of wire turn 1315 on the coil 1305 and a cycle of wire turn 1316 on the coil 1306, and the two cycles of wire turns are adjacent closely. FIG. 13B shows a top layer part 1323 of the wire turn 1315 and a top layer part 1324 of the wire turn 1316 on the composition unit 1312. The top layer part 1323 of the wire turn 1315 is adjacent with the top layer part 1324 of the wire turn 1316 closely, FIG. 10C shows a bottom layer part 1328 of the wire turn 1315 and a bottom layer part 1329 of the wire turn 1316 on the composition unit 1312. The bottom layer part 1328 of the wire turn 1315 is adjacent with the bottom layer part 1329 of the wire turn 1316 closely.

Figure 14A:
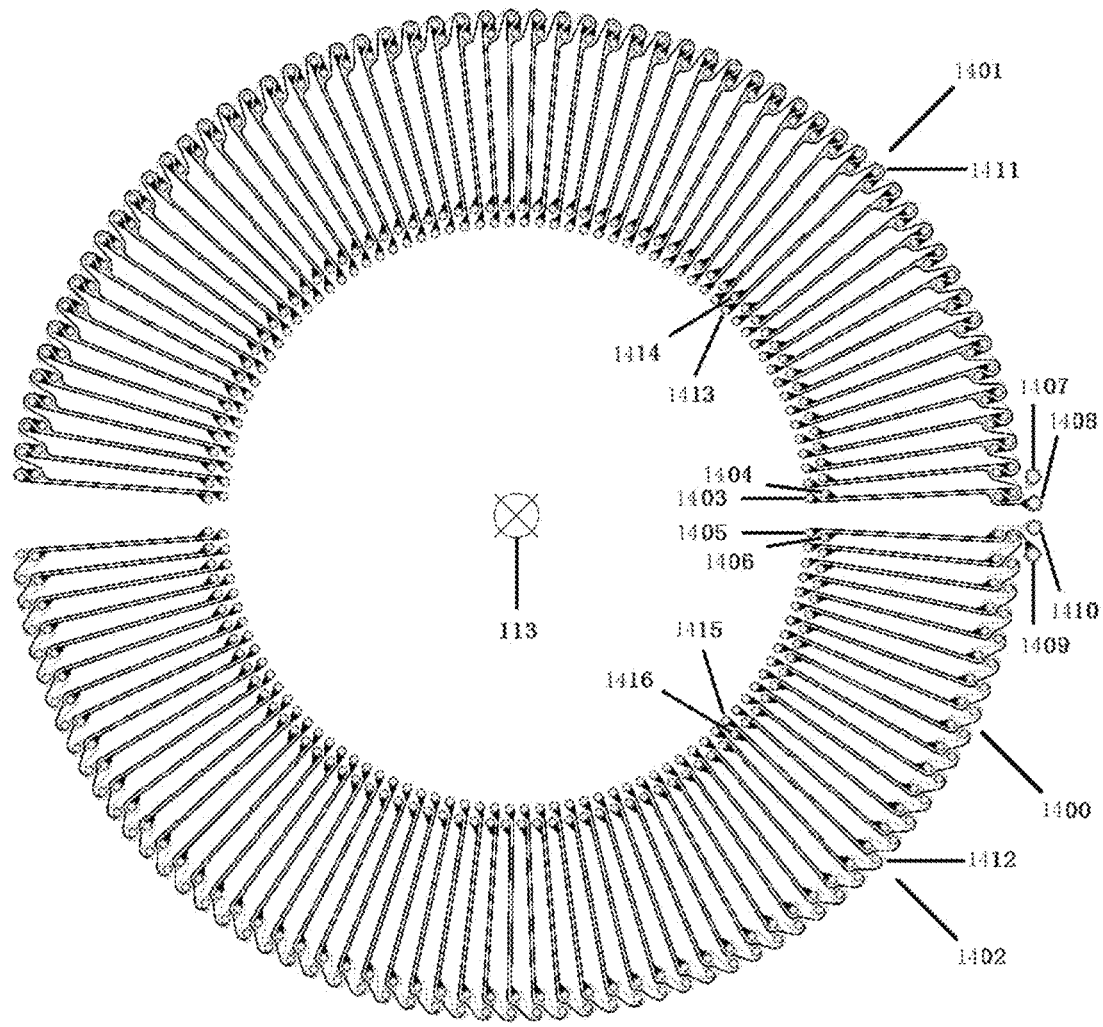
FIG. 14 shows a dual-sided PCB on the $N^{th}$ layer of the opened Rogowski coil with multiple dual-sided PCBs composed of N layers of dual-sided PCB by laminating in the embodiment of the disclosure. The dual-sided PCBon the $N^{th}$ layer comprises two dual-sided PCBs, which are the $N^{th}$ dual-sided PCBs on each half of the opened Rogowski coil with multiple dual-sided PCBs formed by laminating.
FIG. 14B shows a top layer of the dual-sided PCB on the $N^{th}$ layer of the opened Rogowski coil with multiple dual-sided PCBs.
FIG. 14C shows a bottom layer of the dual-sided PCB on the $N^{th}$ layer of the opened Rogowski coil with multiple dual-sided PCBs.
Figure 14B:
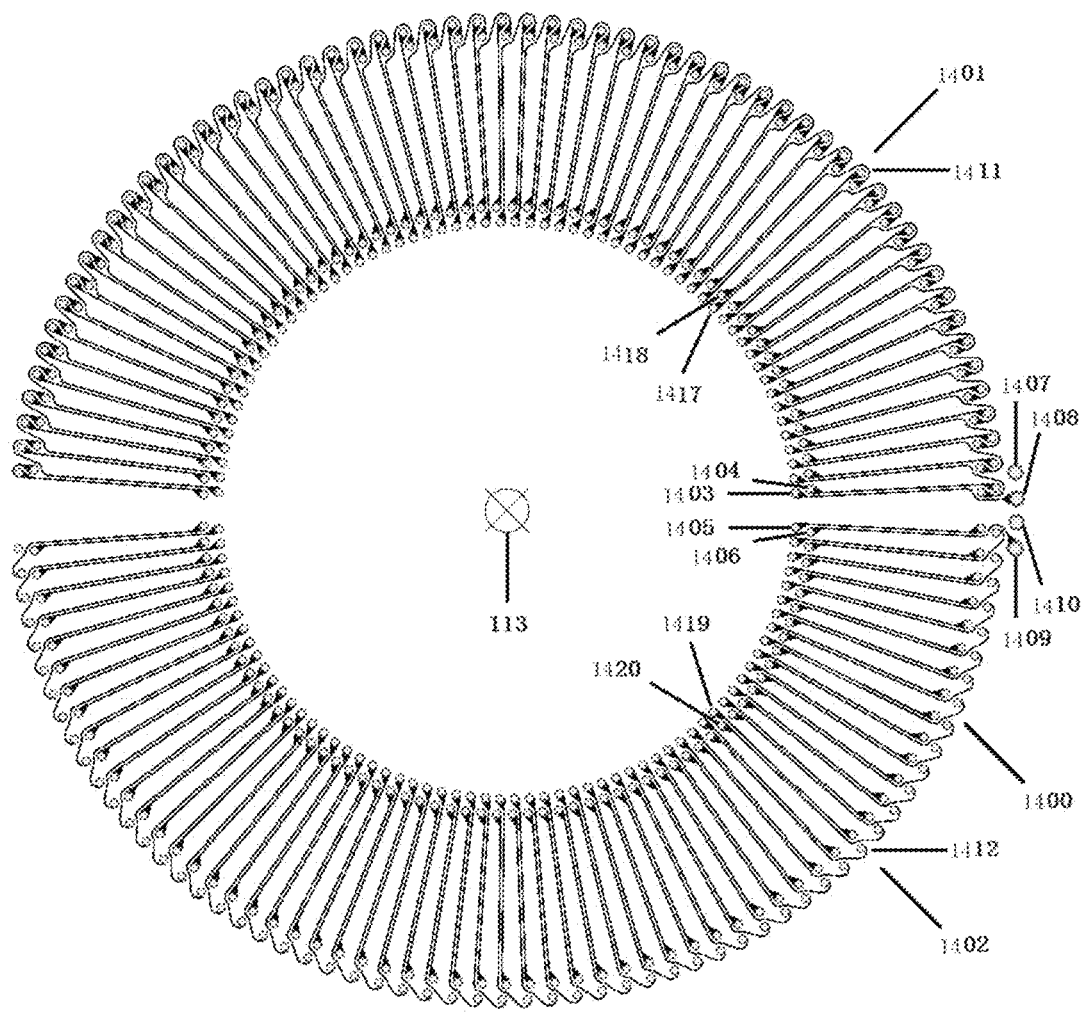
Figure 14C:
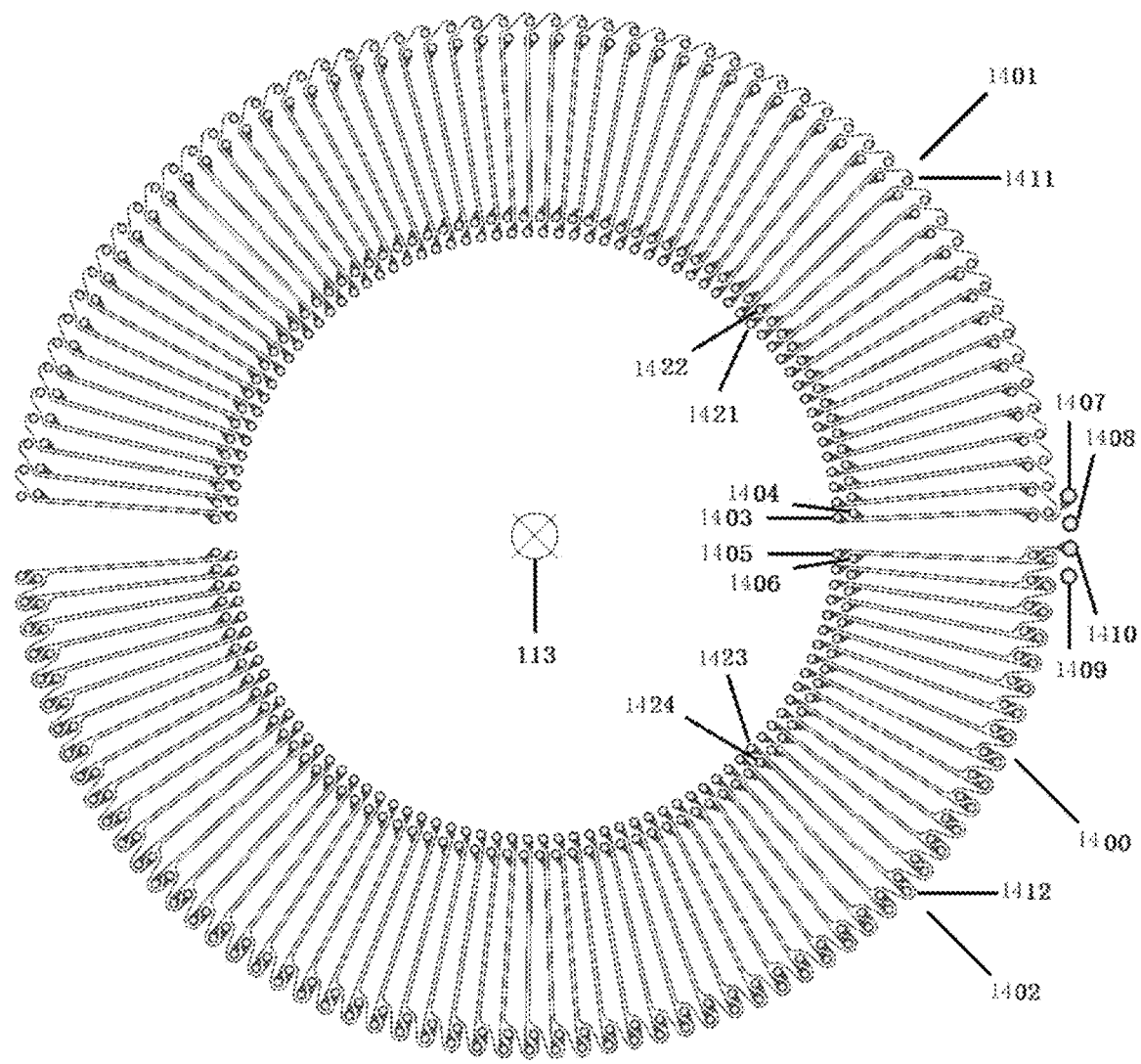

FIG. 14 shows a dual-sized PCB on the $N^{th}$ layer of the opened Rogowski coil with multiple dual-sided PCBs composed of N layers of dual-sided PCBs by laminating according to the specific embodiment in the disclosure. FIG. 14A shows a laminating layer on the top layer and bottom layer of the dual-sized PCB on the $N^{th}$ layer of the opened Rogowski coil with multiple dual-sided PCBs 500 composed of N layers of dual-sized PCBs by laminating, FIG. 14B shows a top layer and FIG. 14C shows a bottom layer thereof.

The dual-sized PCB on the $N^{th}$ layer of the opened Rogowski coil with multiple dual-sided PCBs 500 composed of N layers of dual-sized PCBs by laminating comprises two halves of dual-sided PCB Rogowski coils, i.e. the coils 1401 and 1402. The coil 1401 comprises two groups of coils with opposite winding directions, i.e. the coil 1403 and the coil 1404, both of which form a half dual-sided PCB Rogowski coil 1401. The coil 1402 comprises two groups of coils with opposite winding directions, i.e. the coil 1406 and the coil 1406, both of which form a half dual-sided PCB Rogowski coil 1402.

The coil 1401 is provided with two external access points, i.e. 1407, 1408. The external access point 1408 is taken as the starting point of the coil 1403, and the external access point 1407 is taken as the starting point of the coil 1404.

The coil 1402 is provided with two external access points, i.e. 1409, 1410. The external access point 1410 is taken as the starting point of the coil 1405, and the external access point 1409 is taken as the starting point of the coil 1406.

The coil 1401 is composed of multiple identical composition units in series connection, and FIG. 14A shows a composition unit 1411. As shown in FIG. 14A, FIG. 14B and FIG. 14C, the center of composition unit 1411 and the centers of other composition units are located on a circular magnetic line generated by the current flowing on the current-carrying conductor 113, and various composition units are uniformly distributed on the circular magnetic line.

Each composition unit of the coil 1401 comprises two groups of coils with opposite winding directions: one cycle of wire turns of the coils 1403 and 1404. The composition unit 1411 comprises a cycle of wire turn 1413 on the coil 1403 and a cycle of wire turn 1414 on the coil 1404, and the two cycles of wire turns are adjacent closely. FIG. 14B shows a top layer part 1417 of the wire turn 1413 and a top layer part 1418 of the wire turn 1414 on the composition unit 1411. The top layer part 1417 of the wire turn 1413 is adjacent with the top layer part 1418 of the wire turn 1414 closely, FIG. 14C shows a bottom layer part 1421 of the wire turn 1413 and a bottom layer part 1422 of the wire turn 1414 on the composition unit 1411. The bottom layer part 1421 of the wire turn 1413 is adjacent with the bottom layer part 1422 of the wire turn 1414 closely.

The coil 1402 is composed of multiple identical composition units in series connection, and FIG. 14A shows a composition unit 1412. As shown in FIG. 14A, FIG. 14B and FIG. 14C, the center of composition unit 1412 and the centers of other composition units are located on a circular magnetic line generated by the current flowing on the current-carrying conductor 113, and various composition units are uniformly distributed on the circular magnetic line.

Each composition unit of the coil 1402 comprises two groups of coils with opposite winding directions: one cycle of wire turns of the coils 1405 and 1406. The composition unit 1412 comprises a cycle of wire turn 1415 on the coil 1405 and a cycle of wire turn 1416 on the coil 1406, and the two cycles of wire turns are adjacent closely. FIG. 14B shows a top layer part 1419 of the wire turn 1415 and a top layer part 1420 of the wire turn 1416 on the composition unit 1412. The top layer part 1419 of the wire turn 1415 is adjacent with the top layer part 1420 of the wire turn 1416 closely, FIG. 14C shows a bottom layer part 1423 of the wire turn 1415 and a bottom layer part 1424 of the wire turn 1416 on the composition unit 1412. The bottom layer part 1423 of the wire turn 1415 is adjacent with the bottom layer part 1424 of the wire turn 1416 closely.

Figure 15A:
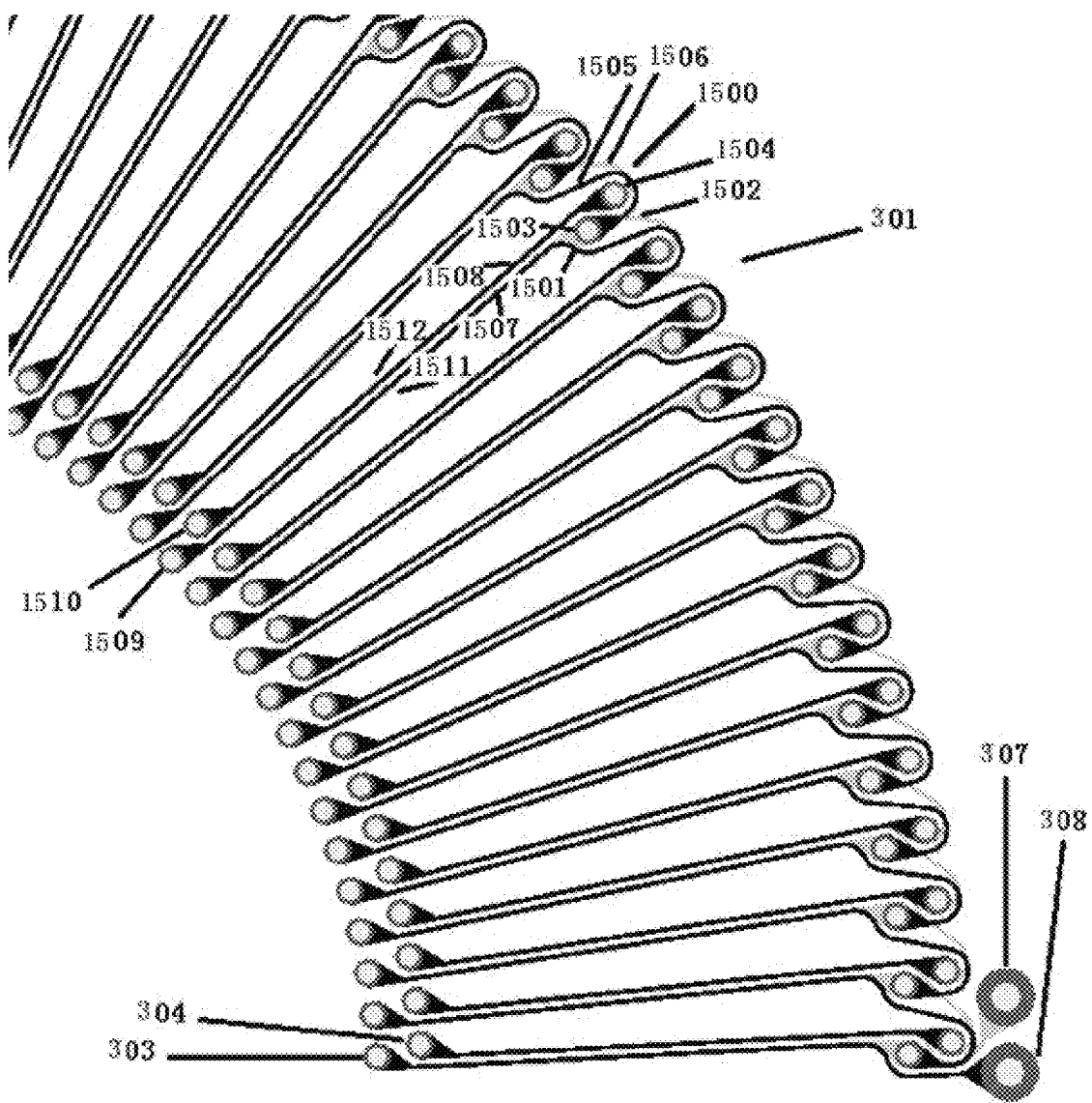
FIG. 15A shows a laminating layer of the top layer and bottom layer of the $1^{st}$ to $(N-1)^{th}$ dual-sided PCBs on the half opened Rogowski coil with multiple dual-sided PCBs composed of N layers of the dual-sided PCBs by laminating.
Figure 15B:
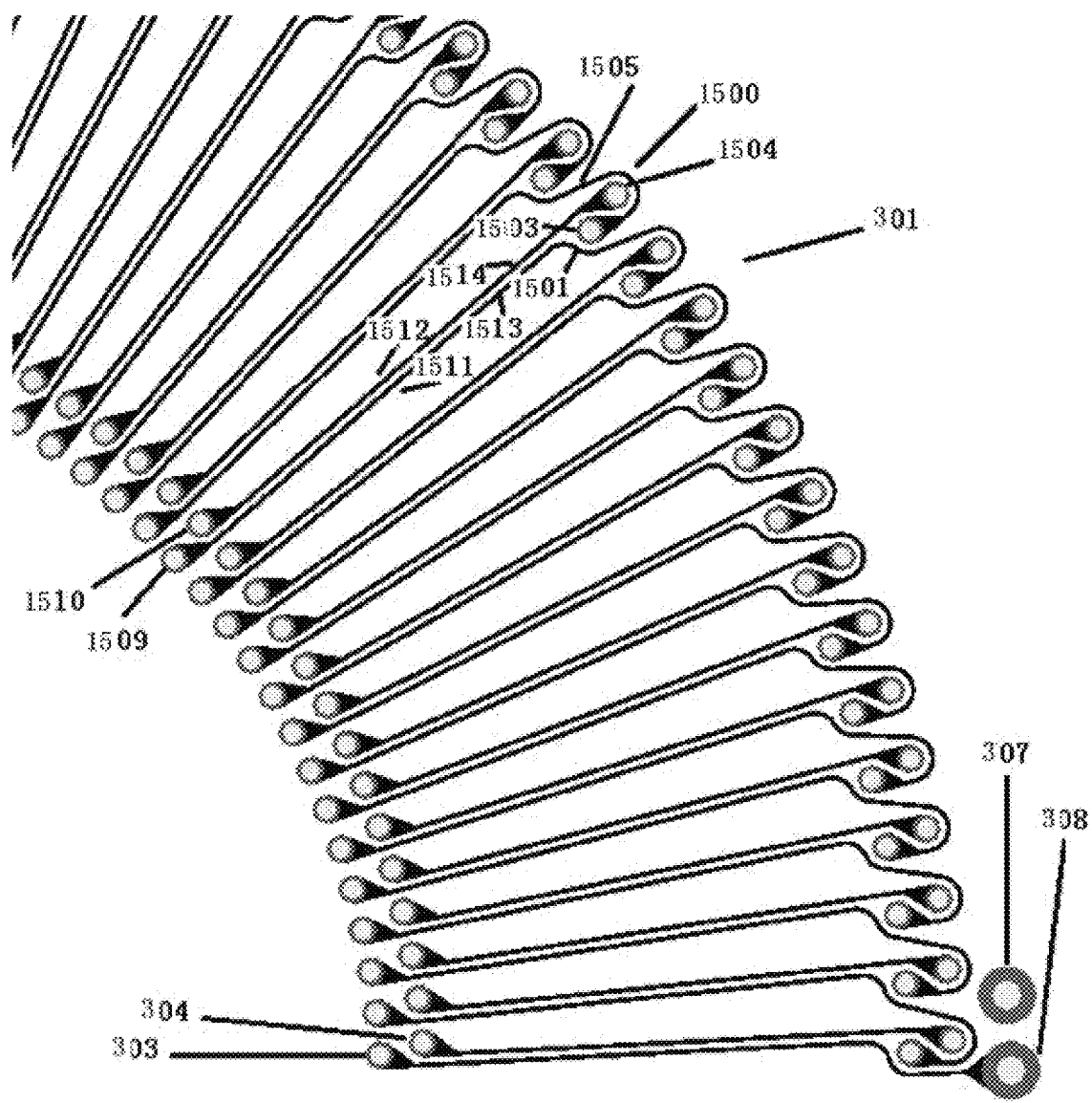
FIG. 15B shows a top layer of the $1^{st}$ to $(N-1)^{th}$ dual-sided PCBs on the half opened Rogowski coil with multiple dual-sided PCBs composed of N layers of the dual-sided PCBs by laminating, and the FIG. 15C shows a bottom layer of the $1^{st}$ to $(N-1)^{th}$ dual-sided PCBs on the half opened Rogowski coil with multiple dual-sided PCBs composed of N layers of the dual-sided PCBs by laminating.
Figure 15C:
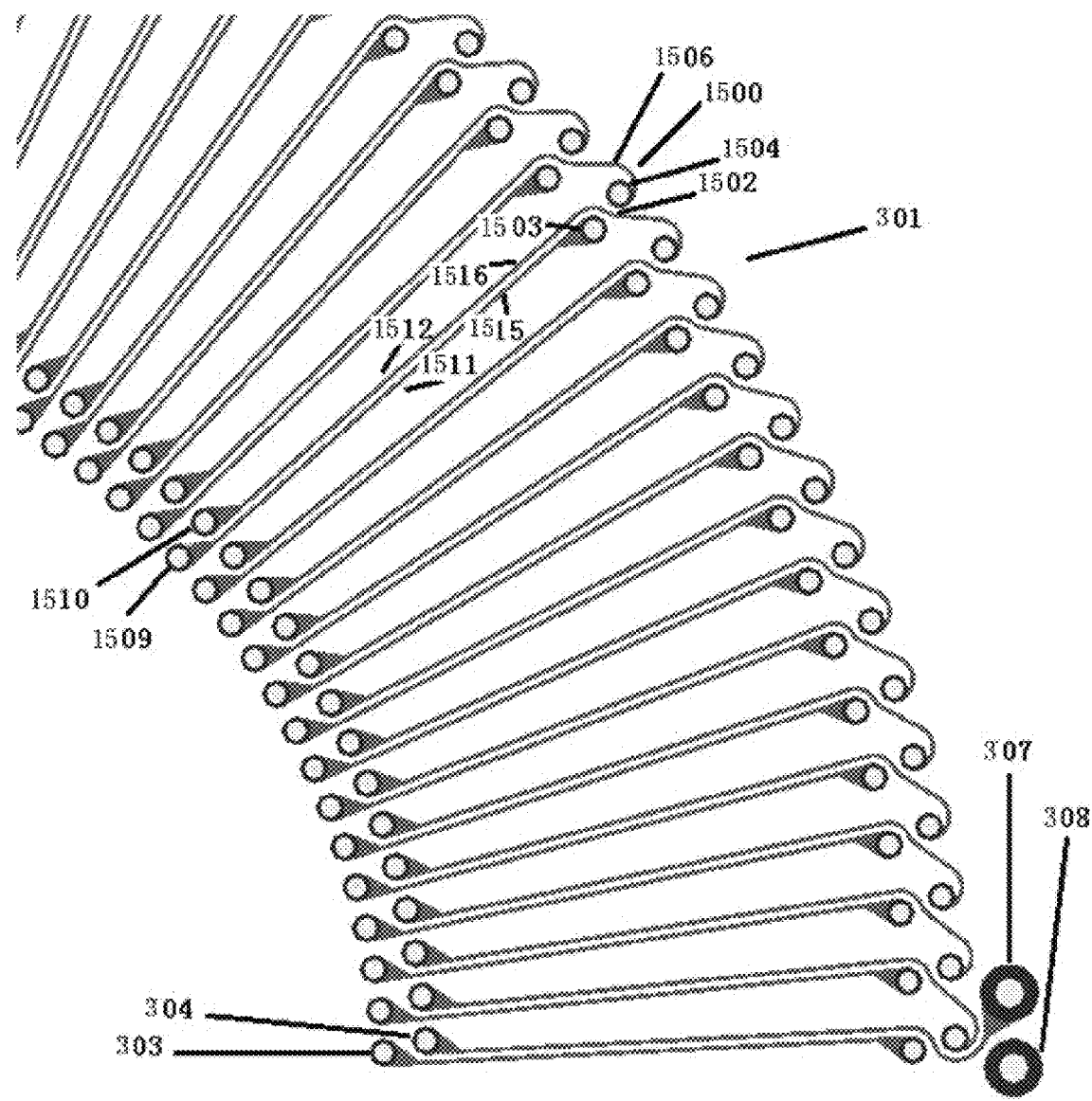
FIG. 15 shows local details on the right of the $1^{st}$ to $(N-1)^{th}$ dual-sided PCBs on the half opened Rogowski coil with multiple dual-sided PCBs composed of N layers of the dual-sided PCBs by laminating.

FIG. 15 shows local details on the right of the dual-sized PCB from the 1$^{st}$ PCB to the (N−1)$^{th}$ PCB of the half opened Rogowski coil with multiple dual-sided PCBs composed of N layers of dual-sized PCBs by laminating according to the specific embodiment in the disclosure. FIG. 15A shows a laminating layer on the top layer and bottom layer of the dual-sized PCB from the 1$^{st}$ PCB to the (N−1)$^{th}$ PCB of the half opened Rogowski coil with multiple dual-sided PCBs composed of N layers of dual-sized PCBs by laminating, FIG. 15B shows a top layer and FIG. 15C shows a bottom layer thereof.

The laminating layer on the top layer and bottom layer of a composition unit 1500 on the coil 301, as shown in FIG. 15A, comprises a laminating layer part of a cycle of wire turn 1511 on the coil 303 and a laminating layer part of a cycle of wire turn 1512 on the other group of coil 304 with opposite winding direction. The laminating layer part of a cycle of wire turn 1511 on the coil 303 comprises an incoming line 1501, a wiring line 1507, a through hole 1509, a through hole 1503 and an outgoing line 1505. The laminating layer part of a cycle of wire turn 1512 on the coil 304, comprises an incoming line 1502, a wiring line 1508, a through hole 1510, a through hole 1504 and an outgoing line 1506.

The top layer of a composition unit 1500 on the coil 301, as shown in FIG. 15B, comprises a top layer part of a cycle of wire turn 1511 on the coil 303 and a top layer part of a cycle of wire turn 1512 on the other group of coil 304 with opposite winding direction. The top layer part of a cycle of wire turn 1511 on the coil 303 comprises an incoming line 1501, a wiring line 1513, a through hole 1509, a through hole 1503 and an outgoing line 1505. The top layer part of a cycle of wire turn 1512 on the coil 304 comprises a through hole 1510, a wiring line 1514 and a through hole 1504.

The bottom layer of a composition unit 1500 on the coil 301, as shown in FIG. 15C, comprises a bottom layer part of a cycle of wire turn 1511 on the coil 303 and a bottom layer part of a cycle of wire turn 1512 on the other group of coil 304 with opposite winding direction. The bottom layer part of a cycle of wire turn 1511 on the coil 303 comprises a through hole 1509, a wiring line 1515 and a through hole 1503. The bottom layer part of a cycle of wire turn 1512 on the coil 304 comprises an incoming line 1502, a wiring line 1516, a through hole 1510, a through hole 1504 and an outgoing line 1506.

As shown in FIG. 15A, FIG. 15B and FIG. 15C, the rectangular winding part of a cycle of wire turn 1511 on the coil 303 is composed of a wiring line 1513, a through hole 1509, a wiring line 1515 and a through hole 1504, wherein the wiring line 1513 on the top layer of the rectangular winding part and the wiring line 1515 on the bottom layer are overlapped in the direction vertical to the surface of PCB. The rectangular winding part of a cycle of wire turn 1512 on the other group of coil 304 with opposite winding direction is composed of a wiring line 1516, a through hole 1510, a wiring line 1514 and a through hole 1504, wherein the wiring line 1516 on the bottom layer of the rectangular winding part and the wiring line 1514 on the top layer are overlapped in the direction vertical to the surface of PCB.

As shown in FIG. 15A, FIG. 15B and FIG. 15C, the rectangular winding section directions of a cycle of wire turn 1511 on the coil 303 and a cycle of wire turn 1512 on the coil 304 are approximately along the radial direction of the centers of opened Rogowski coil with multiple dual-sized PCBs 300 and winding section, or the magnetic line with the centers of various composition units on the opened Rogowski coil with multiple dual-sized PCBs 300 is in the normal direction in the center of the winding section.

As shown in FIG. 15A, FIG. 15B and FIG. 15C, the rectangular winding section directions of a cycle of wire turn 1511 on the coil 303 and a cycle of wire turn 1512 on the coil 304 are approximately along the radial direction of the centers of opened Rogowski coil with multiple dual-sized PCBs 300 and winding section, or the magnetic line with the centers of various composition units on the opened Rogowski coil with multiple dual-sized PCBs 300 is in the tangential direction in the center of the winding section.

As shown in FIG. 15A, FIG. 15B and FIG. 15C, the first composition unit on the half a coil 301 of the opened Rogowski coil with two dual-sized PCBs 300 is provided with an external access point 308, which is connected with the incoming line of the first wire turn on the coil 303 of the first composition unit. The first composition unit on the coil 301 is provided with an external access point 307, which is connected with the incoming line of the first wire turn on the other group of coil 304 with opposite winding direction.

Figure 16A:
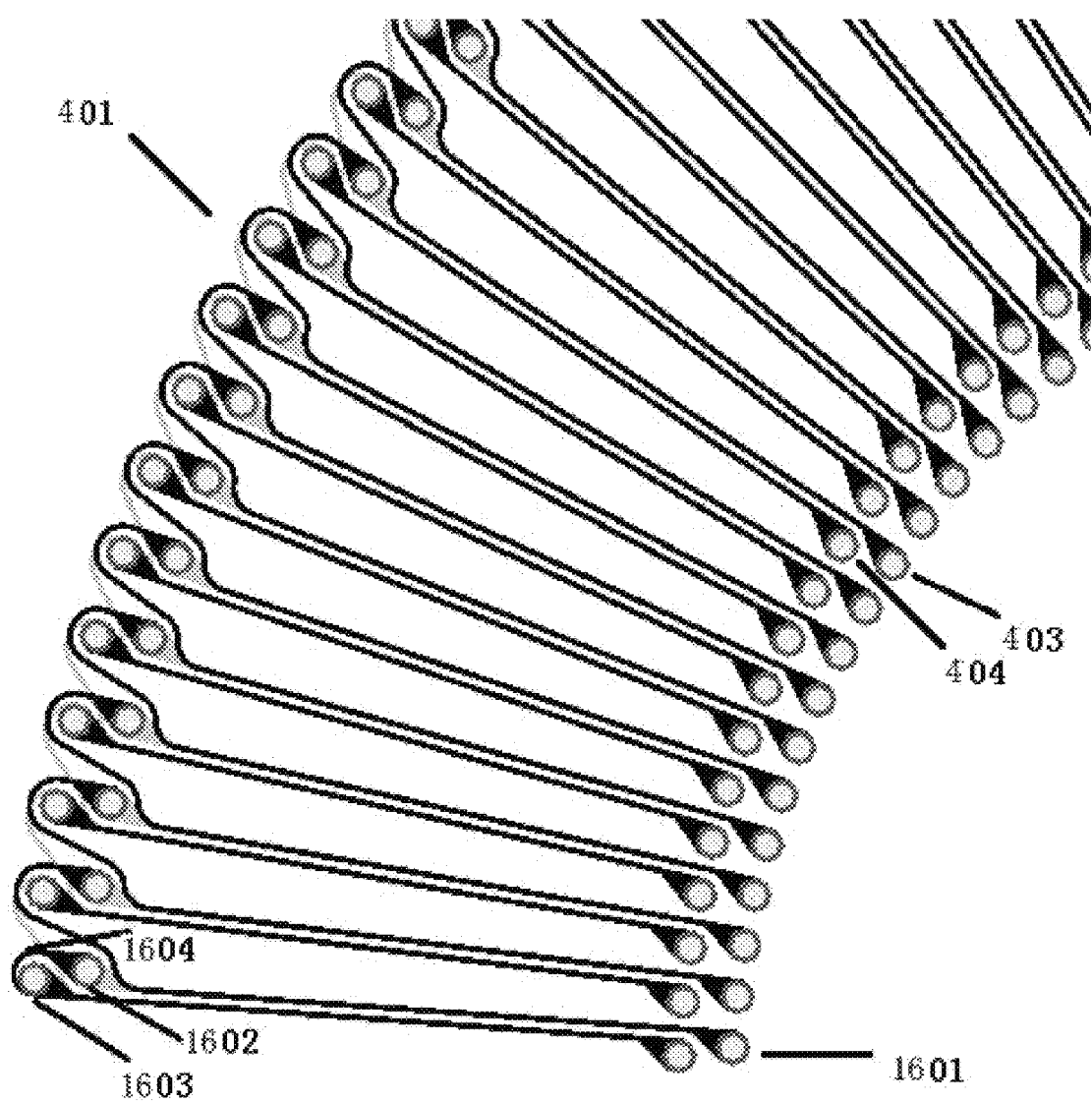
FIG. 16A shows a local laminating layer of the top layer and bottom layer on the left of the $N^{th}$ dual-sided PCB on the half opened Rogowski coil with multiple dual-sided PCBs composed of N layers of the dual-sided PCBs by laminating.
Figure 16B:
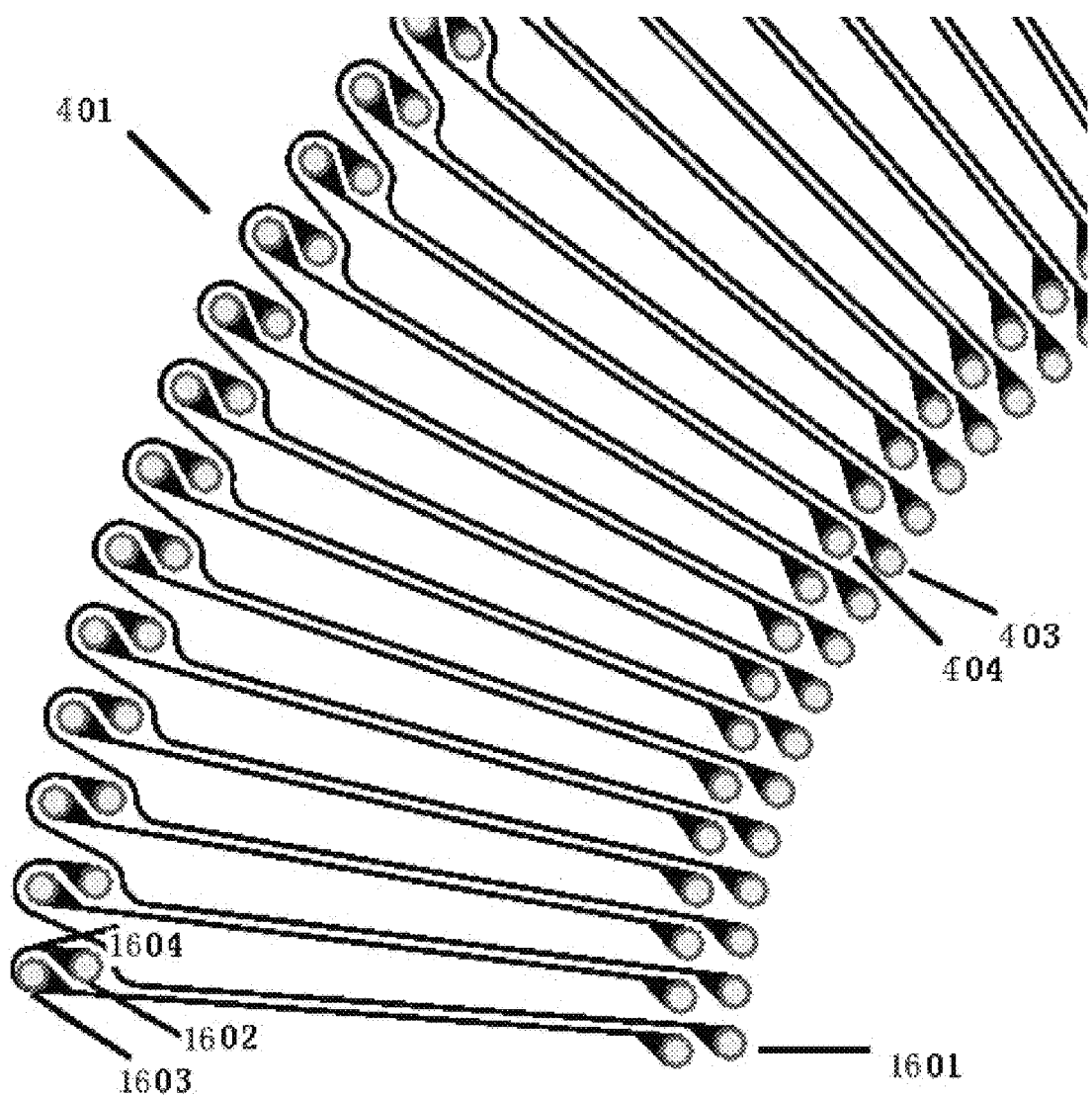
FIG. 16B shows a local top layer on the left of the $N^{th}$ dual-sided PCB on the half opened Rogowski coil with multiple dual-sided PCBs composed of N layers of the dual-sided PCBs by laminating.
Figure 16C:
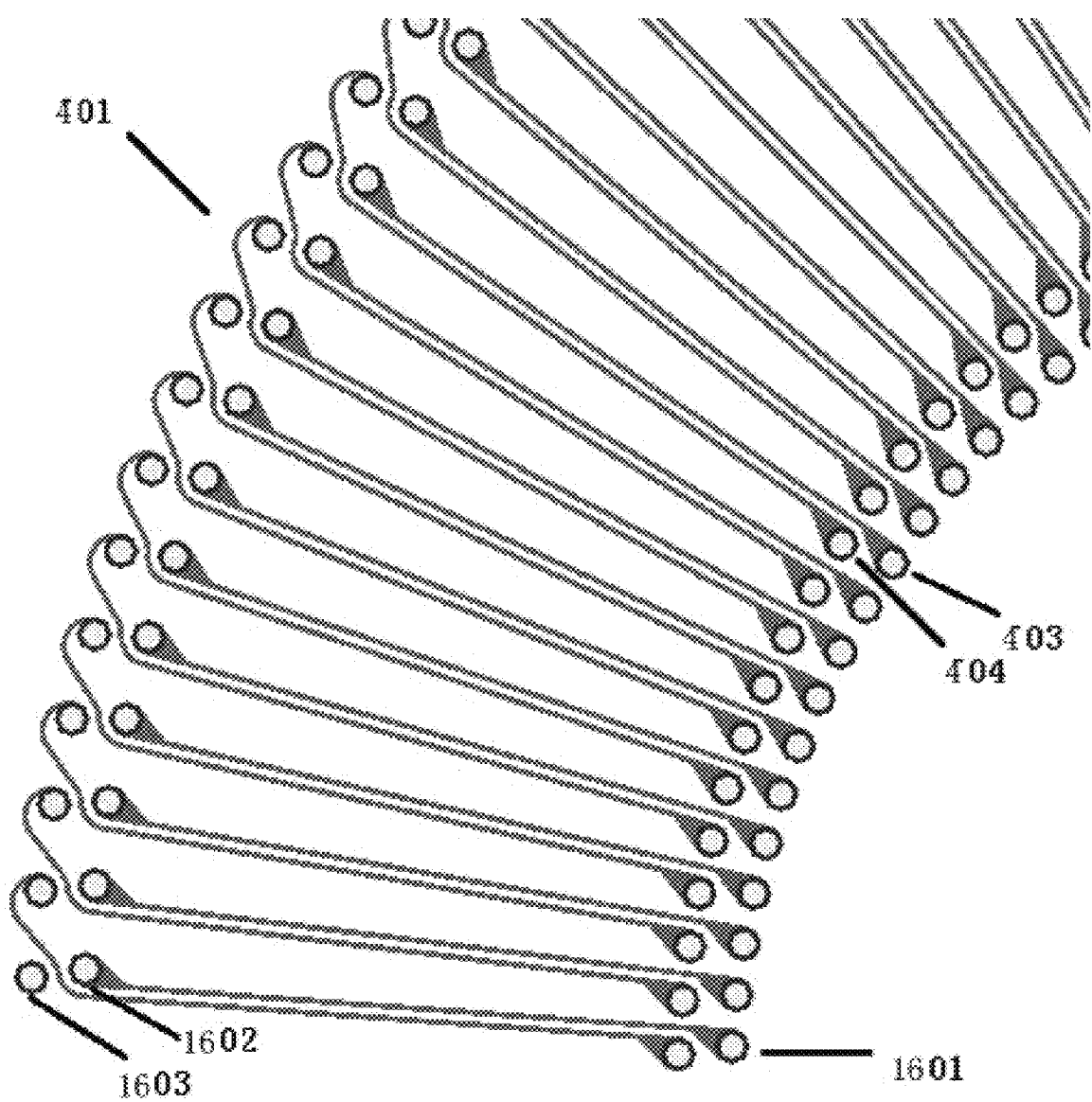
FIG. 16C shows a local bottom layer on the left of the $N^{th}$ dual-sided PCB on the half opened Rogowski coil with multiple dual-sided PCBs composed of N layers of the dual-sided PCBs by laminating.

FIG. 16 shows local details on the left of the dual-sized PCB from the 1$^{st}$ PCB to the (N−1)$^{th}$ PCB of the half opened Rogowski coil with multiple dual-sided PCBs 1600 composed of N layers of dual-sized PCBs by laminating according to the specific embodiment in the disclosure. FIG. 16A shows a laminating layer on the top layer and bottom layer of the dual-sized PCB on the N$^{th}$ layer of the half opened Rogowski coil with multiple dual-sided PCBs 1600 composed of N layers of dual-sized PCBs by laminating, FIG. 163 shows a top layer and FIG. 16C shows a bottom layer thereof.

As shown in FIG. 16A, FIG. 16B and FIG. 16C, the outgoing line from the through hole 1602 of the coil 403 on the last composition unit 1601 of the N$^{th}$ dual-sized PCB on the half opened Rogowski coil with multiple dual-sided PCBs composed of N layers of dual-sized PCBs by laminating is directly connected with the outgoing line from the through hole 1603 of the other group of coil 404 with opposite winding direction through the wiring line 1604 on the top layer to realize the series connection between two groups of coils 403 and 404 with opposite winding directions of the N$^{th}$ dual-sized PCB on the half opened Rogowski coil with multiple dual-sided PCBs composed of N layers of dual-sized PCBs by laminating.

The above is a good specific implementation mode of the disclosure only, but the protective range of the disclosure is not limited to this, the change or replacement easily thought by any technical personnel familiar with the technical field shall be included in the protective range of the disclosure. Thus, the protective range of the disclosure shall be subject to the protective range in the Claims.

The invention claimed is:

1. A Printed Circuit Board (PCB) Rogowski coil, having two external PCB access points, and having radial-line conductors extending in a direction from the center point of the Rogowski coil, comprising a first coil and a second coil which are series connected coils with opposite winding directions, and each of which includes multiple cycles of wire turns, wherein one cycle of wire turn on the first coil includes a first incoming line, a first winding line and a first outgoing line, wherein the first winding lines of various cycles of wire turns on the first coil are spaced evenly with each other and respectively arranged on the upper and lower surfaces of a PCB; the first incoming line, passing through a first through hole on the PCB, is connected with the first winding line; the first winding line, passing through a second through hole, is connected with the first outgoing line; and the first outgoing line is connected with a first incoming line of an adjacent cycle of wire turn of the multiple cycles of wire turns of the first coil; and one cycle of wire turn on the second coil includes a second incoming line, a second winding line and a second outgoing line, wherein the second winding lines of various cycles of wire turns on the second coil are spaced evenly with each other and respectively arranged on the upper and lower surfaces of a PCB; the second incoming line is connected with the second winding line; the second winding line, passing through a third through hole on the PCB, is led out from a fourth through hole and connected with the second outgoing line; and the second outgoing line is connected with a second incoming line of an adjacent cycle of wire turn of the multiple cycles of wire turns of the second coil; and the first through hole is adjacent with the fourth through hole, the second through hole is adjacent with the third through hole, and the distance between the first winding line on the first coil and the second winding line on the second coil composing as a group is less than that between two adjacent groups of cycles of wire turns.

2. The PCB Rogowski coil according to claim 1, wherein the first coil and the second coil are arranged on single PCB to form a closed Rogowski coil with single PCB, wherein as implemented on single-sided PCB, a composition unit is composed of a cycle of wire turn on the first coil and a cycle of adjacent wire turn on the second coil, two cycles of wire turns in the composition unit are adjacent, and multiple identical composition units are connected in series; or as implemented on a laminated top and bottom dual-sided PCB layer, the first incoming line and the first outgoing line of the first coil in each composition unit are respectively connected with the wire turns of the first coils on the top PCB layer and the bottom PCB layer, the first winding line is composed of wirings on the top layer and bottom layer, connecting the first through hole and the second through hole between the top layer and the bottom layer, the second incoming line and the second outgoing line of each composition unit are respectively connected with the wire turns of the second coils on the top PCB layer and the bottom PCB layer, and the second winding line is composed of wirings on the top layer and bottom layer, connecting the third through hole and the fourth through hole between the top layer and the bottom layer.

3. The closed single PCB Rogowski coil according to claim 2, wherein two signal output ends are provided, having a first signal output end and a second signal output end, wherein that connected with the first signal output end is the first incoming line at the first cycle of wire turn on the first coil, that connected with the second signal output end is the second incoming line at the second cycle of wire turn on the second coil, the first outgoing line at the last cycle of wire turn on the first coil is connected with the second outgoing line at the last cycle of wire turn on the second coil, and serial connection between the first coil and the second coil of the closed Rogowski coil with single PCB is realized; or the surface surrounded by the first winding lines at the various cycles of wire turns on the first coil by surrounding is located on a cross section of PCB, and the first winding lines at the various cycles of wire turns on the first coil are overlapped in the direction vertical to the surface of PCB; the surface surrounded by the second winding lines at the various cycles of wire turns on the second coil is located on a cross section of PCB, and the second winding lines at the various cycles of wire turns on the second coil are overlapped in the direction vertical to the surface of PCB; or the centers of all the composition units are uniformly distributed on a magnetic line of magnetic field for generating current to be measured, the direction of the section surrounded by the winding lines at the wire turns on the first coil of all the composition units is close to the normal direction of the magnetic line passing through the section center of the winding line, and the section surrounded by the winding lines at the wire turns on the first coil is approximately vertical to the normal direction of the magnetic line passing through the section center of the winding line; the direction of the section surrounded by the winding lines at the wire turns on the second coil of all the composition units is close to the normal direction of the magnetic line passing through the section center of the winding line, and the section surrounded by the winding lines at the wire turns on the second coil is approximately vertical to the normal direction of the magnetic line passing through the section center of the winding line.

4. The PCB Rogowski coil according to claim 1, wherein the first coil and the second coil are arranged on multiple (N≥2, N being an integer) laminated PCBs to form a closed Rogowski coil, wherein multiple cycles of wire turns on the first and second coils are respectively wound on each one of multiple PCBs, and the PCBs with multiple cycles of wire turns are orderly connected through the external access points on the PCBs.

5. The closed multiple PCBs Rogowski coil according to claim 4, wherein two signal output ends are provided, having a first signal output end and a second signal output end, wherein in N laminated PCBs, the PCB with the first signal output end and the second signal output end is the $1^{st}$ PCB, the PCB adjacent with the $1^{st}$ board is the $2^{nd}$ PCB, till the $N^{th}$ PCB is present.

6. The closed multiple PCBs Rogowski coil according to claim 4, wherein four external access points are set on the $1^{st}$ PCB to the $(N-1)^{th}$ PCB, having the first external access point, the second external access point, the third external access point and the fourth external access point, wherein the first external access point and the third external access point are the starting point and ending point of the first coil from the $1^{st}$ PCB to the $(N-1)^{th}$ PCB, the second external access point and the fourth external access point are the starting point and ending point of the second coil from the $1^{st}$ PCB to the $(N-1)^{th}$ PCB; the $N^{th}$ PCB is provided with two external access points, having the first external access point and the second external access point, wherein the first external access point is the starting point of the first coil on the $N^{th}$ PCB, and the second external access point is the starting point of the second coil on the $N^{th}$ PCB.

7. The closed multiple PCBs Rogowski coil according to claim 6, wherein the first external access point on the 1$^{st}$ PCB is the first signal output end, and the second external access point on the 1$^{st}$ PCB is the second signal output end; and the third external access point of an upper PCB in the adjacent laminated PCBs is connected with the first external access point on a lower PCB to realize series connection between the first coil on the upper PCB and the first coil on the lower PCB to form a complete first coil; the fourth external access point of an upper PCB in the adjacent laminated PCBs is connected with the second external access point on a lower PCB to realize series connection between the second coil on the upper PCB and the second coil on the lower PCB to form a complete second coil; and the first coil and second coil are directly connected in series on the N$^{th}$ PCB.

8. The closed multiple PCBs Rogowski coil according to 7, wherein as implemented on single-sided PCB, a composition unit is composed of a cycle of wire turn on the first coil and a cycle of adjacent wire turn on the second coil in each PCB, multiple identical composition units are connected in series, and two cycles of wire turns in the composition unit are adjacent; or as implemented on a laminated top and bottom dual-sided PCB layer, the first incoming line and the first outgoing line of the first coil in each composition unit are respectively connected with the wire turns of the first coils on the top PCB layer and the bottom PCB layer, the first winding line is composed of wirings on the top layer and bottom layer, a first through hole and a second through hole between the top layer and the bottom layer by surrounding, the second incoming line and the second outgoing line of each composition unit are respectively connected with the wire turns of the second coils on the top PCB layer and the bottom PCB layer, and the second winding line is composed of wirings on the top layer and bottom layer, a third through hole and a fourth through hole between the top layer and the bottom layer by surrounding; or the first incoming line at one cycle of wire turn on the first coil of the first composition unit from the 1st PCB to the Nth PCB is connected with the first external access point from the 1st PCB to the Nth PCB, the second incoming line at one cycle of wire turn on the second coil of the first composition unit from the 1st PCB to the Nth PCB is connected with the second external access point from the 1st PCB to the Nth PCB, the first outgoing line at one cycle of wire turn on the first coil of the last composition unit from the 1st PCB to the (N−1)$^{th}$ PCB is connected with the third external access point from the 1st PCB to the (N−1)$^{th}$ PCB, the second outgoing line at one cycle of wire turn on the second coil of the last composition unit from the 1st PCB to the (N−1)$^{th}$ PCB is connected with the fourth external access point from the 1st PCB to the (N−1)$^{th}$ PCB, and the first outgoing line at one cycle of wire turn on the first coil of the last composition unit on the Nth PCB is directly connected with the second outgoing line at one cycle of wire turn on the second coil of the last composition unit on the Nth PCB, so as to realize the series connection of the first coil and second coil on the Nth PCB; or the surface surrounded by the winding lines at two cycles of wire turns of each composition unit is vertical to the surface of PCB, the surface surrounded by the winding lines is located on the cross section of PCB, and the wiring paths of the winding lines are overlapped in the direction vertical to the surface of PCB; or the centers of the composition units on each PCB are uniformly distributed on a magnetic line of magnetic field for generating current to be measured, the direction of the section surrounded by the winding lines at two cycles of wire turns of the composition units is close to the normal direction of the magnetic line passing through the section center of the winding line, and the section surrounded by the winding lines at two cycles of wire turns of all the composition units is approximately vertical to the tangential direction of the magnetic line passing through the section center of the winding line.

9. The PCB Rogowski coil according to claim 1, wherein the first coil and the second coil are arranged on a 1st PCB and a 2nd PCB to form an opened Rogowski coil with the two PCBs, wherein the two PCBs are designed to be semicircular annular PCBs, with multiple cycles of wire turns of the first and second coils wound on the two PCBs, respectively; and the two PCBs with multiple cycles of wire turns are respectively provided with a first external access point and a second external access point; and the two PCBs are connected through respective the first external access points; and the second external access points of the two PCBs are taken as the respective signal output ends of the two PCBs.

10. The opened two PCBs Rogowski coil according to claim 9, wherein the two external access points are a set for each PCB, the first external access point and the second external access point, wherein the first external access point on each PCB is the starting point of the first coil on the PCB, and the second external access point on the PCB is the ending point of the second coil on the PCB.

11. The opened two PCBs Rogowski coil according to claim 9, wherein two connection modes are provided for the two PCBs: the first external access points of the two PCBs are connected directly, the second external access points of the two PCBs are taken as two signal output ends of the opened Rogowski coil with the two PCBs, first signal output end and second signal output end; or, the second external access points of the two PCBs are connected directly, the first access points of the two PCBs are taken as two signal output ends of the opened Rogowski coil with two PCBs, first signal output end and second signal output end.

12. The opened two PCBs Rogowski coil according to claim 11, wherein a composition unit is composed of a cycle of wire turn on the first coil and a cycle of adjacent wire turn on the second coil in each PCB of the opened Rogowski coil with the two PCBs where these two cycles of wire turns in the composition unit are adjacent, and multiple identical composition units are connected in series.

13. The opened two PCBs Rogowski coil according to claim 12, wherein the first incoming line and the first outgoing line of the first coil in each composition unit are respectively connected with the wire turns of the first coils on an upper PCB and a lower PCB, the first winding line is composed of wirings on the top layer and bottom layer of PCB, a first through hole and a second through hole between the top layer and the bottom layer, the second incoming line and the second outgoing line of each composition unit are respectively connected with the wire turns of the second coils on the upper PCB and the lower PCB, and the second winding line is composed of wirings on the top layer and bottom layer, a third through hole and a fourth through hole between the top layer and the bottom layer.

14. The opened two PCBs Rogowski coil according to claim 11, wherein
the PCB with the first signal output end is the $1^{st}$ PCB, the PCB with the second signal output end is the $2^{nd}$ PCB, the first incoming line at one cycle of wire turn on the first coil of a first composition unit on the $1^{st}$ PCB is connected with the first external access point of the $1^{st}$ PCB, the second incoming line at one cycle of wire turn on the second coil of the first composition unit on the $1^{st}$ PCB is connected with the second external access point of the $1^{st}$ PCB, the first incoming line at one cycle of wire turn on the first coil of the first composition unit on the $2^{nd}$ PCB is connected with the first external access point of the $2^{nd}$ PCB, and the second incoming line at one cycle of wire turn on the second coil of the first composition unit on the $2^{nd}$ PCB is connected with the second external access point of the $2^{nd}$ PCB.

15. The opened two PCBs Rogowski coil according to claim 11, wherein
the first outgoing line at one cycle of wire turn on the first coil of a last composition unit on the $1^{st}$ PCB is directly connected with the second outgoing line at one cycle of wire turn on the second coil of the last composition unit on the $1^{st}$ PCB to realize series connection between the first coil and the second coil on the $1^{st}$ PCB, and the first outgoing line at one cycle of wire turn on the first coil of a last composition unit on the $2^{nd}$ PCB is directly connected with the second outgoing line at one cycle of wire turn on the second coil of the last composition unit on the $2^{nd}$ PCB to realize series connection between the first coil and the second coil on the $2^{nd}$ PCB.

16. The opened two PCBs Rogowski coil according to claim 12, wherein
a surface surrounded by the winding lines at the two cycles of wire turns of each composition unit is vertical to the surface of PCB, the surface surrounded by the winding lines is located on the cross section of PCB, and the wiring paths of the winding lines are overlapped in the direction vertical to the surface of PCB.

17. The opened two PCBs Rogowski coil according to claim 11, wherein
centers of a plurality of composition units on each PCB are uniformly distributed on a magnetic line of magnetic field for generating current to be measured, a direction of a section surrounded by the winding lines at two cycles of wire turns of all the composition units is close to the normal direction of the magnetic line passing through the section center of the winding line, and the section surrounded by the winding lines at two cycles of wire turns of all the composition units is approximately vertical to the tangential direction of the magnetic line passing through the section center of the winding line.

18. The PCB Rogowski coil according to claim 1, wherein the first coil and the second coil are arranged on multiple (N≥3, where N is an integer) PCBs to form an opened Rogowski coil with multiple PCBs, wherein
the multiple PCBs are laminated to form two groups of semicircular annular PCBs, multiple cycles of wire turns of the first and second coils are wound on the two groups of PCBs, respectively; in the same group of semicircular annular PCBs, the semicircular annular PCB with multiple cycles of wire turns are connected by the respective external access point, and one of the other two external access points on the semicircular annular PCB is taken as the connecting point in the other group of semicircular annular PCBs, and the other one is taken as the signal output end of the group of semicircular annular PCBs.

19. The opened multiple PCBs Rogowski coil according to claim 18, wherein
for each of the group of semicircular annular PCBs, they are composed of N PCBs by alternating, each group of semicircular annular PCBs is provided with two signal output ends, having the first signal output end and the second signal output end, wherein the PCB with first signal output end and the second signal output end is the 1st PCB, and the PCB adjacent with the 1st PCB is the 2nd PCB, till the Nth PCB is present; or
four external access points are set on the 1st PCB to the $(N-1)^{th}$ PCB in each group of semicircular annular PCBs, having the first external access point, the second external access point, the third external access point and the fourth external access point, wherein the first external access point and the third external access point are the starting point and ending point of the first coil from the 1st PCB to the $(N-1)^{th}$ PCB, the second external access point and the fourth external access point are the starting point and ending point of the second coil from the 1st PCB to the $(N-1)^{th}$ PCB; the $N^{th}$ PCB in each group of semicircular annular PCBs is provided with two external access points, having the first external access point and the second external access point, wherein the first external access point is the starting point of the first coil on the Nth PCB, and the second external access point is the starting point of the second coil on the Nth PCB; or
the first external access point on the 1st PCB in each group of semicircular annular PCBs is the first signal output end, the second external access point on the 1st PCB is the second signal output end, the third external access point of the upper PCB in the adjacent laminated PCBs in each group of semicircular annular PCBs is connected with the first external access point on the lower PCB to realize the series connection between the first coil on the upper PCB and the first coil on the lower PCB to form the complete first coil; the fourth access point of the upper PCB in the adjacent laminated PCBs in each group of semicircular annular PCBs is connected with the second external access point on the lower PCB to realize the series connection between the second coil on the upper PCB and the second coil on the lower PCB to form the complete second coil; the first coil and second coil on each half of PCB Rogowski coil are directly connected in series on the Nth PCB to form a group of semicircular annular PCBs; or
the first signal output ends on two groups of semicircular annular PCBs are connected directly, and the second signal output ends thereon are taken as two signal output ends of the opened Rogowski coil with multiple PCBs, having the first signal output end and the second signal output end; or the second signal output ends on two groups of semicircular annular PCBs are connected directly, and the first signal output ends thereon are taken as two signal output ends of the opened Rogowski coil with multiple PCBs, having the first signal output end and the second signal output end.

20. The opened multiple PCBs Rogowski coil according to claim 19, wherein

- a composition unit is composed of a cycle of wire turn on the first coil and a cycle of adjacent wire turn on the second coil in each PCB of the opened Rogowski coil with multiple PCBs, multiple identical composition units are connected in series, and two cycles of wire turns in the composition unit are adjacent closely; or
- the first incoming line and the first outgoing line of the first coil in each composition unit are respectively connected with the wire turns of the first coils on an upper PCB and a lower PCB, the first winding line is composed of wirings on the top layer and bottom layer, a first through hole and a second through hole between the top layer and the bottom layer by surrounding, the second incoming line and the second outgoing line of each composition unit are respectively connected with the wire turns of the second coils on the upper PCB and the lower PCB, and the second winding line is composed of wirings on the top layer and bottom layer, a third through hole and a fourth through hole between the top layer and the bottom layer by surrounding; or
- the first incoming line at one cycle of wire turn on the first coil of the first composition unit from the $1^{st}$ PCB to the $N^{th}$ PCB is connected with the first external access point from the $1^{st}$ PCB to the $N^{th}$ PCB, the second incoming line at one cycle of wire turn on the second coil of the first composition unit from the $1^{st}$ PCB to the $N^{th}$ PCB is connected with the second external access point from the $1^{st}$ PCB to the $N^{th}$ PCB, the first outgoing line at one cycle of wire turn on the first coil of the last composition unit from the $1^{st}$ PCB to the $(N-1)^{th}$ PCB is connected with the third external access point from the $1^{st}$ PCB to the $(N-1)^{th}$ PCB, the second outgoing line at one cycle of wire turn on the second coil of the last composition unit from the $1^{st}$ PCB to the $(N-1)^{th}$ PCB is connected with the fourth external access point from the 1st PCB to the $(N-1)^{th}$ PCB, and the first outgoing line at one cycle of wire turn on the first coil of the last composition unit on the Nth PCB is directly connected with the second outgoing line at one cycle of wire turn on the second coil of the last composition unit on the $N^{th}$ PCB, so as to realize the series connection of the first coil and second coil on the $N^{th}$ PCB; or
- the section composed of the winding lines at two cycles of wire turns of each composition unit by surrounding is vertical to the surface of PCB, the section composed of the winding lines by surrounding is located on the cross section of PCB, and the wiring paths on the top layer and bottom layer of the winding lines are overlapped in the direction vertical to the surface of PCB; or
- the centers of each composition unit are uniformly distributed on a magnetic line of magnetic field for generating current to be measured, the direction of the section surrounded by the winding lines at two cycles of wire turns of all the composition units is close to the normal direction of the magnetic line passing through the section center of the winding line, and the section surrounded by the winding lines at two cycles of wire turns of all the composition units is approximately vertical to the tangential direction of the magnetic line passing through the section center of the winding line.

* * * * *